(12) United States Patent
Mohan et al.

(10) Patent No.: US 8,525,281 B2
(45) Date of Patent: Sep. 3, 2013

(54) Z-AXIS SEMICONDUCTOR FLUXGATE MAGNETOMETER

(75) Inventors: Anuraag Mohan, Fremont, CA (US); Peter J. Hopper, San Jose, CA (US)

(73) Assignee: Texas Instruments Incorporated, Dallas, TX (US)

( * ) Notice: Subject to any disclaimer, the term of this patent is extended or adjusted under 35 U.S.C. 154(b) by 30 days.

(21) Appl. No.: 13/276,391

(22) Filed: Oct. 19, 2011

(65) Prior Publication Data

US 2013/0099334 A1 Apr. 25, 2013

(51) Int. Cl.
*H01L 29/82* (2006.01)
(52) U.S. Cl.
USPC .......... 257/421; 438/3; 257/E21.002
(58) Field of Classification Search
USPC .......... 257/421, 414; 438/381–399
See application file for complete search history.

(56) References Cited

U.S. PATENT DOCUMENTS

| 7,652,348 B1* | 1/2010 | Hopper et al. ........ 257/531 |
| 8,004,061 B1* | 8/2011 | Hopper et al. ........ 257/531 |
| 2011/0310579 A1* | 12/2011 | Smeys et al. ........ 361/782 |

\* cited by examiner

*Primary Examiner* — Telly Green
*Assistant Examiner* — Damon Hillman
(74) *Attorney, Agent, or Firm* — Eugene C. Conser; Wade J. Brady, III; Frederick J. Telecky, Jr.

(57) ABSTRACT

A z-axis fluxgate magnetometer is formed in a semiconductor wafer fabrication sequence, which significantly reduces the size and cost of the fluxgate magnetometer. The semiconductor wafer fabrication sequence forms a vertical magnetic core structure, a first wire structure wound around the magnetic core structure, and a second wire structure wound around the magnetic core structure.

9 Claims, 47 Drawing Sheets

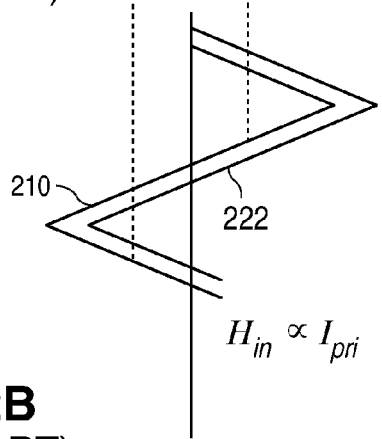
FIG. 2A
(PRIOR ART)
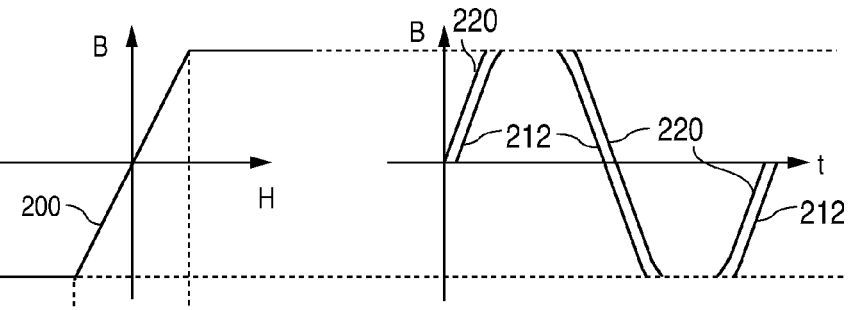
FIG. 2C
(PRIOR ART)
FIG. 2B
(PRIOR ART)
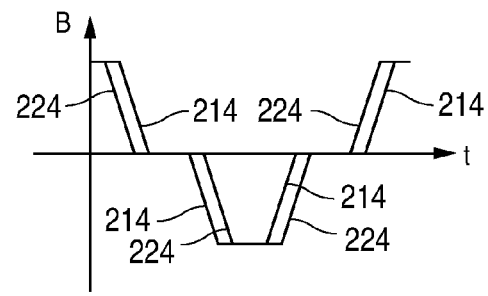
FIG. 2D
(PRIOR ART)
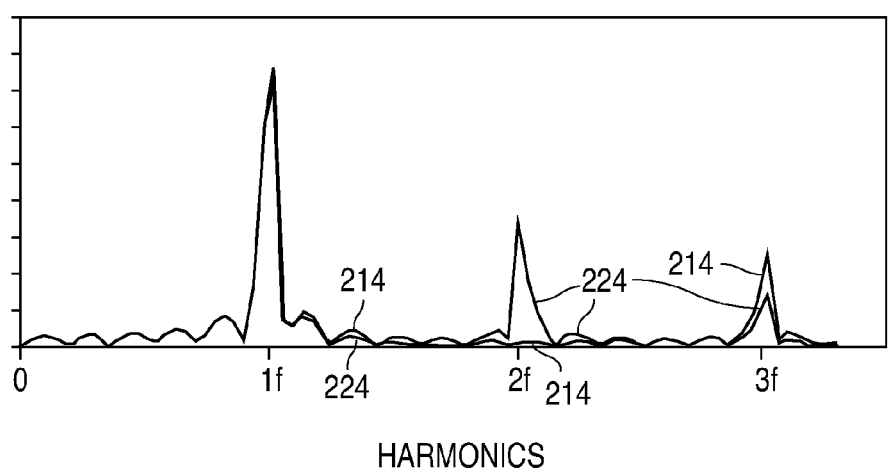
HARMONICS
FIG. 2E
(PRIOR ART)

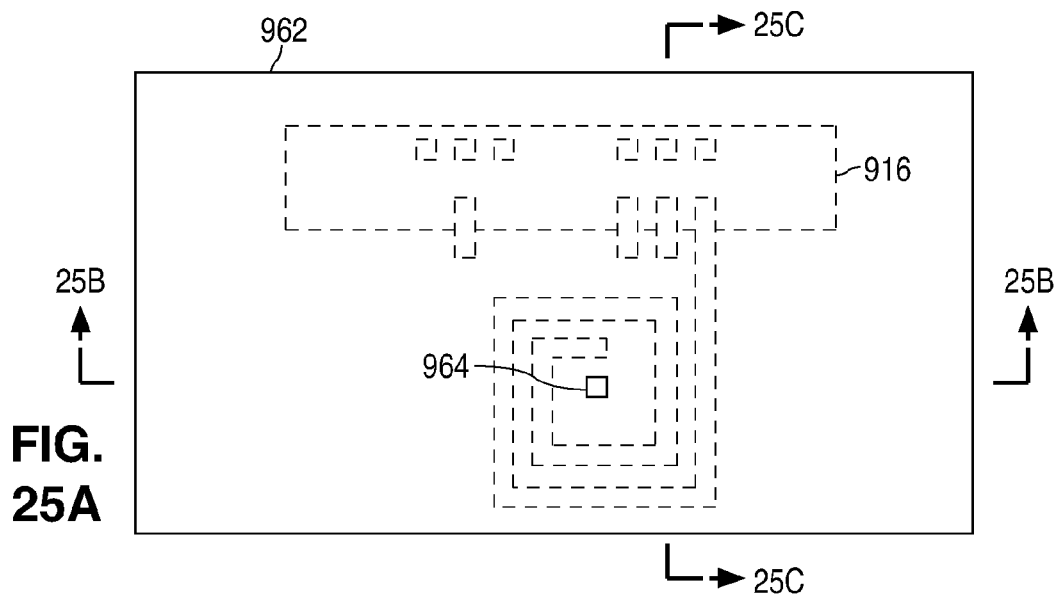
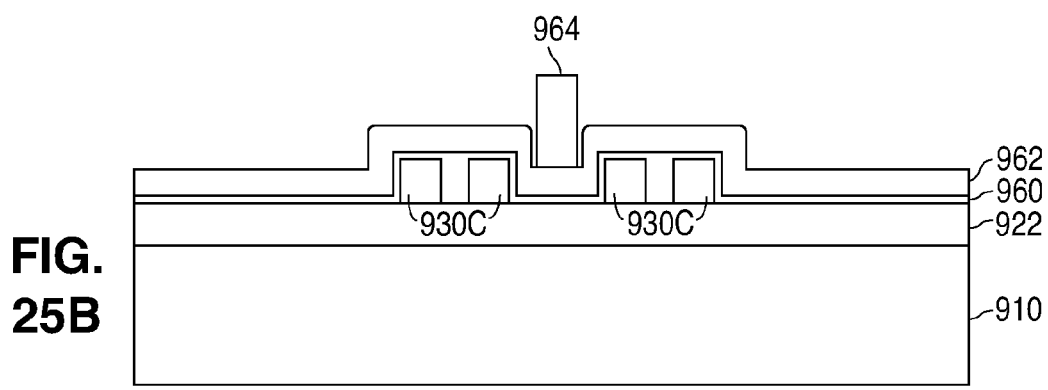
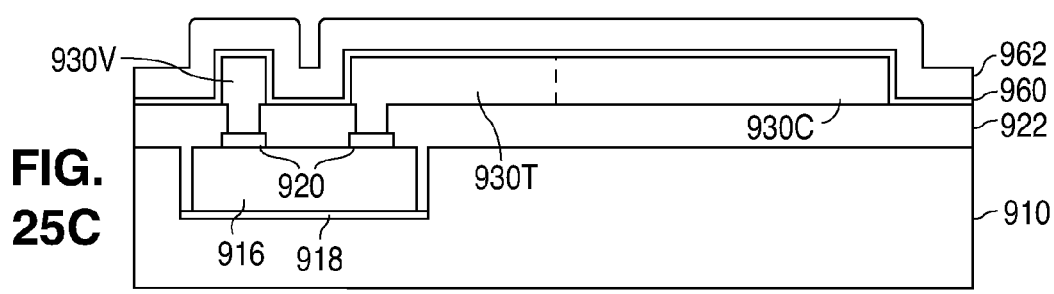

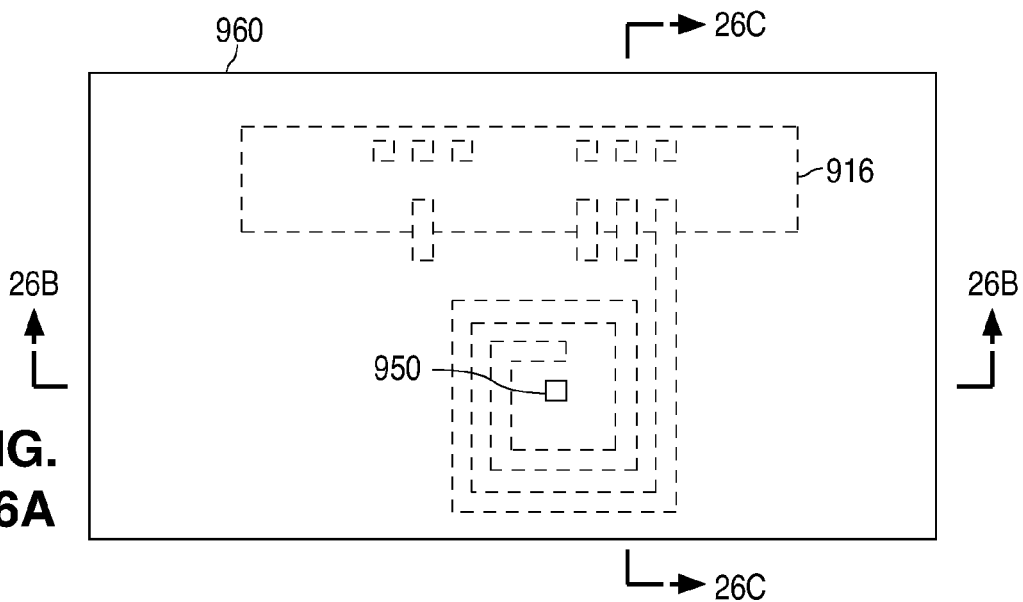
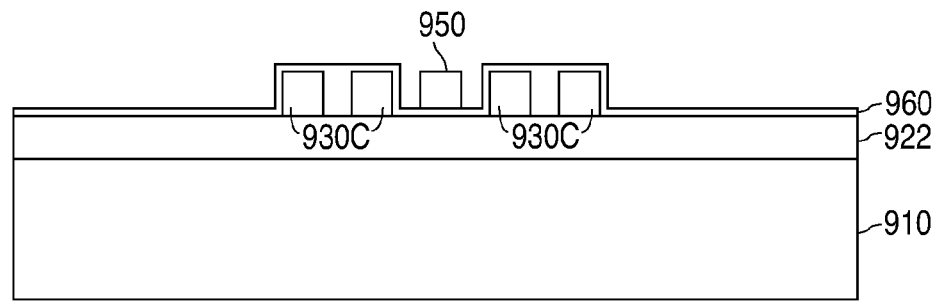
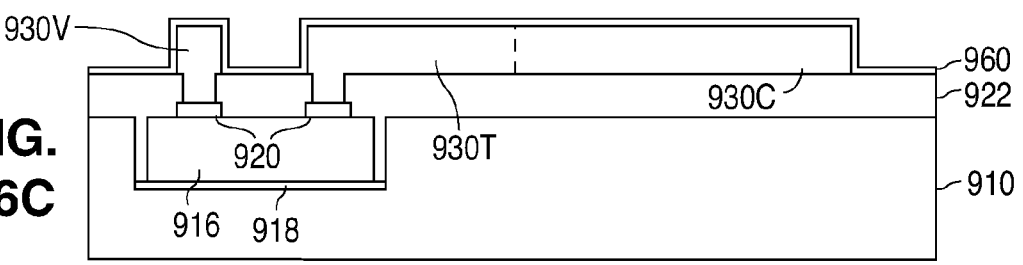

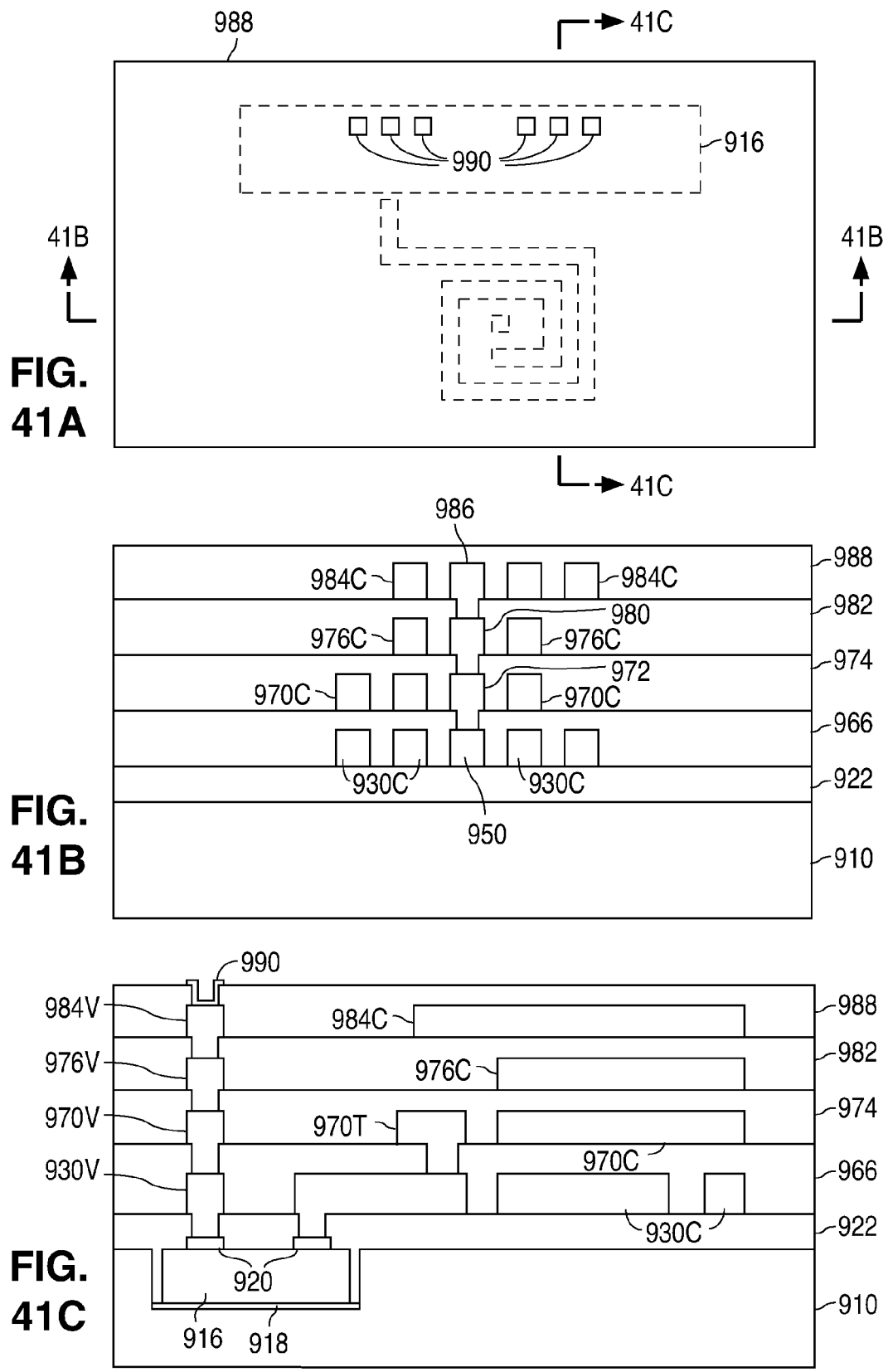

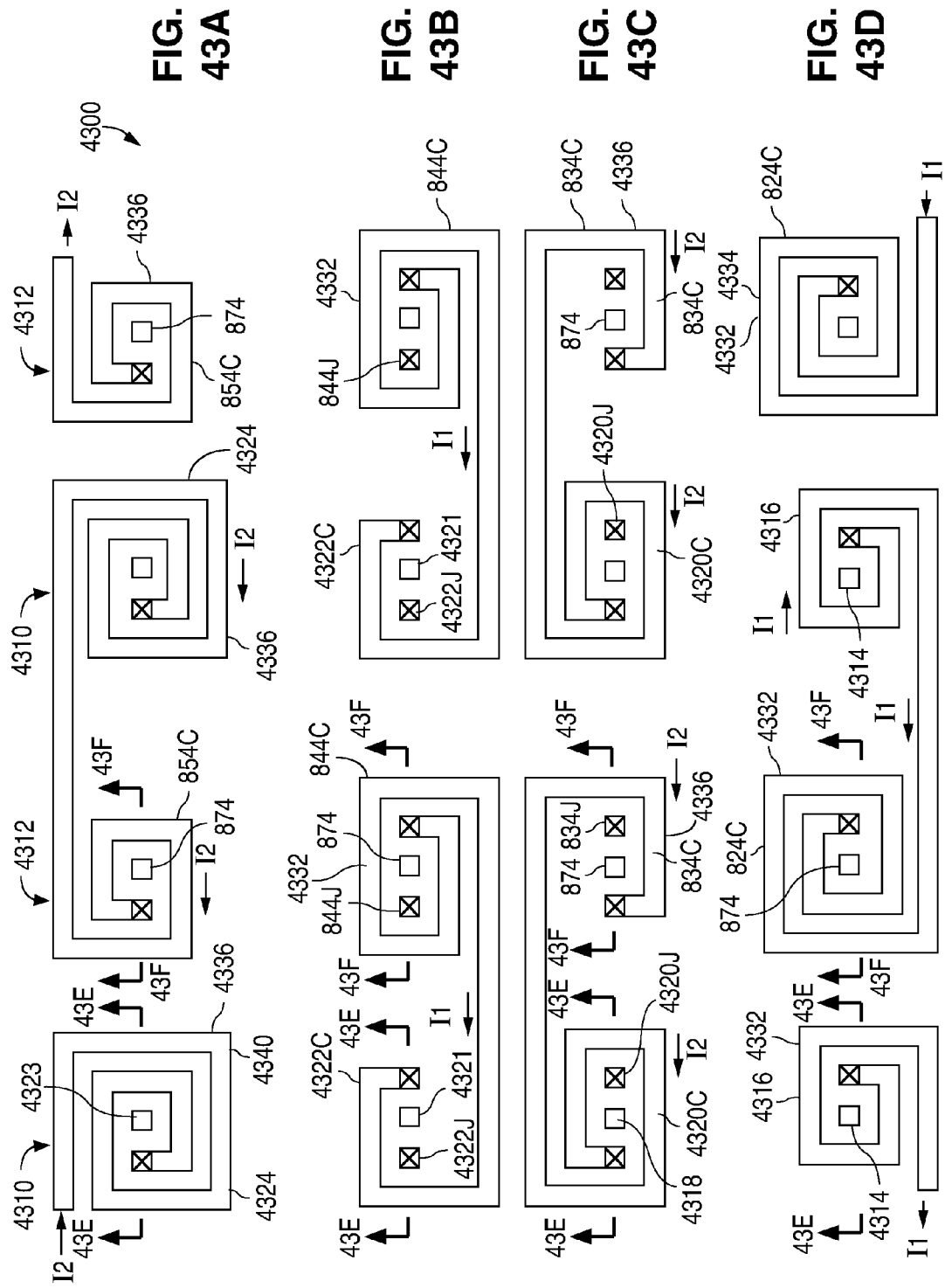

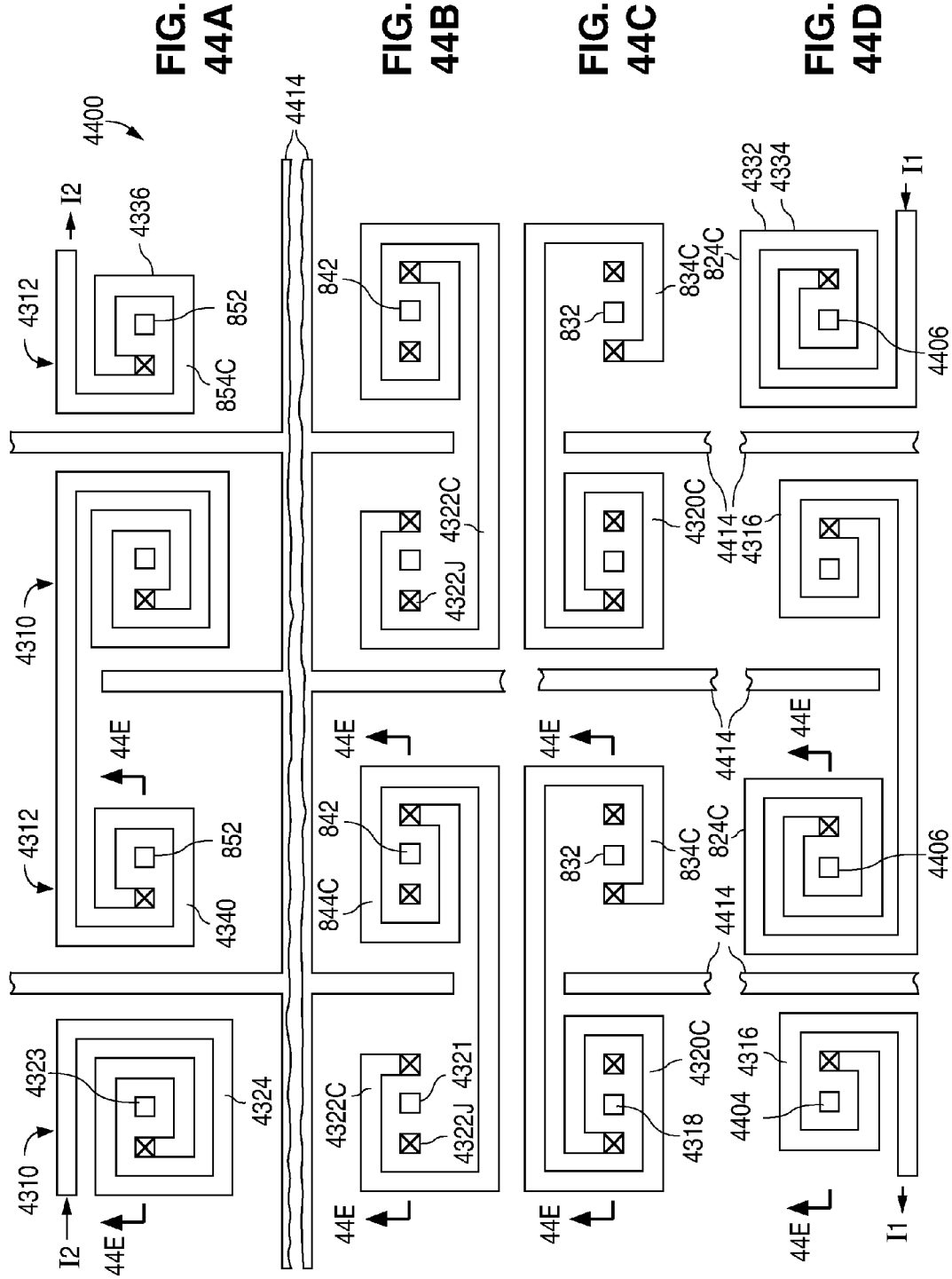

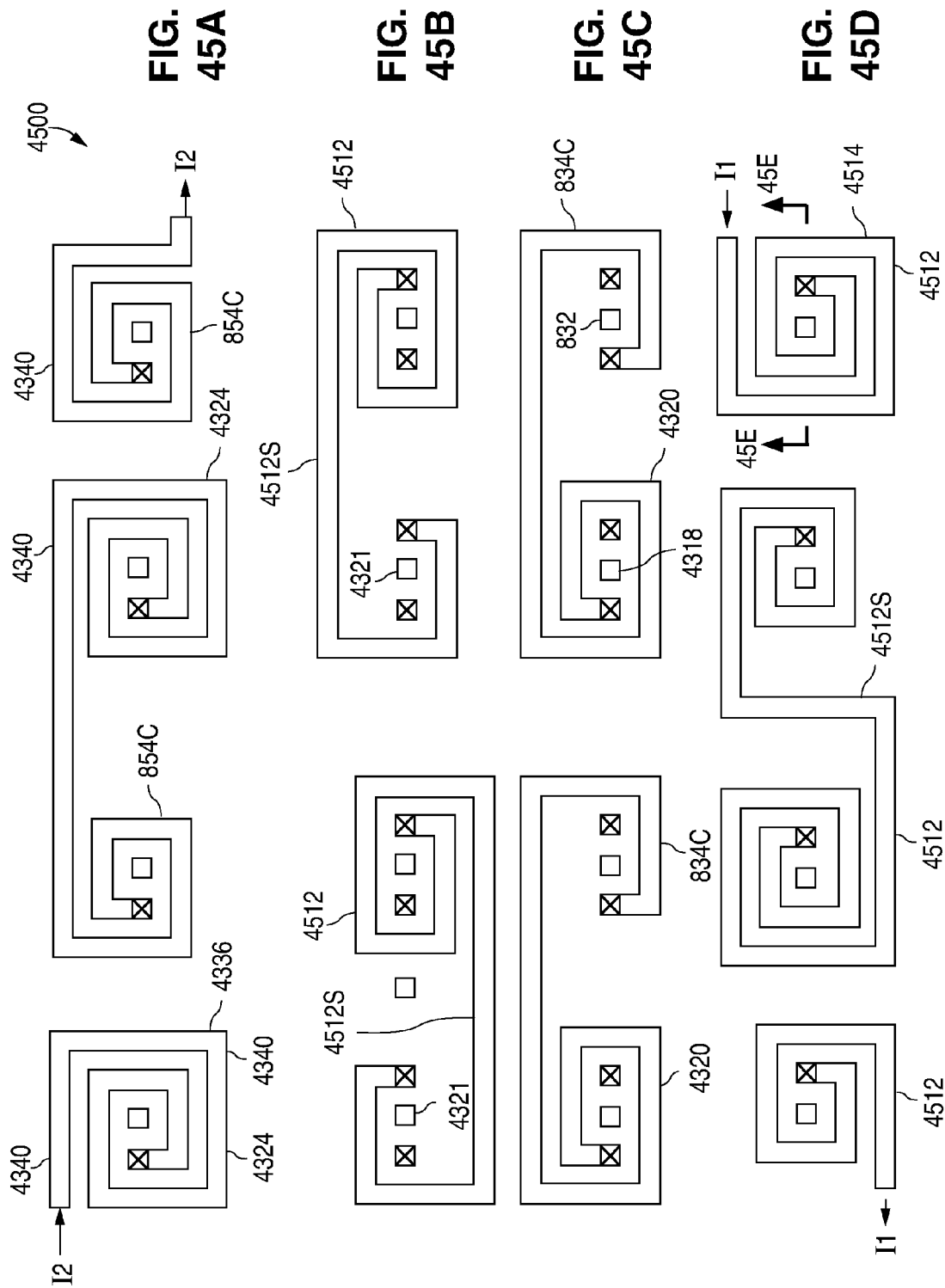

Z-AXIS SEMICONDUCTOR FLUXGATE MAGNETOMETER

BACKGROUND OF THE INVENTION

1. Field of the Invention

The present invention relates to fluxgate magnetometers and, more particularly, to a z-axis semiconductor fluxgate magnetometer.

2. Description of the Related Art

A magnetometer is a device that measures the strength of an external magnetic field. There are a number of different approaches to measuring magnetic fields, and various different types of magnetometers have been developed based on these different approaches. One type of magnetometer based on flux variations in a magnetic core is a fluxgate magnetometer.

FIG. 1 shows a block diagram that illustrates an example of a prior art fluxgate magnetometer 100. As shown in FIG. 1, fluxgate magnetometer 100 includes a drive coil 110, a sense coil 112, and a magnetic core structure 114 that lies within drive coil 110 and sense coil 112.

As further shown in FIG. 1, fluxgate magnetometer 100 also includes a drive circuit 120 that is connected to drive coil 110, and an sense circuit 122 that is connected to sense coil 112 and drive circuit 120. Sense circuit 122 generates an output voltage $V_{OUT}$ that is proportional to the magnitude of an external magnetic field.

FIGS. 2A-2E show views that illustrate the operation of fluxgate magnetometer 100. FIG. 2A shows a graph that illustrates a BH curve 200 for magnetic core structure 114, while FIG. 2B shows a graph that illustrates an alternating current input to drive coil 110, FIG. 2C shows a graph that illustrates the magnetic induction field B that results from the alternating current input to drive coil 110, FIG. 2D shows a graph that illustrates an induced voltage in sense coil 112 plotted in the time domain that results from the magnetic induction field B, and FIG. 2E shows a graph that illustrates the induced voltage in sense coil 112 plotted in the frequency domain that results from the magnetic induction field B.

As shown by BH curve 200 in FIG. 2A, when the magnitude of a magnetic field H increases, magnetic core structure 114 increases the magnitude of the magnetic induction field B until magnetic core structure 114 saturates. Once in saturation, further increases in the magnitude of the magnetic field H lead to very little increase in the magnitude of the magnetic induction field B.

As a result, saturation is commonly illustrated as in FIG. 2A as the region where increases in the magnitude of the magnetic field H lead to no additional increase in the magnitude of the magnetic induction field B. In the present example, the magnitude of the magnetic field H is increased by increasing the magnitude of the alternating current flowing through drive coil 110.

As shown in FIGS. 2A-2C, when no external magnetic field is present and an alternating current waveform 210, which has an amplitude that is sufficient to drive magnetic core structure 114 into saturation, is input to drive coil 110 from drive circuit 120, an alternating magnetic induction field B, as represented by waveform 212, is generated in response.

In other words, when alternating current waveform 210 is input to drive coil 110, magnetic core structure 114 is driven through cycles (magnetized, un-magnetized, inversely magnetized, un-magnetized, magnetized again, and so on) that generate an alternating magnetic induction field B as represented by waveform 212. In the present example, the alternating current waveform 210 is triangular, while the magnetic induction field waveform 212 has flat tops and bottoms that represent the periods of saturation.

As shown in FIG. 2D, the alternating magnetic induction field B induces an alternating voltage 214 in sense coil 112. The induced alternating voltage 214 is proportional to the change in the magnetic induction field B over time (dB/dt). In addition, the induced alternating voltage 214 is processed by sense circuit 122 to generate the output voltage $V_{OUT}$, which is proportional to the external magnetic field.

As shown in FIG. 2E, in the frequency domain, the induced alternating voltage 214 has a fundamental frequency 1$f$, but only odd harmonics, such as a third harmonic 3$f$, of the fundamental frequency 1$f$. As a result, when no external magnetic field is present, the induced alternating voltage 214 has no second harmonic.

However, when an external magnetic field is present, the external magnetic field interacts with magnetic core structure 114 and changes the alternating magnetic induction field B. In other words, magnetic core structure 114 is more easily saturated when magnetic core structure 114 is in alignment with the external magnetic field, and less easily saturated when magnetic core structure 114 is in opposition to the external magnetic field.

In the present example, as shown by waveform 220 in FIG. 2C, alignment to the external magnetic field increases the duration of the positive magnetic induction field B and decreases the duration of the negative magnetic induction field B. As a result, as shown by waveform 222 in FIG. 2B, the external magnetic field has the effect of shifting alternating current waveform 210 to the right.

In other words, when no external magnetic field is present, each half cycle of the waveform 210 drives magnetic core structure 114 into positive and negative saturation by substantially an equal amount. However, when exposed to an external magnetic field, as illustrated by the waveform 222, the external magnetic field causes one half-cycle of the waveform 222 to drive magnetic core structure 114 more deeply into saturation, and one half-cycle of the waveform 222 to drive magnetic core structure 114 less deeply into saturation.

In addition, as shown in FIG. 2D, the change in the alternating magnetic induction field B phase shifts the induced alternating voltage 214 to generate a phase-shifted induced alternating voltage 224. Further, as shown in FIG. 2E, in the frequency domain, the phase-shifted induced alternating voltage 224 that results from the external magnetic field includes even harmonics, specifically a second harmonic 2$f$.

The magnitude of the second harmonic 2$f$, in turn, is proportional to the magnitude of the external magnetic field. Thus, by filtering the phase-shifted induced alternating voltage 224 to isolate the second harmonic 2$f$, and then detecting the magnitude of the second harmonic 2$f$, the magnitude of the external magnetic field can be determined.

FIG. 3 shows a block diagram that illustrates an example of a prior art fluxgate magnetometer 300. Fluxgate magnetometer 300 is similar to fluxgate magnetometer 100 and, as a result, utilizes the same reference numerals to designate the structures which are common to both fluxgate magnetometers.

As shown in FIG. 3, fluxgate magnetometer 300 differs from fluxgate magnetometer 100 in that fluxgate magnetometer 300 includes a feedback coil 310 that is wrapped around magnetic core structure 114 along with drive coil 110 and sense coil 112, and a feedback circuit 312 that is connected to feedback coil 310 and sense circuit 122. Feedback circuit 312 generates an output voltage $V_{CAN}$ that has an amplitude which is proportional to the magnitude of an external magnetic field.

Fluxgate magnetometer 300 operates the same as fluxgate magnetometer 100, except that feedback coil 310 and feedback circuit 312 are utilized to generate a magnetic field that opposes the external magnetic field. FIG. 2C shows that alignment to the external magnetic field increases the duration of the positive magnetic induction field B and decreases the duration of the negative magnetic induction field B.

In addition, as the strength of the external magnetic field increases, the duration of the positive magnetic induction field B increases while the duration of the negative magnetic induction field B decreases. Thus, as the strength of an external magnetic field increases, the duration of the negative induction field B decreases until the fluxgate magnetometer reaches saturation where there is substantially no negative magnetic induction field B. Once the fluxgate magnetometer saturates, further increases in the strength of the external magnetic field can not be detected by the fluxgate magnetometer.

To prevent a strong external magnetic field from saturating a fluxgate magnetometer, the alternating current input to feedback coil 310 is selected to generate a magnetic field that cancels out the external magnetic field, and effectively make the output voltage $V_{OUT}$ appear as though no external magnetic field were present.

The magnitude of the alternating current input to feedback coil 310 when the output voltage $V_{OUT}$ appears as though no external magnetic field was present can then be used to generate the output voltage $V_{CAN}$. Since the amplitude of the output voltage $V_{CAN}$ is proportional to the magnitude of the external magnetic field, the magnitude of the external magnetic field can then be determined. Thus, the advantage of fluxgate magnetometer 300 is that fluxgate magnetometer 300 can be used in very strong magnetic fields.

FIG. 4 shows a block diagram that illustrates an example of a prior art fluxgate magnetometer 400. As shown in FIG. 4, fluxgate magnetometer 400 includes a drive coil 410, a sense coil 412, and a pair of magnetic core structures 414 and 416 that lie within drive coil 410 and sense coil 412. Drive coil 410 and sense coil 412 are wrapped around the magnetic core structures 414 and 416 in a differential coil arrangement.

As further shown in FIG. 4, fluxgate magnetometer 400 also includes a drive circuit 420 that is connected to drive coil 410, and a sense circuit 422 that is connected to sense coil 412. Sense circuit 422 generates an output voltage $V_{DIF}$ that has an amplitude which is proportional to the magnitude of an external magnetic field.

In operation, drive coil 410 is wrapped around the magnetic core structures 414 and 416 so as to generate equal and opposing alternating magnetic induction fields when drive circuit 420 outputs an alternating current to drive coil 410. Thus, when no external magnetic field is present, no voltage is induced in sense coil 412 because no alternating magnetic induction field is present.

FIG. 5 shows a graph that further illustrates the operation of fluxgate magnetometer 400. As shown in FIG. 5, although no current is induced in sense coil 412 when no external magnetic field is present, the presence of an external magnetic field induces an alternating voltage in sense coil 412.

Sense circuit 422 detects the induced alternating voltage in sense coil 412 and generates in response the output voltage $V_{DIF}$, which has an amplitude that is proportional to the magnitude of the external magnetic field. Thus, by detecting the amplitude of the output voltage $V_{DIF}$, the magnitude of the external magnetic field can be determined.

One of the advantages of fluxgate magnetometer 400 over fluxgate magnetometer 100 is that fluxgate magnetometer 400 requires less support circuitry than fluxgate magnetometer 100. For example, drive circuit 120 commonly generates a second harmonic clock signal which drive circuit 420 need not generate. The second harmonic clock signal, which has a frequency that is equal to the second harmonic of the fundamental frequency of the clock signal used to input current to drive coil, is typically required by sense circuit 122.

FIG. 6 shows a block diagram that illustrates an example of a prior art fluxgate magnetometer 600. Fluxgate magnetometer 600 is similar to fluxgate magnetometer 100 and, as a result, utilizes the same reference numerals to designate the structures which are common to both fluxgate magnetometers.

As shown in FIG. 6, fluxgate magnetometer 600 differs from fluxgate magnetometer 100 in that fluxgate magnetometer 600 utilizes a magnetic core structure 610 in lieu of magnetic core structure 114. Magnetic core structure 610 differs from magnetic core structure 114 in that magnetic core structure 610 has flared ends. Fluxgate magnetometer 600 operates the same as fluxgate magnetometer 100 except that the flared ends of magnetic core structure 610 capture additional flux and channel the additional flux into the body of magnetic core structure 610, thereby functioning as a flux concentrator.

FIG. 7 shows a block diagram that illustrates an example of a prior art fluxgate magnetometer 700. Fluxgate magnetometer 700 is similar to fluxgate magnetometer 100 and, as a result, utilizes the same reference numerals to designate the structures which are common to both fluxgate magnetometers.

As shown in FIG. 7, fluxgate magnetometer 700 differs from fluxgate magnetometer 100 in that fluxgate magnetometer 700 utilizes a magnetic core structure 710 in lieu of magnetic core structure 114. Magnetic core structure 710 differs from magnetic core structure 114 in that magnetic core structure 710 has a narrow center section. In addition, fluxgate magnetometer 700 differs from fluxgate magnetometer 100 in that sense coil 112 of fluxgate magnetometer 700 is only wrapped around the narrow center section of magnetic core structure 710.

Fluxgate magnetometer 700 operates the same as fluxgate magnetometer 100 except that the narrow section of magnetic core structure 710 saturates faster than the remaining sections of magnetic core structure 710. As a result, less current is required to saturate the section of magnetic core structure 710 that is wrapped by sense coil 112.

Although the fluxgate magnetometers 100, 300, 400, 600, and 700 each measures the strength of an external magnetic field, the fluxgate magnetometers 100, 300, 400, 600, and 700 tend to be bulky and expensive to manufacture. In addition, the fluxgate magnetometers 100, 300, 400, 600, and 700 provide only a one dimensional (1D) measure of a magnetic field.

Two dimensional (2D) measurements of the magnetic field taken along an x-axis and a y-axis can be provided, for example, by using two fluxgate magnetometers with two magnetic core structures that have been arranged so that the two magnetic core structures lie perpendicular to each other.

Three dimensional (3D) measurements of the magnetic field can be provided by adding a z-axis fluxgate magnetometer to a 2D fluxgate magnetometer, where the z-axis fluxgate magnetometer has a magnetic core structure that lies perpendicular to both the x-axis and y-axis magnetic core structures.

3D magnetometers tend to use a co-packaged solution, such as Honeywell's HMC6343, where the magnetometer in a first package is attached to a 2D magnetometer in a second package. However, in addition to being bulky, it is difficult to attach the two packages together so that the magnetic core structures for the three axes are mutually perpendicular. Thus, there is a need for a smaller, easier to fabricate, and less expensive fluxgate magnetometer which can measure a magnetic field in the z direction.

BRIEF DESCRIPTION OF THE DRAWINGS

FIGS. 2A-2E are views illustrating the operation of fluxgate magnetometer 100. FIG. 2A is a graph illustrates a BH curve 200 for magnetic core structure 114. FIG. 2B is a graph illustrating an alternating current input to drive coil 110. FIG. 2C is a graph illustrating the magnetic induction field B that results from the alternating current input to drive coil 110. FIG. 2D is a graph illustrating an induced voltage in sense coil 112 plotted in the time domain that results from the magnetic induction field B. FIG. 2E is a graph illustrating an induced voltage in sense coil 112 plotted in the frequency domain that results from the magnetic induction field B.

FIG. 8A is a perspective view. FIG. 8B is a plan view of a fourth metal layer, FIG. 8C is a plan view of a third metal layer, FIG. 8D is a plan view of a second metal layer, and FIG. 8E is a plan view of a first metal layer. FIG. 8F is a cross-sectional view that shows a coil section of magnetometer 800 taken along line 8F-8F of FIGS. 8B-8E, and a die section of magnetometer 800.

FIGS. 9A-42A are a series of plan views, while FIGS. 9B-42B are a series of cross-sectional views taken along lines 9B-42B, respectively, in FIGS. 9A-42A, and FIGS. 9C-42C are a series of cross-sectional views taken along lines 9C-42C, respectively, in FIGS. 9A-42A.

FIGS. 43A-43F are views illustrating an example of a z-axis semiconductor fluxgate magnetometer 4300 in accordance with an alternate embodiment of the present invention. FIG. 43A is a plan view of a fourth metal layer, FIG. 43B is a plan view of a third metal layer, FIG. 43C is a plan view of a second metal layer, and FIG. 43D is a plan view of a first metal layer. FIG. 43E is a cross-sectional view that shows a coil section of magnetometer 4300 taken along line 43E-43E of FIGS. 43A-43D, and a die section of magnetometer 4300. FIG. 43F is a cross-sectional view that shows a coil section of magnetometer 4300 taken along line 43F-43F in FIGS. 43A-43D, and a die section of magnetometer 4300.

FIGS. 44A-44E are views illustrating an example of a z-axis semiconductor fluxgate magnetometer 4400 in accordance with an alternate embodiment of the present invention. FIG. 44A is a plan view of a fourth metal layer, FIG. 44B is a plan view of a third metal layer, FIG. 44C is a plan view of a second metal layer, and FIG. 44D is a plan view of a first metal layer. FIG. 44E is a cross-sectional view that shows a coil section of magnetometer 4400 taken along line 44E-44E in FIGS. 44A-44D, and a die section of magnetometer 4400.

FIGS. 45A-45E are views illustrating an example of a z-axis semiconductor fluxgate magnetometer 4500 in accordance with an alternate embodiment of the present invention. FIG. 45A is a plan view of a fourth metal layer, FIG. 45B is a plan view of a third metal layer, FIG. 45C is a plan view of a second metal layer, and FIG. 45D is a plan view of a first metal layer. FIG. 45E is a cross-sectional view that shows a coil section of magnetometer 4500 taken along line 45E-45E in FIGS. 45A-45D, and a die section of magnetometer 4500.

DETAILED DESCRIPTION OF THE INVENTION

Figure 1:
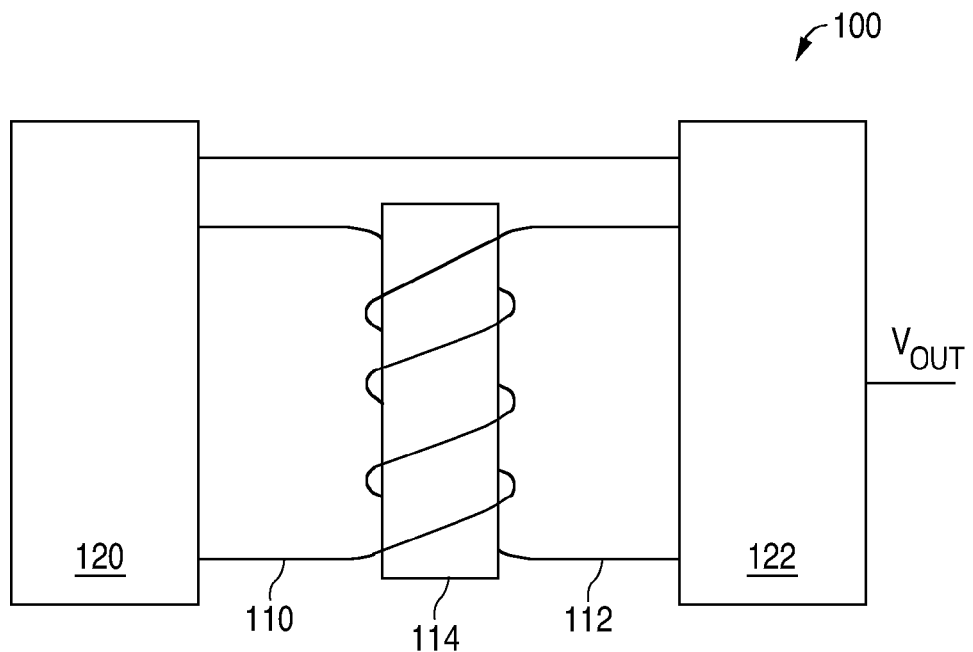
FIG. 1 is a block diagram illustrating an example of a prior art fluxgate magnetometer 100.
Figure 3:
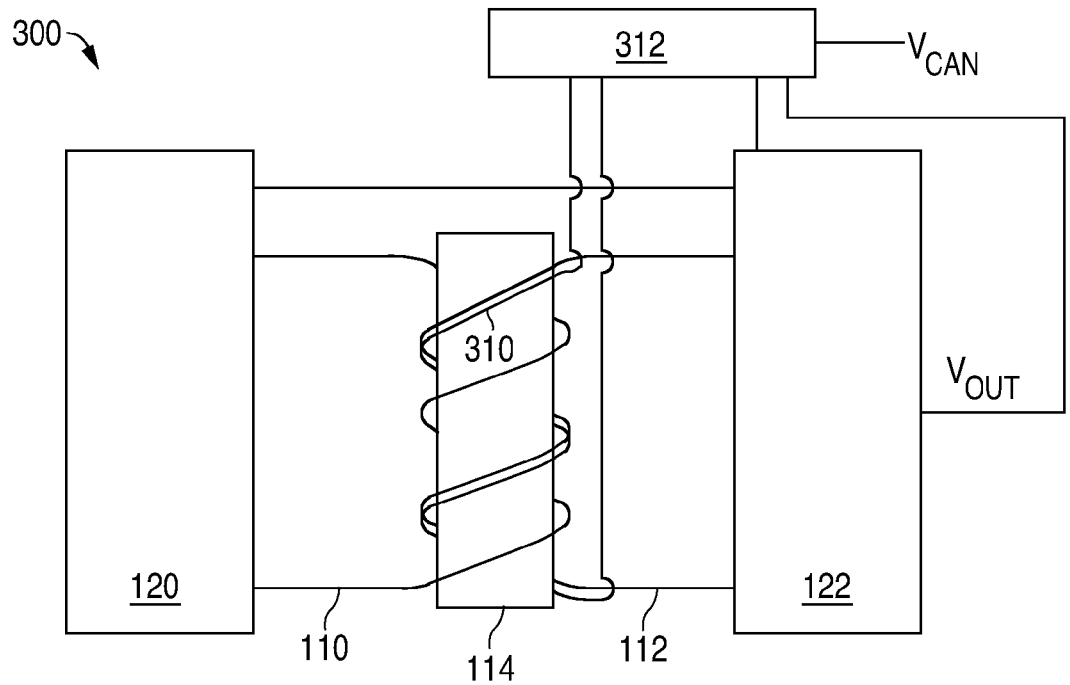
FIG. 3 is a block diagram illustrating an example of a prior art fluxgate magnetometer 300.
Figure 4:
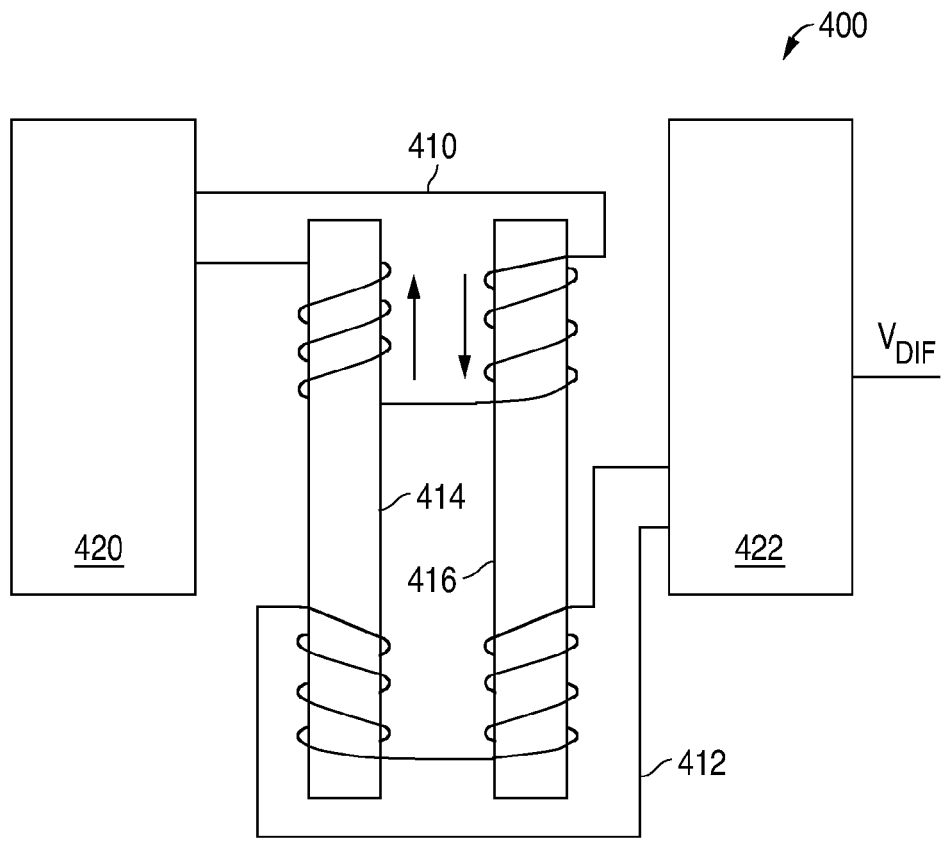
FIG. 4 is a block diagram illustrating an example of a prior art fluxgate magnetometer 400.
Figure 5:
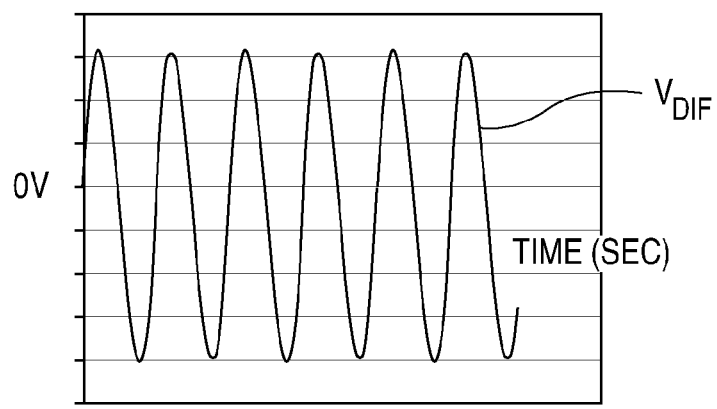
FIG. 5 is a graph further illustrating the operation of fluxgate magnetometer 400.
Figure 6:
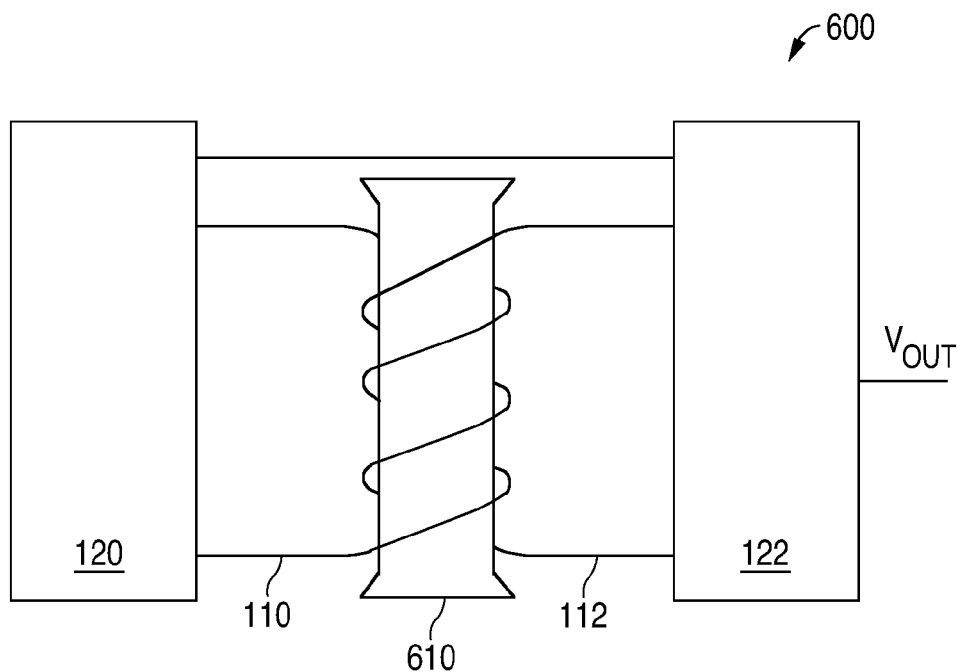
FIG. 6 is a block diagram illustrating an example of a prior art fluxgate magnetometer 600.
Figure 7:
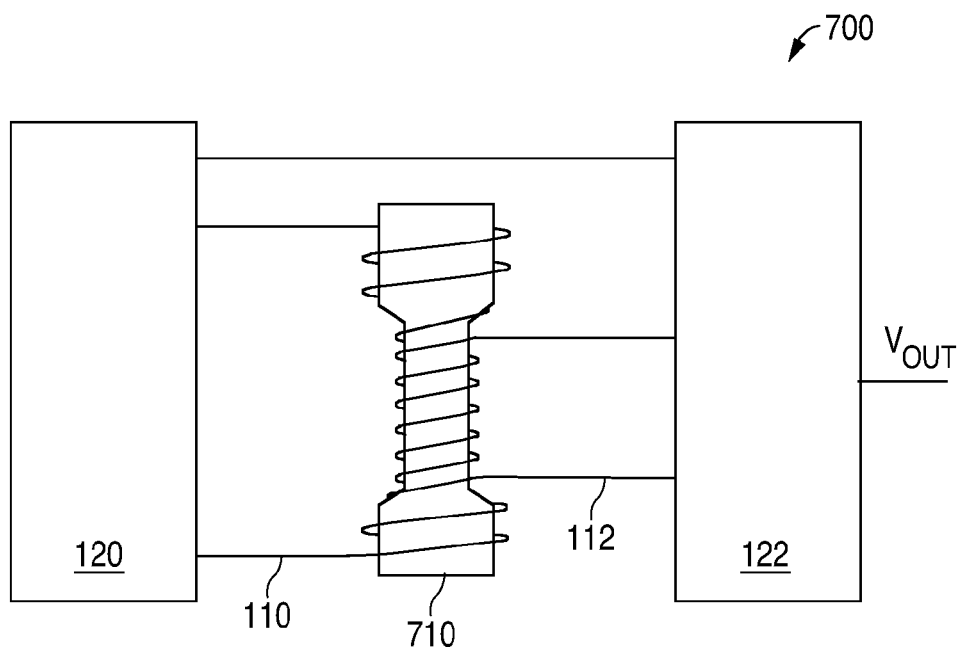
FIG. 7 is a block diagram illustrating an example of a prior art fluxgate magnetometer 700.
Figure 8A:
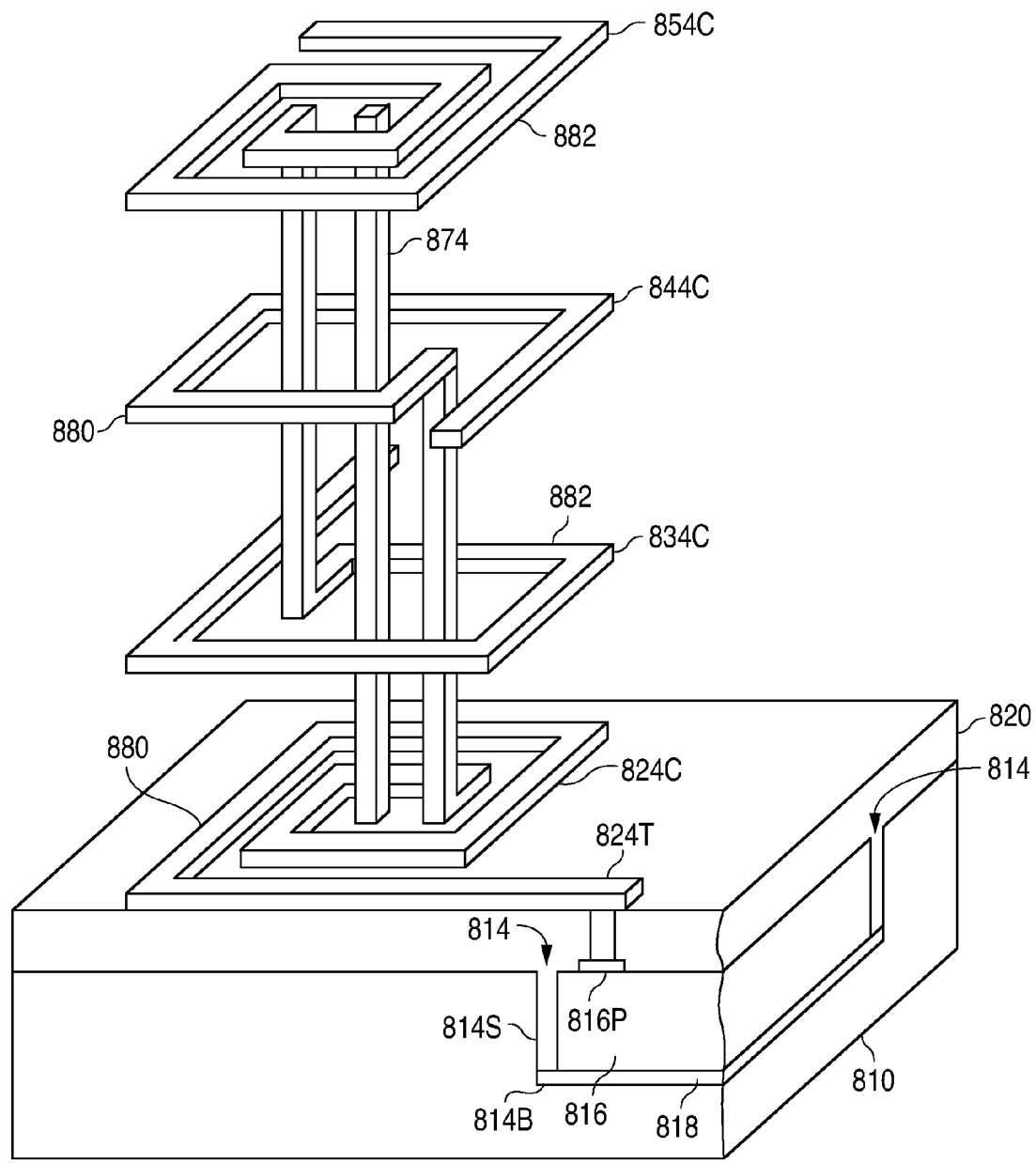
FIGS. 8A-8F are views illustrating an example of a z-axis semiconductor fluxgate magnetometer 800 in accordance with the present invention.
Figure 8B:
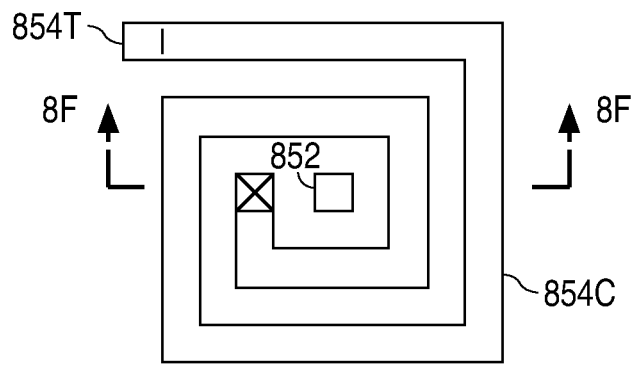
Figure 8C:
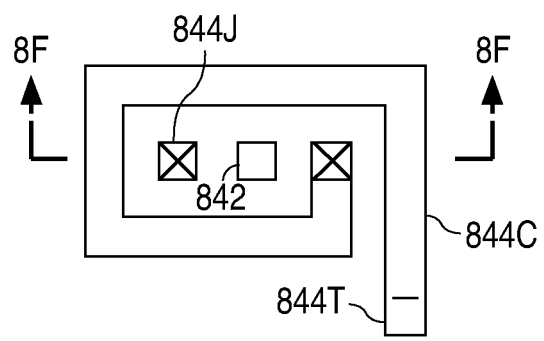
Figure 8D:
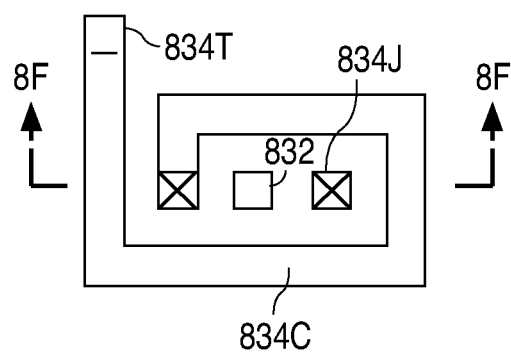
Figure 8E:
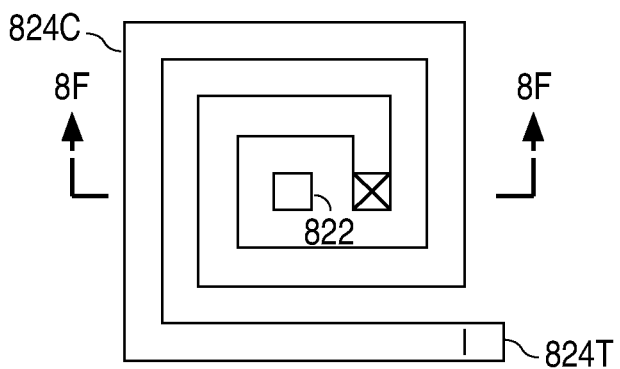
Figure 8F:
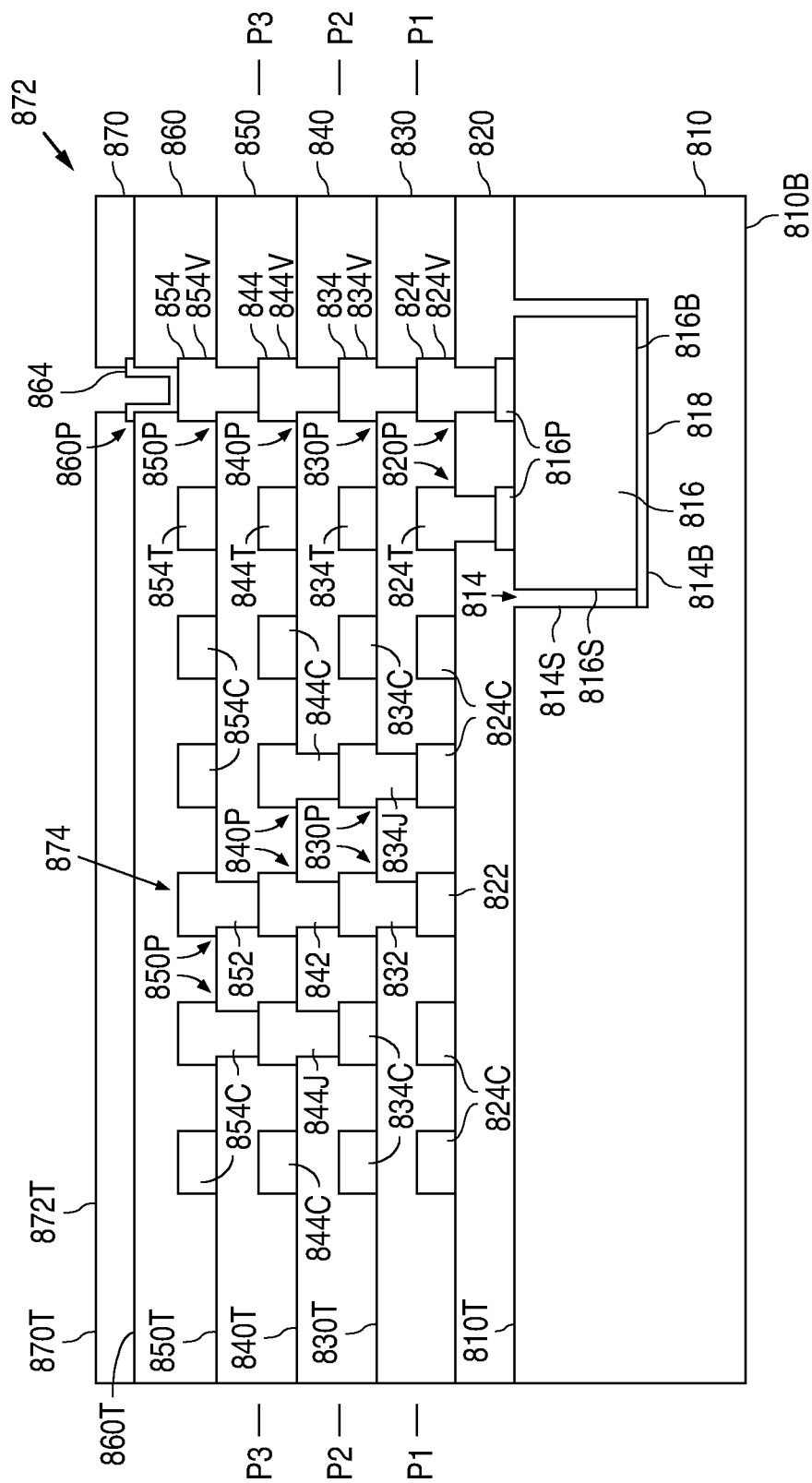

FIGS. 8A-8F show views that illustrate an example of a z-axis semiconductor fluxgate magnetometer 800 in accordance with the present invention. FIG. 8A shows a perspective view. FIG. 8B shows a plan view of a fourth metal layer, FIG. 8C shows a plan view of a third metal layer, FIG. 8D shows a plan view of a second metal layer, and FIG. 8E shows a plan view of a first metal layer. FIG. 8F shows a cross-sectional view that illustrates a coil section of magnetometer 800 taken along line 8F-8F of FIGS. 8B-8E, and a die section of magnetometer 800. As described in greater detail below, the present invention provides a semiconductor fluxgate magnetometer that measures magnetic fields in the z-direction.

As shown in FIGS. 8A-8F, z-axis semiconductor fluxgate magnetometer 800 includes a semiconductor structure 810 that has a bottom surface 810B, a top surface 810T, and a cavity 814 that extends from the top surface 810T down into semiconductor structure 810. Cavity 814, in turn, has a side wall surface 814S and a bottom surface 814B that lies above and vertically spaced apart from the bottom surface 810B of semiconductor structure 810. In addition, bottom surface 814B can be either conductive or non-conductive.

As further shown in FIGS. 8A-8F, z-axis semiconductor fluxgate magnetometer 800 includes a die 816 that lies in cavity 814, and an adhesive 818 that attaches die 816 to the bottom surface 814B of cavity 814. Die 816 has a side wall surface 816S, a bottom surface 816B that touches adhesive 818, and a number of conductive pads 816P that provide external electrical connection points for die 816.

In addition, die 816 includes the drive and sense circuits. In the present example, the drive circuit is conventionally implemented, and includes all of the electrical components that are required to output an alternating current to a drive coil, and a clock signal to the sense circuit that is equal to the second harmonic of the fundamental frequency of the alternating current that is output to the drive coil.

Further, the sense circuit is conventionally implemented, and includes all of the electrical components that are required to detect an alternating voltage that has been induced in a sense coil, isolate the second harmonic of the induced alternating voltage, and generate an output voltage that represents the magnitude of the second harmonic of the induced alternating voltage (which is proportional to the magnitude of an external magnetic field).

Adhesive 818, in turn, can be implemented with, for example, a conductive or non-conductive epoxy or die attach film. In addition, adhesive 818, which can be, for example, 25 μm thick, can be selected based on any isolation and thermal requirements of die 816 and whether the bottom surface 814B of cavity 814 is conductive or non-conductive.

Z-axis semiconductor fluxgate magnetometer 800 also includes a non-conductive structure 820 that touches die 816 and semiconductor structure 810. Non-conductive structure 820, which fills up the remainder of cavity 814, has a number of openings 820P that expose the conductive pads 816P on die 816.

Further, z-axis semiconductor fluxgate magnetometer 800 includes a magnetic core structure 822 and number of metal-1 structures 824 that touch non-conductive structure 820. The metal-1 structures 824 include a number of via structures 824V that extend through non-conductive structure 820 to touch a first group of the conductive pads 816P which represent the power/ground and input/output signal pads of die 816, a number of via trace structures 824T with via sections that extend through non-conductive structure 820 to touch a second group of the conductive pads 816P which represent input/output coil pads, and a trace structure 824C that touches a via trace structure 824T.

Trace structure 824C, in turn, has a number of loops that form a planar coil where all of the top surface of trace structure 824C lies substantially in a plane P1. In addition, although trace structure 824C is illustrated with two loops in FIG. 8E, a larger number or a smaller number of loops can alternately be used.

Z-axis semiconductor fluxgate magnetometer 800 further includes a non-conductive structure 830 that touches non-conductive structure 820, magnetic core structure 822, the via structures 824V, the via trace structures 824T, and trace structure 824C. Non-conductive structure 830 has a substantially planar top surface 830T, and a number of openings 830P that expose the surfaces of magnetic core structure 822, the via structures 824V, the via traces 824T that are to be connected to higher metal layers, and an end of trace structure 824C.

In addition, z-axis semiconductor fluxgate magnetometer 800 includes a magnetic core structure 832 and number of metal-2 structures 834 that touch non-conductive structure 830. Magnetic core structure 832 touches and lies above magnetic core structure 822. The metal-2 structures 834, in turn, include a number of via structures 834V that extend through non-conductive structure 830 to touch the via structures 824V, and a number of via trace structures 834T with via sections that extend through non-conductive structure 830 to touch the via traces 824T. The metal-2 structures 834 also include a vertical member 8343 that touches the end of trace structure 824C, and a trace structure 834C that touches a via trace structure 834T.

Trace structure 834C, in turn, has a number of loops that form a planar coil where all of the top surface of trace structure 834C lies substantially in a plane P2. In addition, although trace structure 834C is illustrated with one and one quarter loops in FIG. 8D, trace structure 834 can alternately be implemented with a larger number or a smaller number of loops.

Z-axis semiconductor fluxgate magnetometer 800 further includes a non-conductive structure 840 that touches non-conductive structure 830, magnetic core structure 832, the via structures 834V, the via trace structures 834T, and trace structure 834C. Non-conductive structure 840 has a substantially planar top surface 840T, and a number of openings 840P that expose the surface of magnetic core structure 832, the via structures 834V, the via traces 834T that are to be connected to higher metal layers, an end of trace structure 834C, and vertical member 8341

In addition, z-axis semiconductor fluxgate magnetometer 800 includes a magnetic core structure 842 and a number of metal-3 structures 844 that touch non-conductive structure 840. Magnetic core structure 842 touches and lies above magnetic core structure 832. The metal-3 structures 844 include a number of via structures 844V that extend through non-conductive structure 840 to touch the via structures 834V, and a number of via trace structures 844T with via sections that extend through non-conductive structure 840 to touch the via traces 834T. Further, the metal-3 structures 844 include a vertical member 8443 that touches the end of trace structure 834C, and a trace structure 844C that touches vertical member 8343 and a via trace structure 844T.

Trace structure 844C, in turn, has a number of loops that form a planar coil where all of the top surface of trace structure 844C lies substantially in a plane P3. In addition, although trace structure 844C is illustrated with one and one quarter loops in FIG. 8C, trace structure 844C can alternately be implemented with a larger number or a smaller number of loops.

Z-axis semiconductor fluxgate magnetometer 800 further includes a non-conductive structure 850 that touches non-conductive structure 840, magnetic core structure 842, the via structures 844V, the via trace structures 844T, and trace structure 844C. Non-conductive structure 850 has a substantially planar top surface 850T, and a number of openings 850P that expose the surfaces of the magnetic core structure 842, the via structures 844V, the via trace structures 844T that are to be connected to higher metal layers, and vertical member 8441

Z-axis semiconductor fluxgate magnetometer 800 additionally includes a magnetic core structure 852 and number of metal-4 structures 854 that touch non-conductive structure 850. Magnetic core structure 852 touches and lies over magnetic core structure 842. The metal-4 structures 854, in turn, include a number of via structures 854V that extend through non-conductive structure 850 to touch the via structures 844V, a number of via trace structures 854T with via sections that extend through non-conductive structure 850 to touch the via traces 844T, and a trace structure 854C that touches vertical member 8443 and a via trace structure 854T.

In addition, z-axis semiconductor fluxgate magnetometer 800 includes a non-conductive structure 860 that touches non-conductive structure 850, magnetic core structure 852, the via structures 854V, the via trace structures 854T, and trace structure 854C. Non-conductive structure 860 has a substantially planar top surface 860T, and a number of openings 860P that expose the via structures 854V.

Z-axis semiconductor fluxgate magnetometer 800 further includes a number of bond pad structures 864 that touch non-conductive structure 860 and extend through non-conductive structure 860 to touch the via structures 854V, and a non-conductive passivation structure 870 that touches non-conductive structure 860 and the bond pad structures 864. Passivation structure 870 has a substantially planar top surface 870T.

Thus, together the non-conductive structures 820, 830, 840, 850, 860, and 870 form a non-conductive structure 872 that has a top surface 872T. In addition, the magnetic core structures 822, 832, 842, and 852 together form a magnetic core pole structure 874.

Further, vertical member 8343 electrically connects trace structure 824C to trace structure 844C to form a drive coil 880 which has vertically spaced apart horizontal loops that are wrapped around magnetic core pole structure 874. Similarly, vertical member 8443 electrically connects trace structure 834C to trace structure 854C to form a sense coil 882 which has vertically spaced apart horizontal loops that are wrapped around magnetic core pole structure 874. Further, a loop of drive coil 880 lies vertically between the horizontal loops of sense coil 882.

In operation, the drive circuit of die 816 outputs an alternating current to drive coil 880, and a clock signal to the sense circuit of die 816 that is equal to second harmonic of the fundamental frequency of the alternating current that is output to drive coil 880. The alternating current in drive coil 880 sets up an alternating magnetic induction field that induces an alternating voltage in sense coil 882.

The sense circuit detects the alternating voltage in sense coil 882, isolates the second harmonic of the alternating voltage in sense coil 882, identifies a magnitude of the second harmonic, and generates an output voltage with a magnitude that is proportional to the magnitude of the external magnetic field.

FIGS. 9A-9C through 42A-42C show a series of views that illustrate an example of a method of forming a z-axis semiconductor fluxgate magnetometer in accordance with the present invention. FIGS. 9A-42A show a series of plan views, while FIGS. 9B-42B show a series of cross-sectional views taken along lines 9B-42B, respectively, in FIGS. 9A-42A, and FIGS. 9C-42C show a series of cross-sectional views taken along lines 9C-42C, respectively, in FIGS. 9A-42A.

Figure 9A:
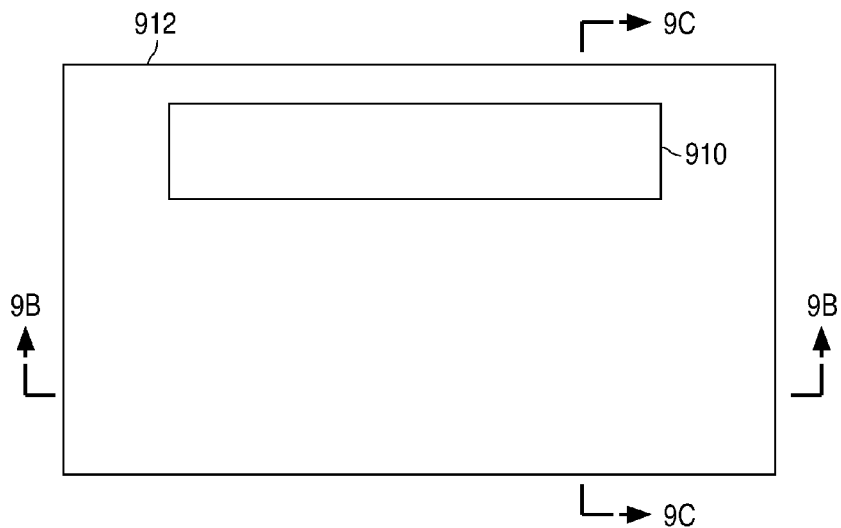
FIGS. 9A-9C through 42A-42C are a series of views illustrating an example of a method of forming a z-axis semiconductor fluxgate magnetometer in accordance with the present invention.
Figure 9B:
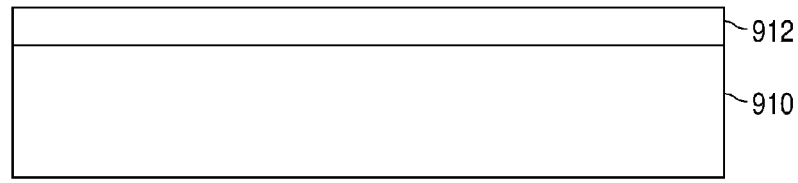
Figure 9C:
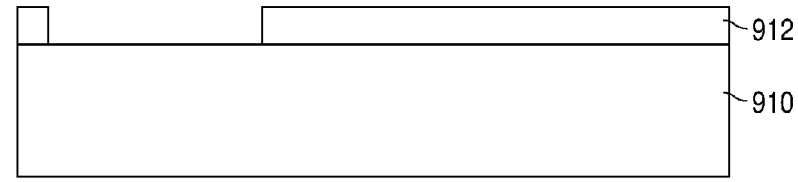

As shown in the FIGS. 9A-9C, the method of forming a z-axis semiconductor fluxgate magnetometer utilizes a conventionally-formed semiconductor wafer 910. Wafer 910, in turn, can be implemented with a conducting material, such as silicon, or a non-conducting material such as quartz or G10-FR4 glass epoxy laminates. As further shown in FIGS. 9A-9C, the method begins by forming a patterned photoresist layer 912 on the top surface of wafer 910.

Patterned photoresist layer 912 is formed in a conventional manner, which includes depositing a layer of photoresist, projecting a light through a patterned black/clear glass plate known as a mask to form a patterned image on the layer of photoresist that softens the photoresist regions exposed by the light, and removing the softened photoresist regions.

Figure 10A:
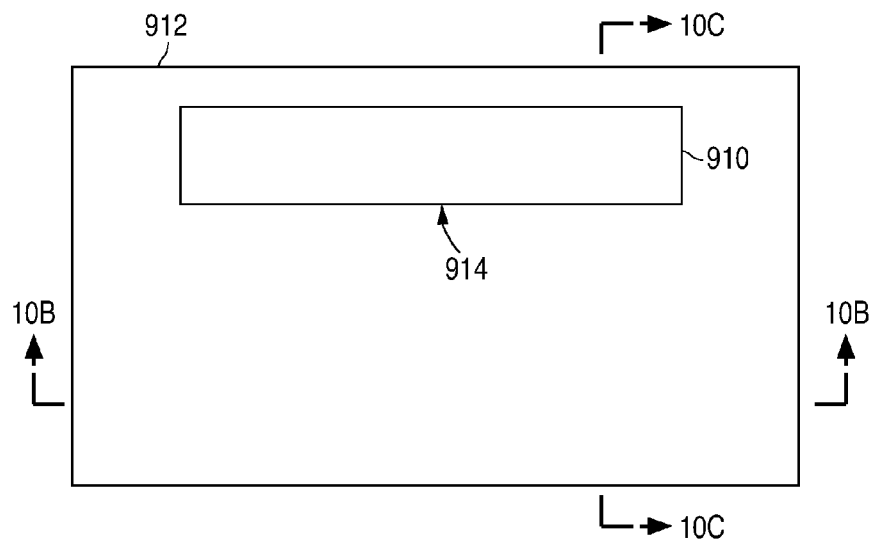
Figure 10B:
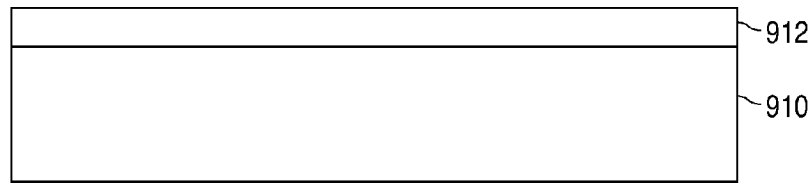
Figure 10C:
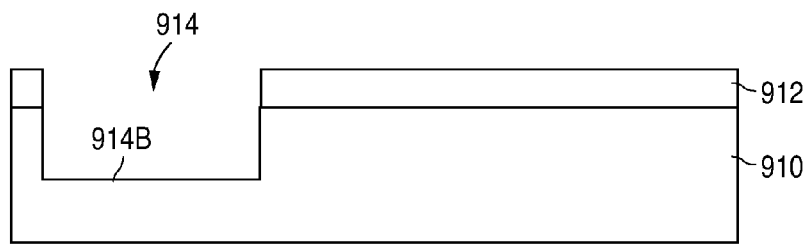

As shown in FIGS. 10A-10C, after patterned photoresist layer 912 has been formed, the exposed regions of wafer 910 are etched in a conventional manner to form a large number of cavities 914, which each has a bottom surface 914B, in wafer 910. (Only one cavity 914 is shown for simplicity.) Wafer 910 can be etched using a dry etch such as reactive ion etching, or a timed wet etch.

After the etch, the resulting structure is rinsed, and patterned photoresist layer 912 is then removed in a conventional manner, such as with acetone. Once patterned photoresist layer 912 has been removed, the resulting structure is conventionally cleaned to remove organics, such as with a Piranha etch (e.g., using a solution of 50 $H_2SO_4$:1 $H_2O_2$ @ 120° C. removes approximately 240 nm/minute). If wafer 910 is conductive, wafer 910 can optionally include a non-conductive top layer, such as an oxide layer with an overlying nitride layer, which lines cavity 914 to provide a non-conductive surface.

Figure 11A:
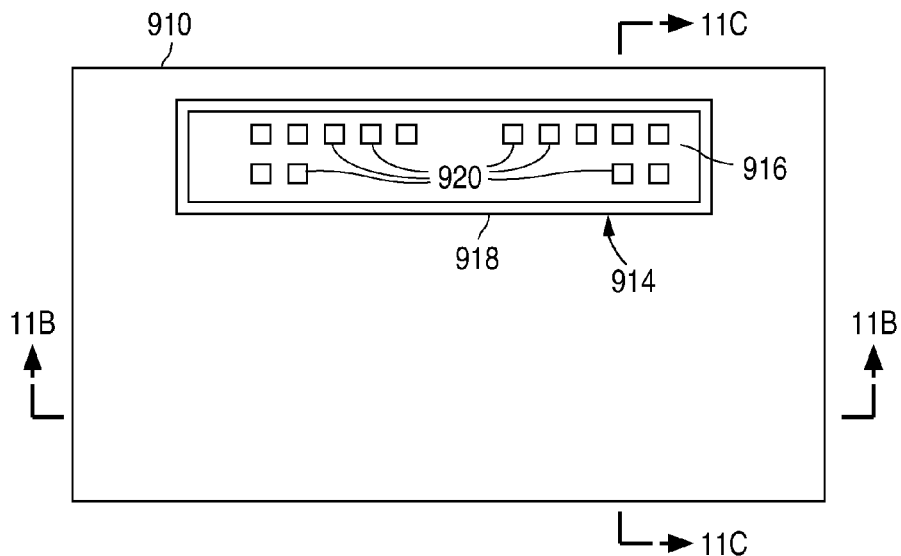
Figure 11B:
Figure 11C:
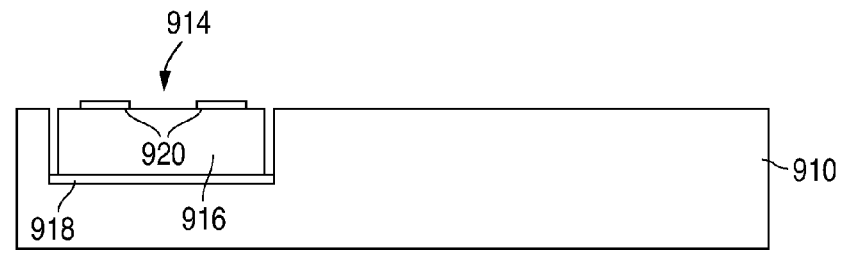

Next, as shown in FIGS. 11A-11C, a die 916 is placed in each cavity 914 and attached to the bottom surface 914B of the cavity 914 using an adhesive 918 such as, for example, a conductive or non-conductive epoxy or die attach film. Adhesive 918, which can be, for example, 25 µm thick, can be selected based on any isolation and thermal requirements of die 916 and whether the bottom surface 914B of cavity 914 is conductive or non-conductive. Die 916, which includes the drive and sense electronics and a number of conductive pads 920, can be placed in and attached to the bottom surface 914B of cavity 914 using a conventional pick and place machine.

Figure 12A:
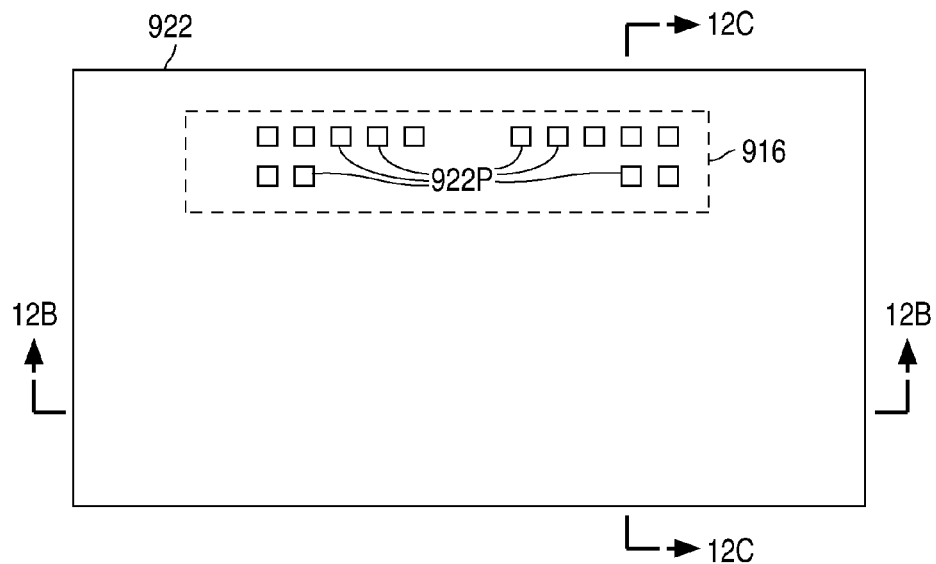
Figure 12B:
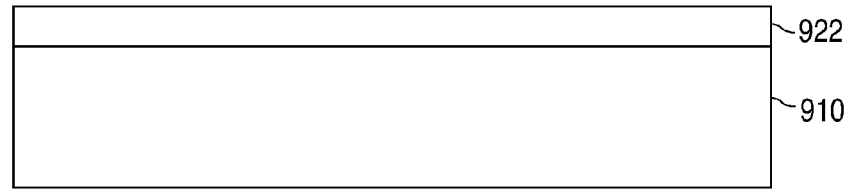
Figure 12C:
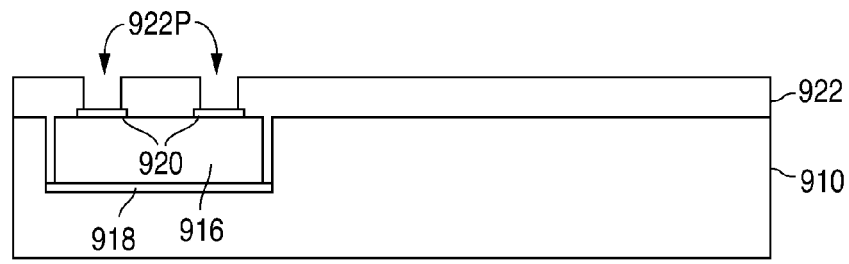

As shown in FIGS. 12A-12C, after die 916 has been attached to the bottom surface 914B of cavity 914, a non-conductive structure 922 is formed to touch die 916 and wafer 910. Non-conductive structure 922, which fills up the remainder of cavity 914, has a number of openings 922P that expose the conductive pads 920 on die 916.

Figure 13A:
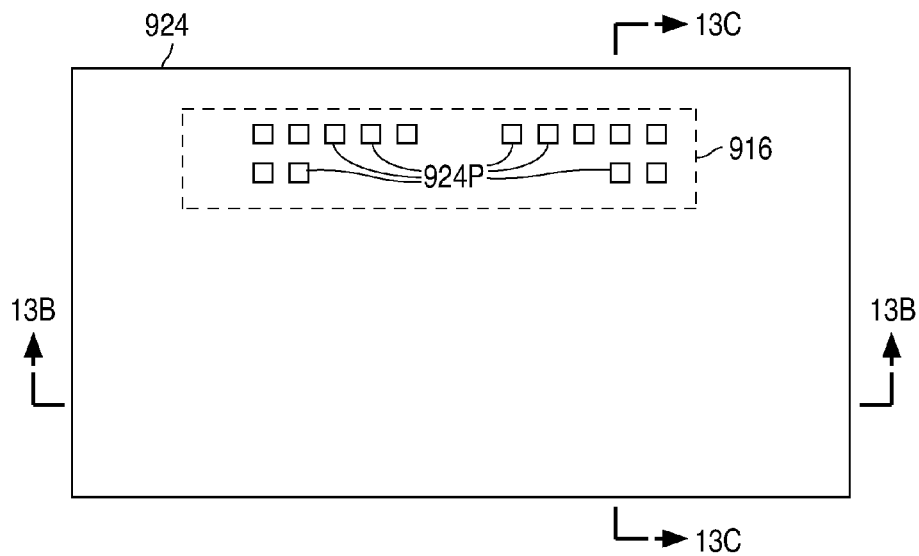
Figure 13B:
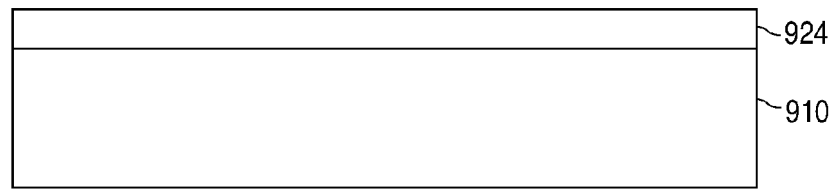
Figure 13C:
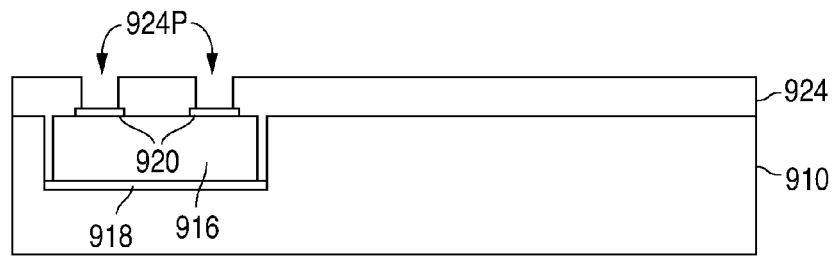

In the present example, as shown in FIGS. 13A-13C, non-conductive structure 922 is formed by depositing a layer of photoimageable epoxy or polymer 924, such as SU-8, benzocyclobutene (BCB), or polybenzoxazole (PBO), which are substantially self planarizing. Once the photoimageable epoxy or polymer has been deposited, a number of openings 924P are formed in photoimageable epoxy or polymer layer 924 by projecting a light through a mask to form a patterned image on layer 924 that softens the regions of layer 924 that are exposed by the light, and then removing the softened regions of layer 924.

Figure 14A:
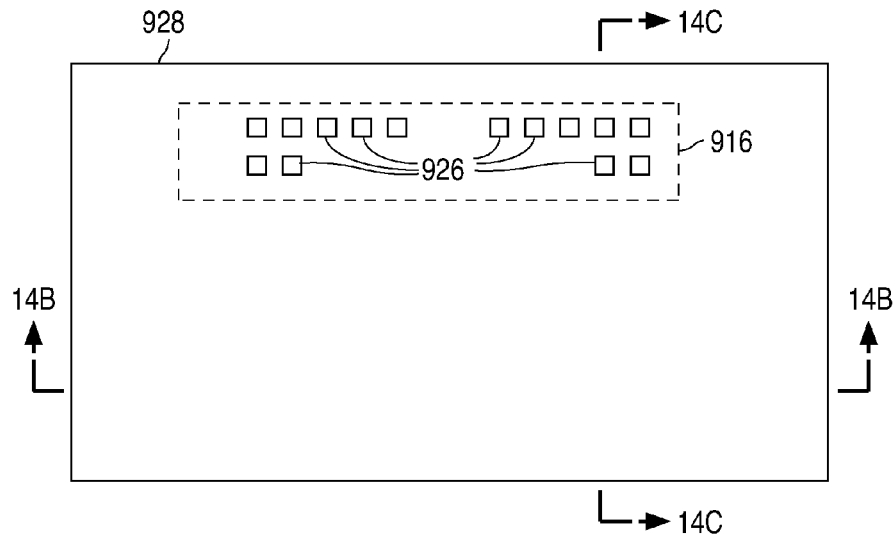
Figure 14B:
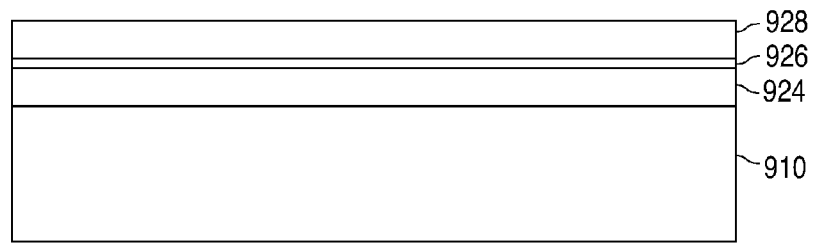
Figure 14C:
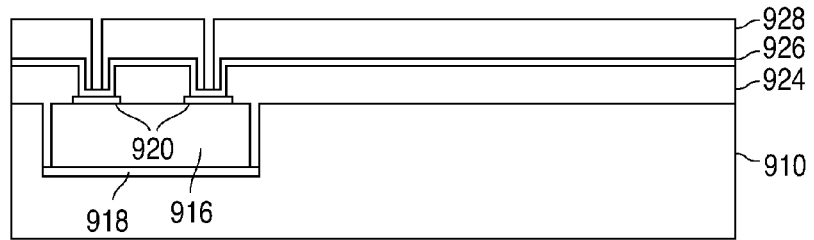

After the openings 924P have been formed, as shown in FIGS. 14A-14C, a layer of nitride 926 approximately 0.6 µm thick is conventionally formed on photoimageable epoxy or polymer layer 924 to line the openings 924P using, for example, plasma-enhanced chemical vapor deposition (PECVD).

Following this, a patterned photoresist layer 928 is conventionally formed on nitride layer 926. The exposed regions of nitride layer 926 are then etched to expose the conductive pads 920 on die 916. Patterned photoresist layer 928 is then removed in a conventional manner to complete the formation of non-conductive structure 922. (The formation and etch of nitride layer 926, which is used to provide a copper diffusion barrier, are optional and can be omitted.)

Figure 15A:
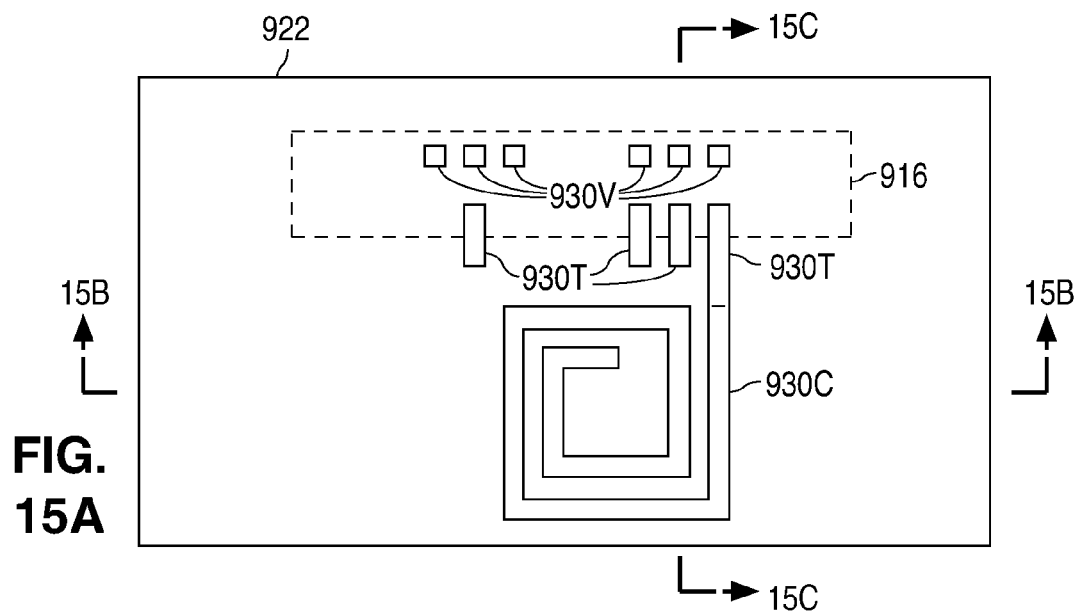
Figure 15B:
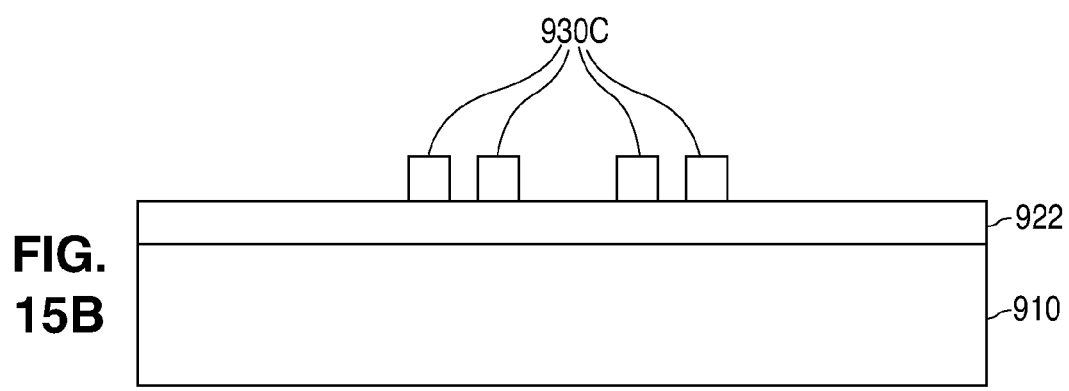
Figure 15C:
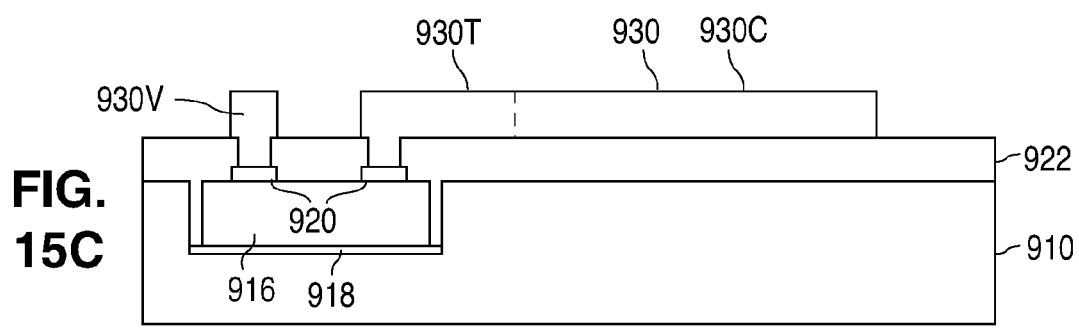

As shown in FIGS. 15A-15C, after non-conductive structure 922 has been formed, a number of metal-1 structures 930 are formed to touch non-conductive structure 922. The metal-1 structures 930 include a number of via structures 930V that also touch a first group of the conductive pads 920, a number of via trace structures 930T that also touch a second group of the conductive pads 920, and a trace structure 930C with a number of loops. The metal-1 structures 930 can be formed in a number of different ways.

Figure 16A:
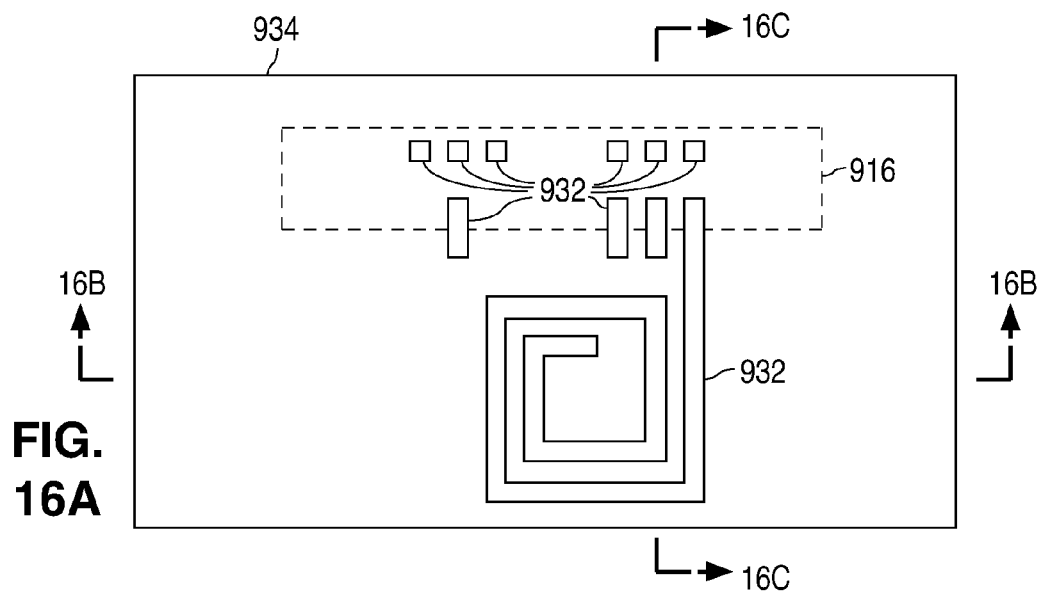
Figure 16B:
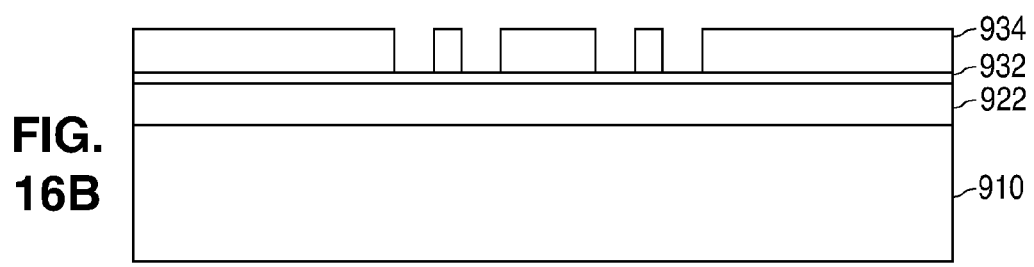
Figure 16C:
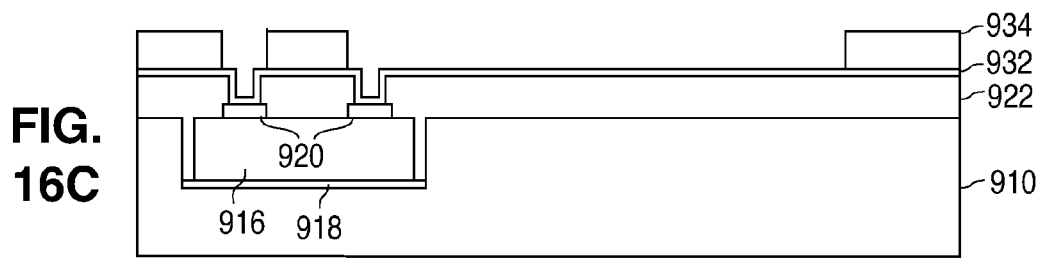

As shown in FIGS. 16A-16C, in a first embodiment, the metal-1 structures 930 can be formed by depositing a seed layer 932 to touch non-conductive structure 922 and the conductive pads 920. For example, seed layer 932 can be implemented with a layer of aluminum copper. Seed layer 932 can alternately be formed by depositing 300 Å of titanium, 3000 Å of copper, and 300 Å of titanium. After seed layer 932 has been formed, a plating mold 934 is formed on the top surface of seed layer 932.

Figure 17A:
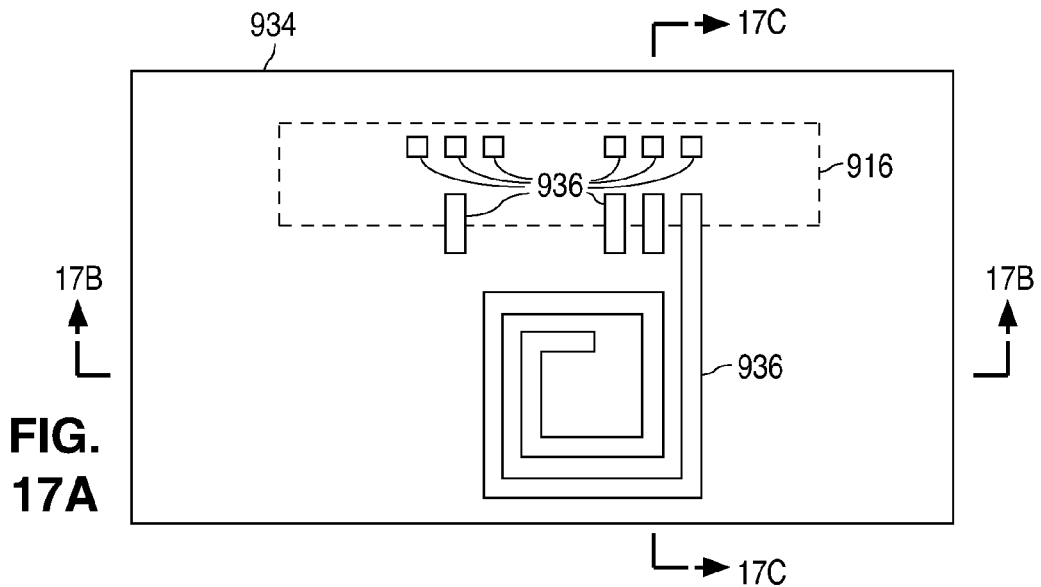
Figure 17B:
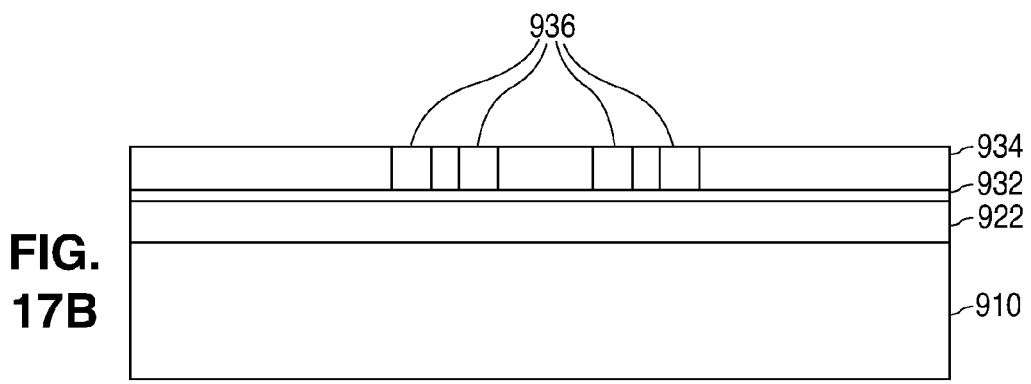
Figure 17C:
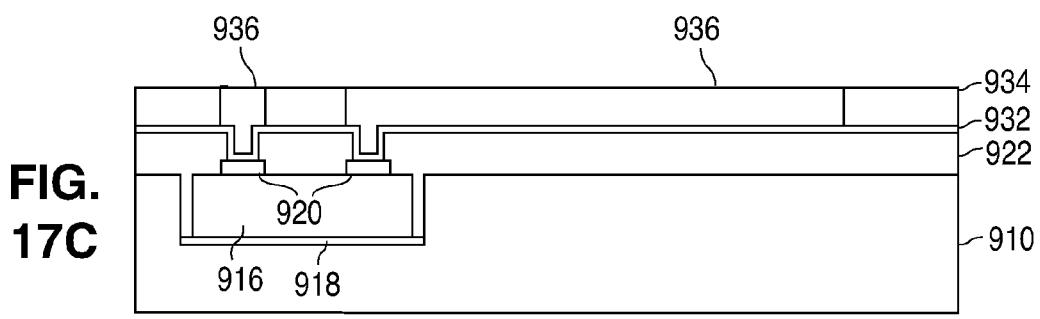
Figure 18A:
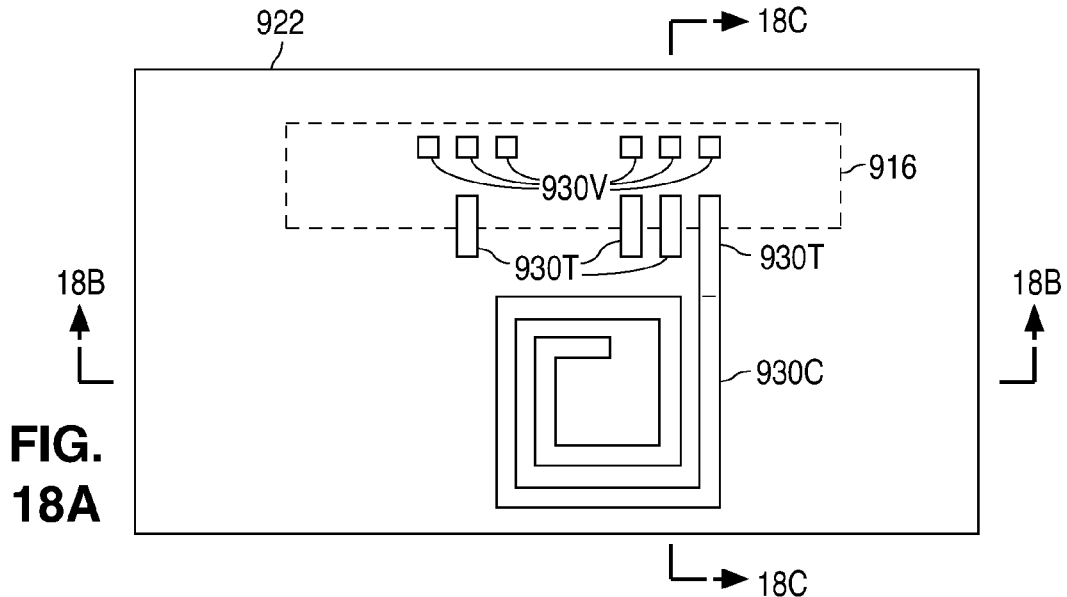
Figure 18B:
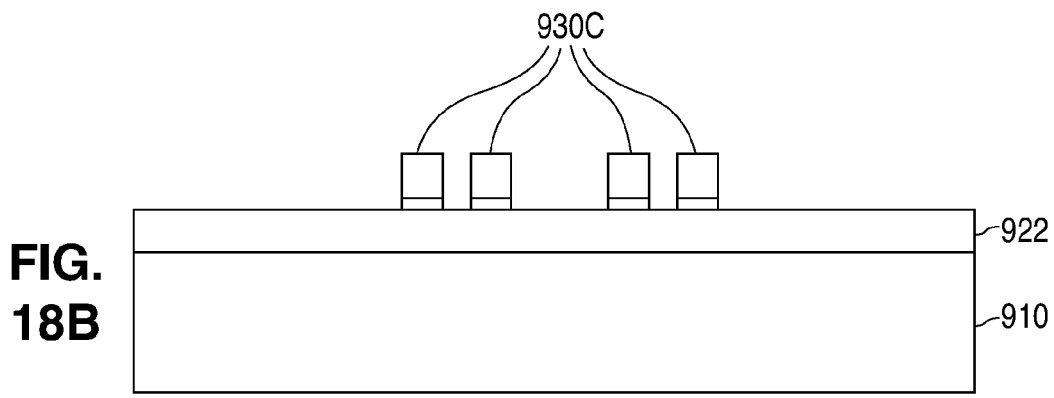
Figure 18C:
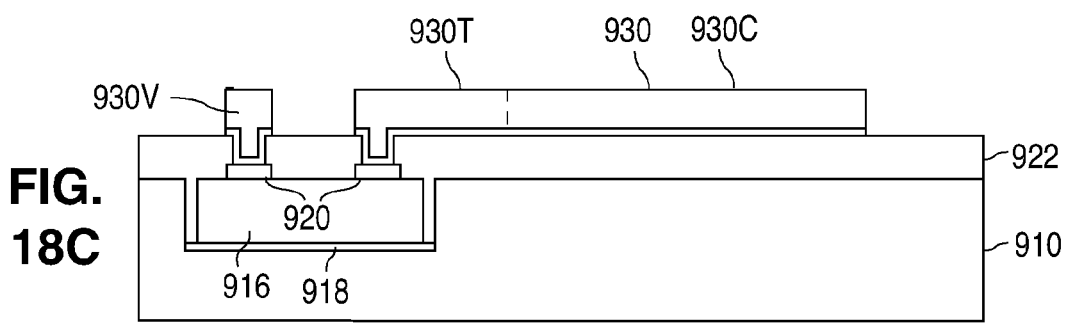

As shown in FIGS. 17A-17C, following the formation of plating mold 934, copper is electroplated in a conventional manner to form a number of copper regions 936 approximately 5 µm thick. After the electroplating, as shown in FIGS. 18A-18C, plating mold 934 and the underlying regions of seed layer 932 are removed to form the via structures 930V, the via trace structures 930T, and trace structure 930C.

Figure 19A:
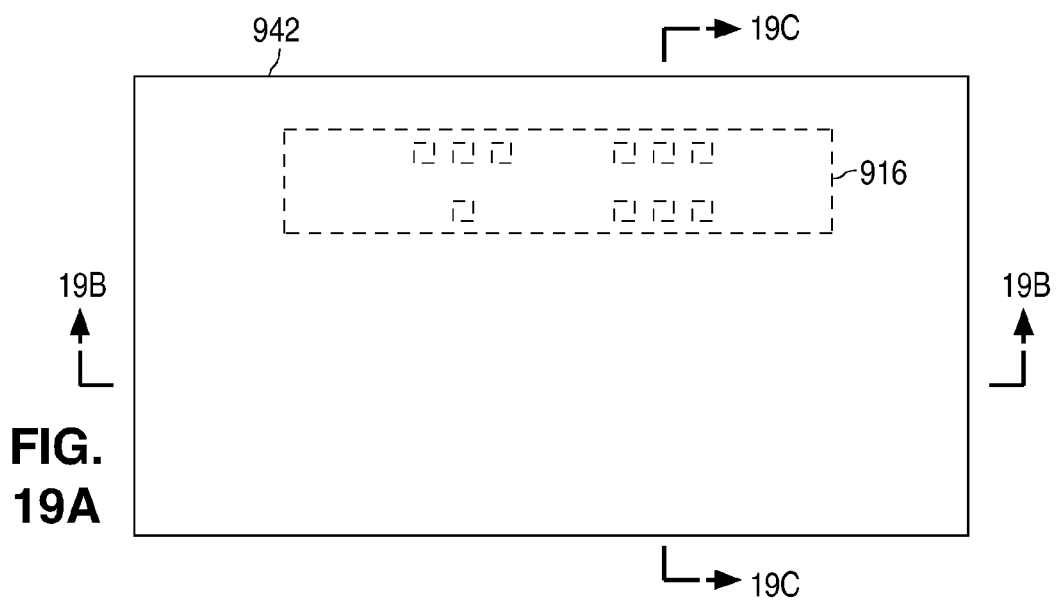
Figure 19B:
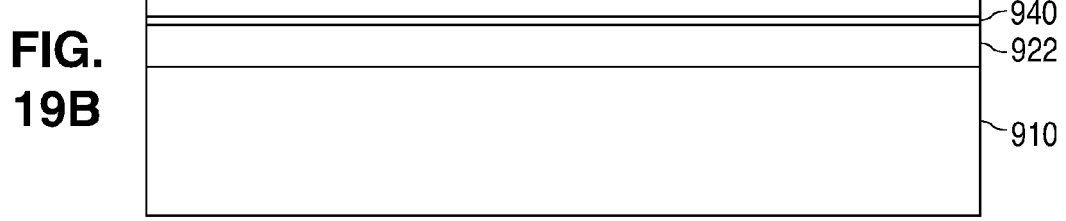
Figure 19C:
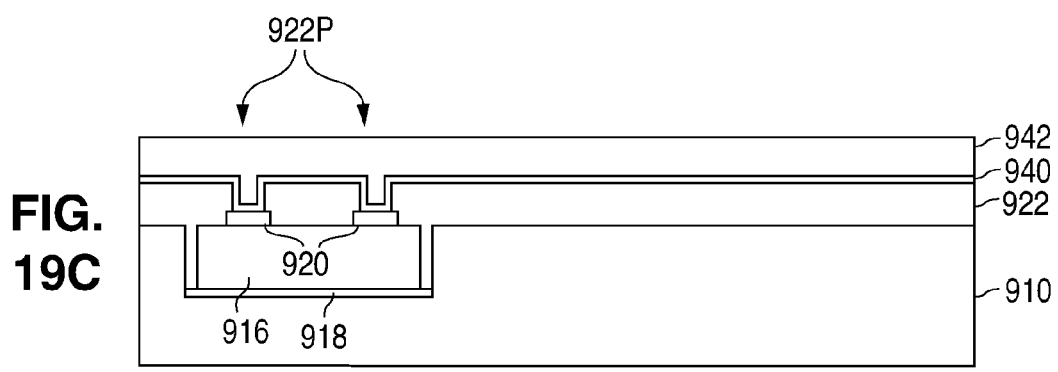

Alternately, in a second embodiment, as shown in FIGS. 19A-19C, the metal-1 structures 930 can be formed by first depositing a liner layer 940 on non-conductive structure 922 to line the openings 922P. Liner layer 940 can be implemented with, for example, titanium/titanium nitride. After liner layer 940 has been formed, a metal layer 942, such as tungsten, is conventionally deposited on liner layer 940 to fill up the openings 922P.

Figure 20A:
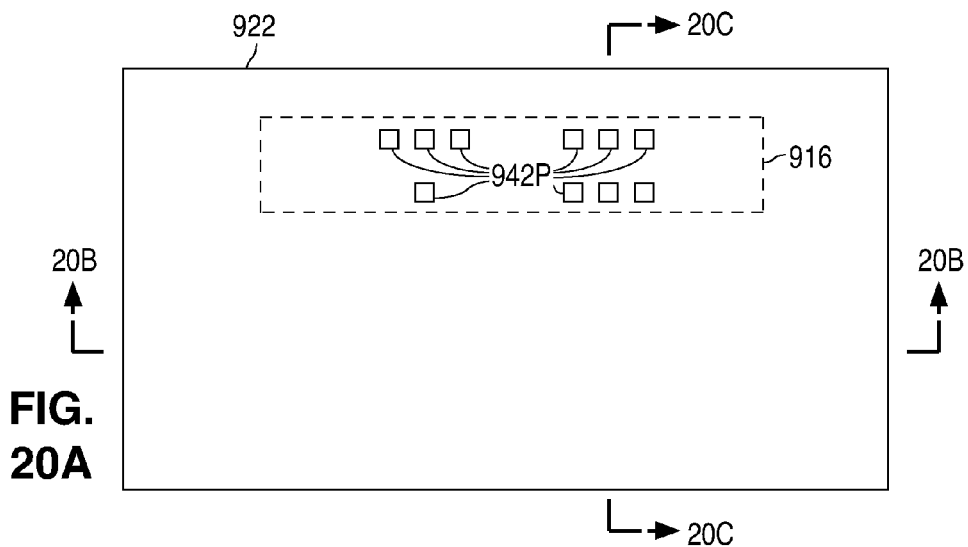
Figure 20B:
Figure 20C:
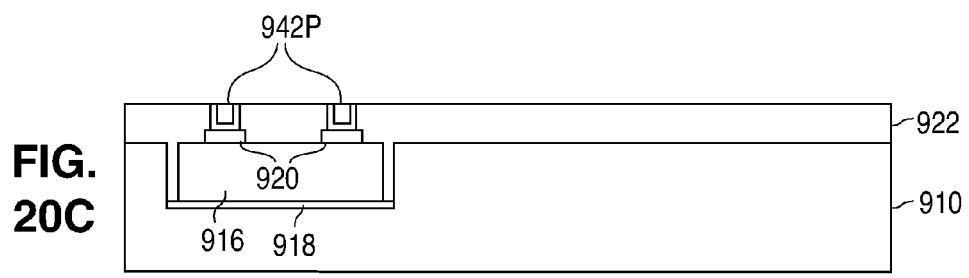

Following this, as shown in FIGS. 20A-20C, metal layer 942 is planarized, such as with chemical-mechanical polishing, to expose the top surface of non-conductive structure 922, and form via plug structures 942P in the openings 922P that make electrical connections to the conductive pads 920 of die 916.

Figure 21A:
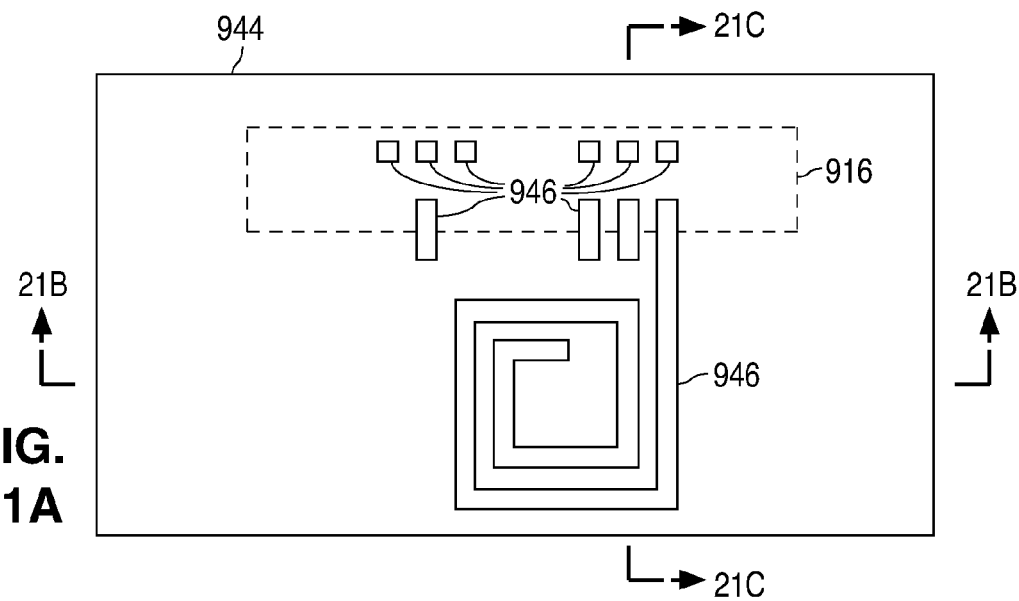
Figure 21B:
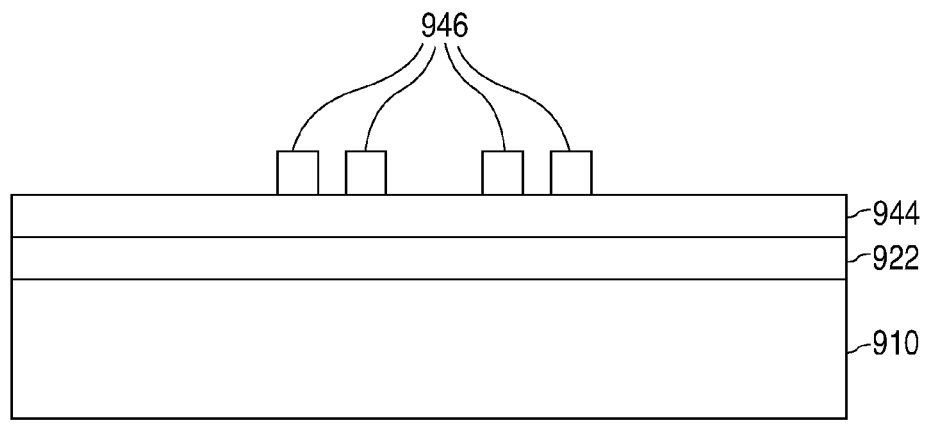
Figure 21C:
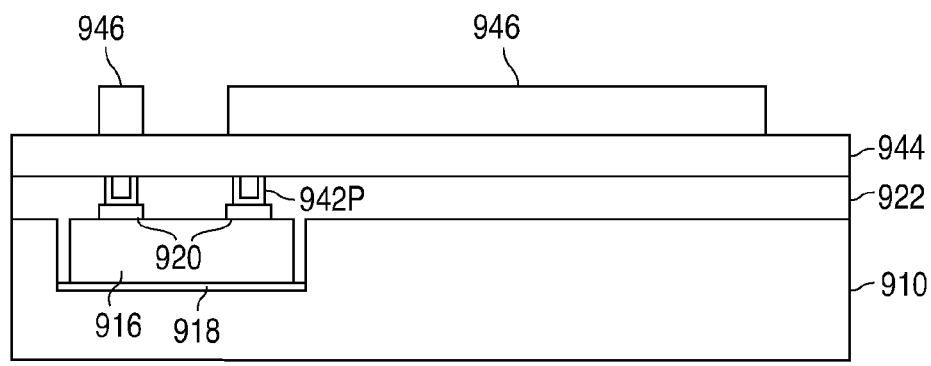

As shown in FIGS. 21A-21C, after the via plug structures 942P have been formed, a metal layer 944, such as aluminum, is sputter deposited onto non-conductive structure 922 to a depth of approximately 5 μm. Alternately, metal layer 944 can include multiple layers of metal such as, for example, a layer of titanium, a layer of titanium nitride, a layer of aluminum copper, a layer of titanium, and a layer of titanium nitride.

Once metal layer 944 has been formed, a patterned photoresist layer 946 approximately 1.0 μm thick is formed on the top surface of metal layer 944 in a conventional manner. Following the formation of patterned photoresist layer 946, metal layer 944 is etched to remove the exposed regions of metal layer 944 and form the metal-1 structures 930.

Metal layer 944 can be etched using a dry etch such as reactive ion etching, or a timed wet etch. For example, aluminum can be wet etched in a 10:1 hydrogen fluoride solution for the necessary period of time. After the etch, the resulting structure is rinsed, and patterned photoresist layer 946 is then removed in a conventional manner, such as with acetone. Once patterned photoresist layer 946 has been removed, the resulting structure is conventionally cleaned to remove organics, such as with a Piranha etch.

Figure 22A:
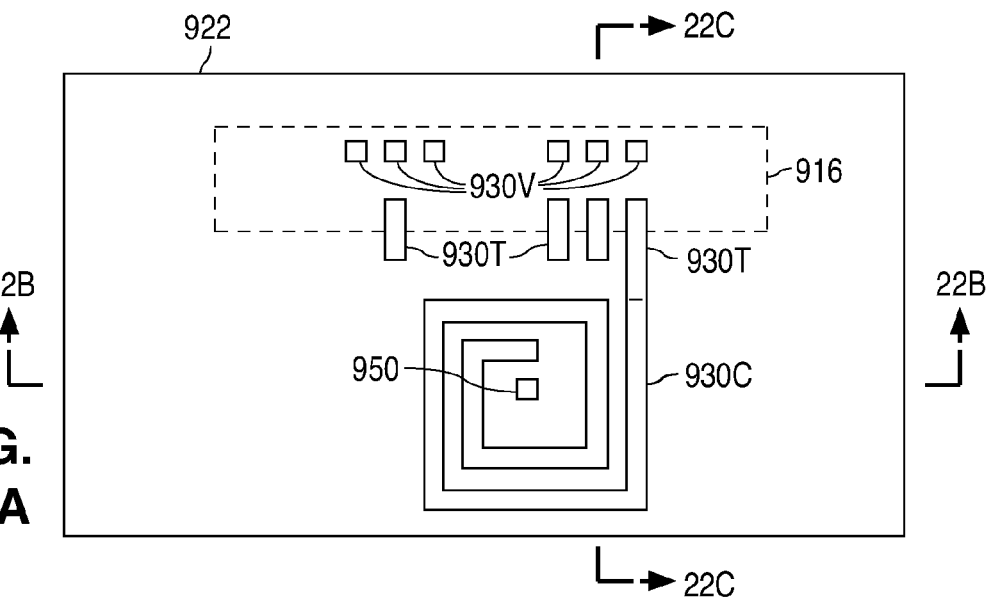
Figure 22B:
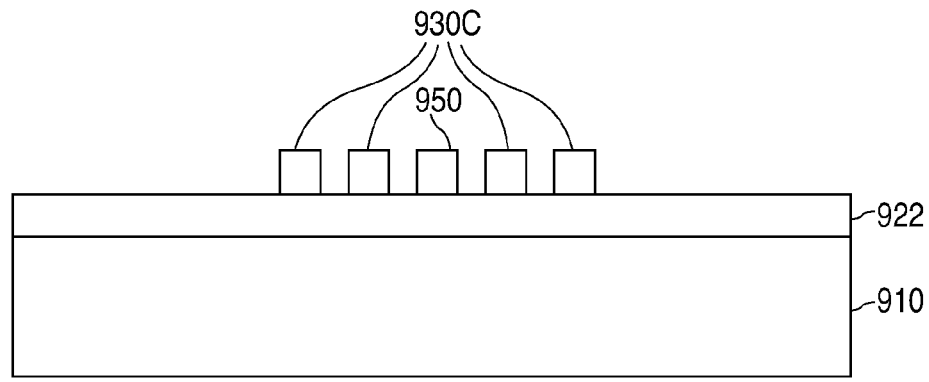
Figure 22C:
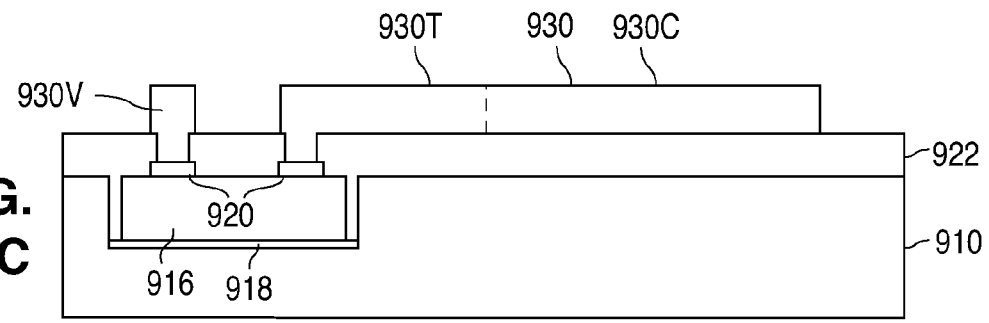

As shown in FIGS. 22A-22C, after the via structures 930V, the via trace structures 930T, and trace structure 930C have been formed, a magnetic core structure 950 is formed on the top surface of non-conductive structure 922. Magnetic core structure 950, in turn, can be formed in a number of ways.

Figure 23A:
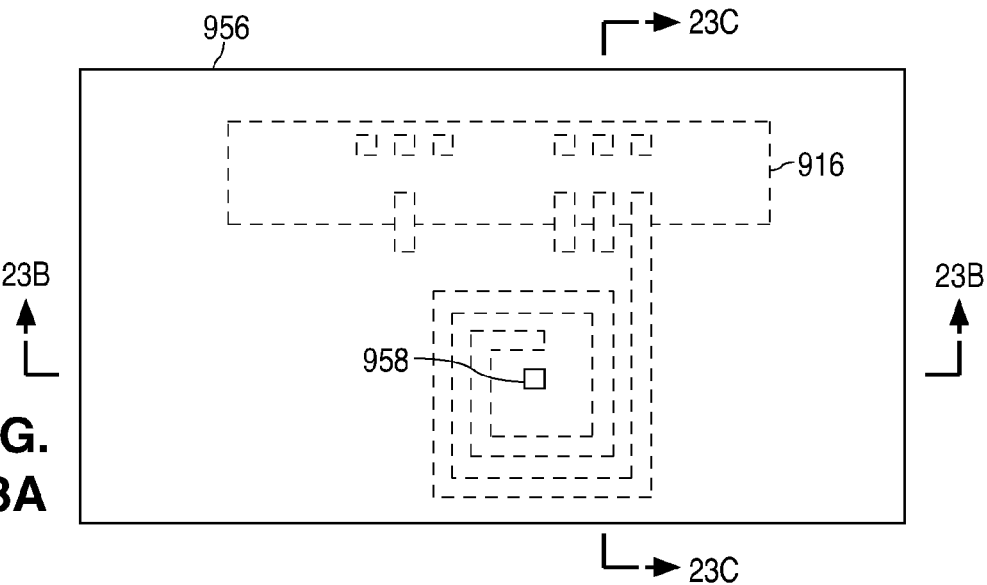
Figure 23B:
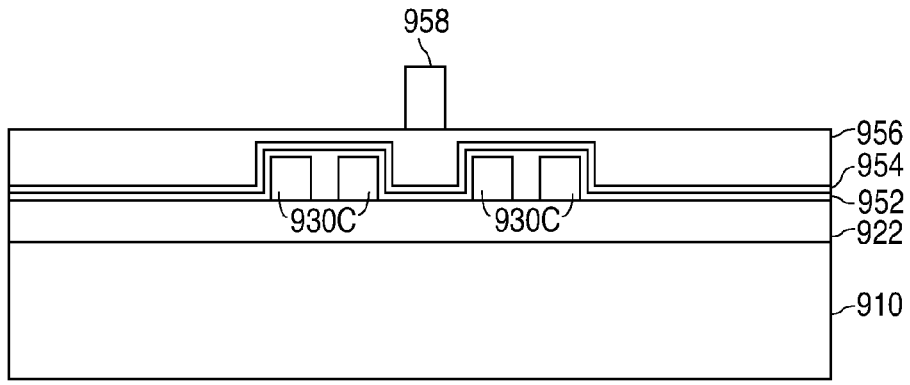
Figure 23C:
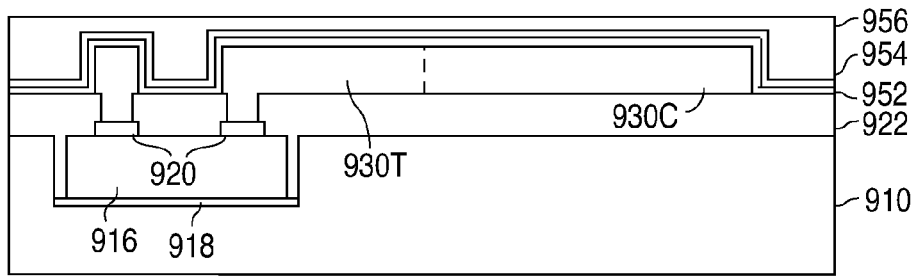

In a first embodiment, as shown in FIGS. 23A-23C, a layer of silicon nitride 952 approximately 0.6 μm thick is deposited on the top surfaces of non-conductive structure 922, the via structures 930V, the via trace structures 930T, and trace structure 930C, followed by the deposition of a seed layer 954 on the top surface of nitride layer 952. For example, seed layer 954 can be implemented with a layer of aluminum copper. Seed layer 954 can alternately be formed by depositing 300 Å of titanium, 3000 Å of copper, and 300 Å of titanium.

After seed layer 954 has been formed, a magnetic material with a high permeability and a low resistance, such as an alloy of nickel and iron like permalloy, is electroplated to a thickness of, for example, 5 μm to form a magnetic material layer 956. Following this, a patterned photoresist layer 958 is formed on magnetic material layer 956.

Figure 24A:
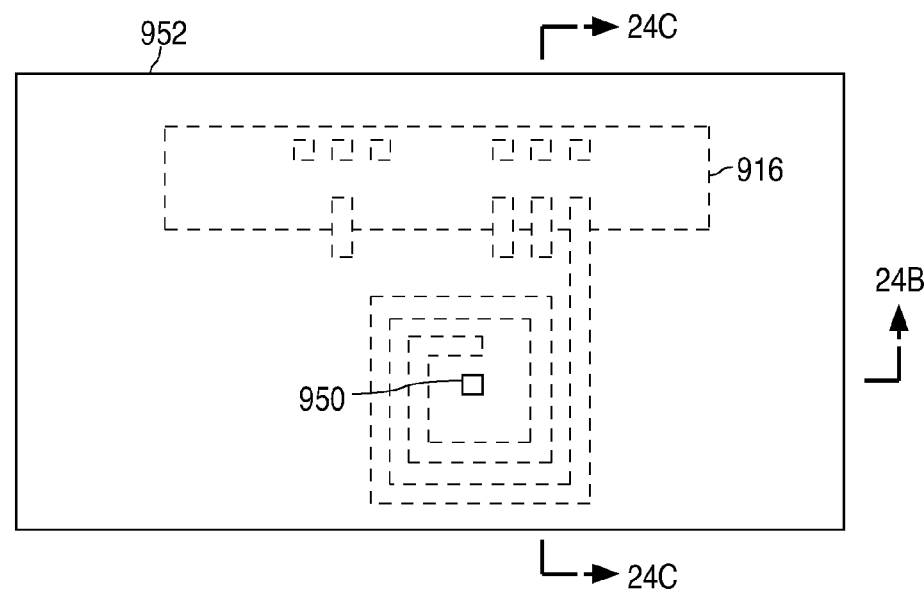
Figure 24B:
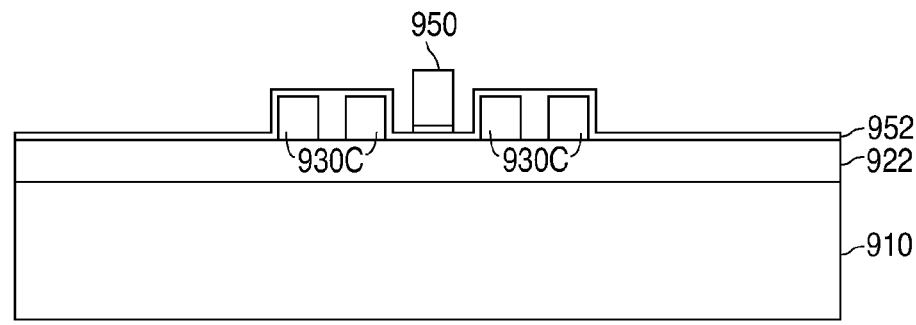
Figure 24C:
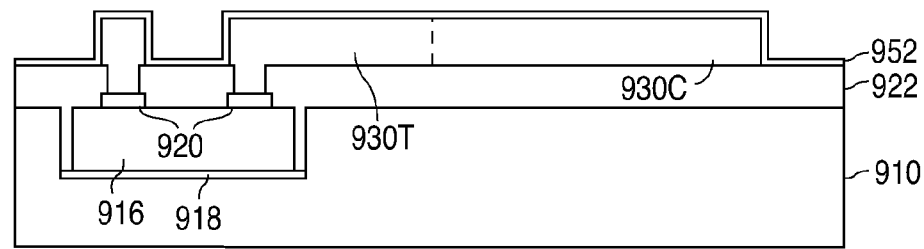

Next, as illustrated in FIGS. 24A-24C, the exposed regions of magnetic material layer 956 and seed layer 954 are etched and removed to form magnetic core structure 950. In this example, nitride layer 952 is left in place, but the exposed regions of nitride layer 952 could alternately be removed. Patterned photoresist layer 958 is then removed in a conventional manner, such as with acetone. Once patterned photoresist layer 958 has been removed, the resulting structure is conventionally cleaned to remove organics. In addition, a plating mold can alternately be used to define the regions where the magnetic material is to be electroplated.

In a second embodiment, as shown in FIGS. 25A-25C, a layer of silicon nitride 960 approximately 0.6 μm thick is deposited on the top surfaces of non-conductive structure 922, the via structures 930V, the via trace structures 930T, and trace structure 930C, followed by the sputter deposition of a magnetic material layer 962 onto the top surface of non-conductive structure 922, the via structures 930V, the via trace structures 930T, and trace structure 930C. Magnetic material layer 962 can be implemented with, for example, cobalt tantalum zirconium (CoTaZr) or permalloy, materials which have a high permeability and a low resistance.

Following this, a patterned photoresist layer 964 is formed on magnetic material layer 962. As shown in FIGS. 26A-26C, after patterned photoresist layer 964 has been formed, the exposed regions of magnetic material layer 962 are etched and removed to form magnetic core structure 950. Patterned photoresist layer 964 is then removed in a conventional manner, such as with acetone. Once patterned photoresist layer 964 has been removed, the resulting structure is conventionally cleaned to remove organics. (The order of forming the metal-1 structures 930 and magnetic core structure 950 can alternately be reversed.)

In the present example, the magnetic material layers 956 and 962 are subjected to the presence of a strong magnetic field that so that the magnetic material layers 956 and 962 are uniaxially anisotropic. The strong magnetic field can be applied during the plating or deposition of the magnetic material. Alternately, the strong magnetic field can be applied during an anneal at elevated temperatures after the plating or deposition of the magnetic material.

Figure 27A:
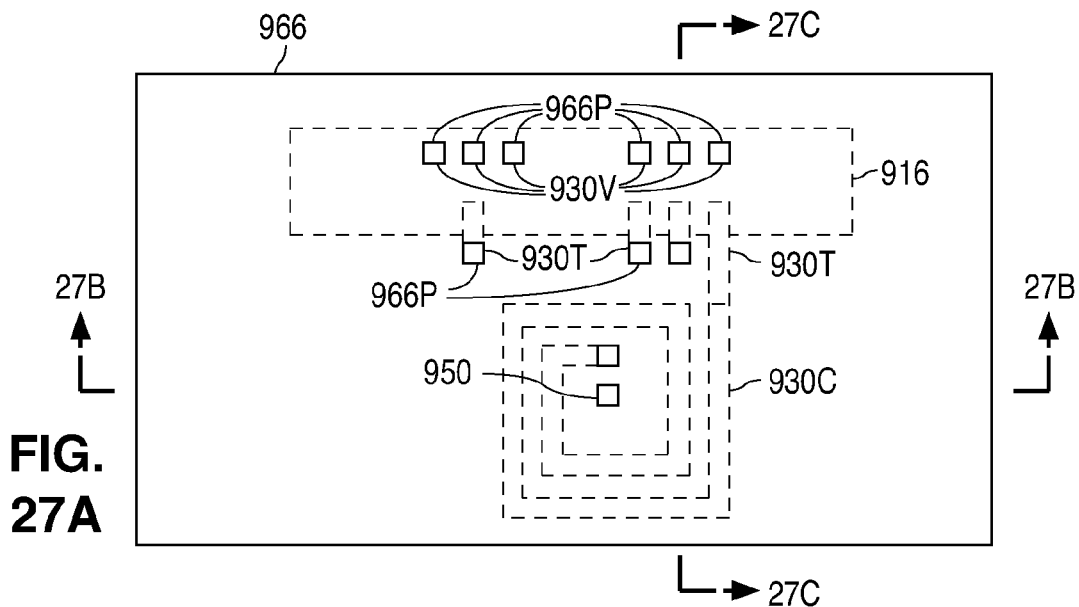
Figure 27B:
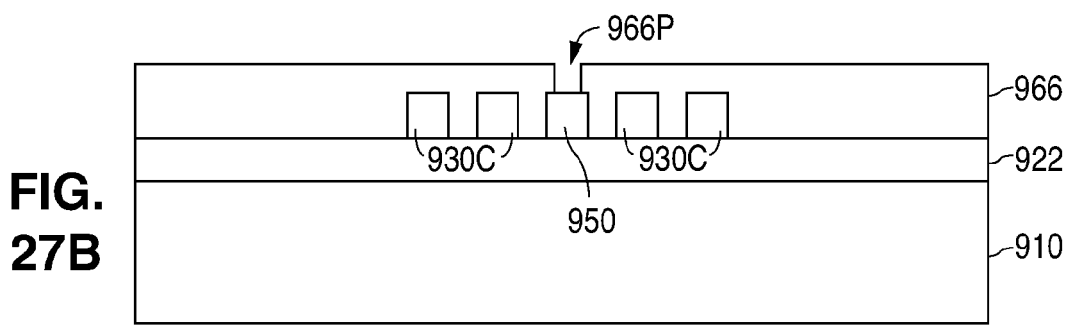
Figure 27C:
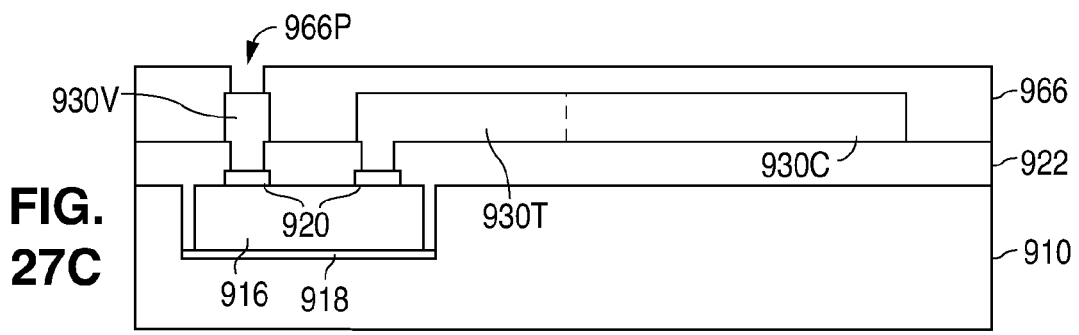

Following the formation of magnetic core structure 950, as shown in FIGS. 27A-27C, a non-conductive structure 966 is formed on non-conductive structure 922, the via structures 930V, the via trace structures 930T, and trace structure 930C. Non-conductive structure 966 has a substantially planar top surface 966T, and a number of openings 966P that expose the via structures 930V, the via trace structures 930T that are to be connected to higher metal levels, the end of trace structure 930C, and magnetic core structure 950. Non-conductive structure 966 can be formed in a number of different ways.

Figure 28A:
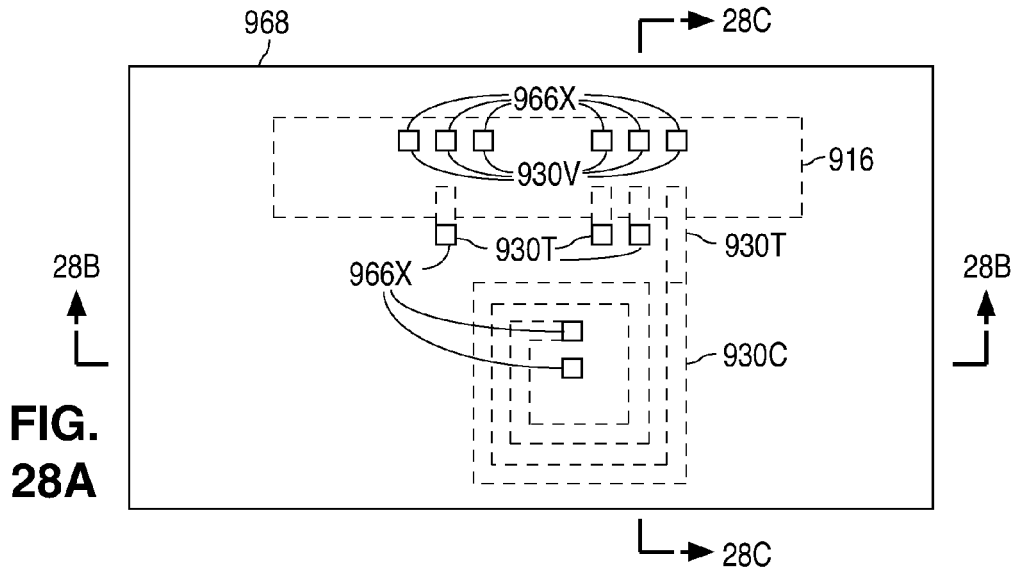
Figure 28B:
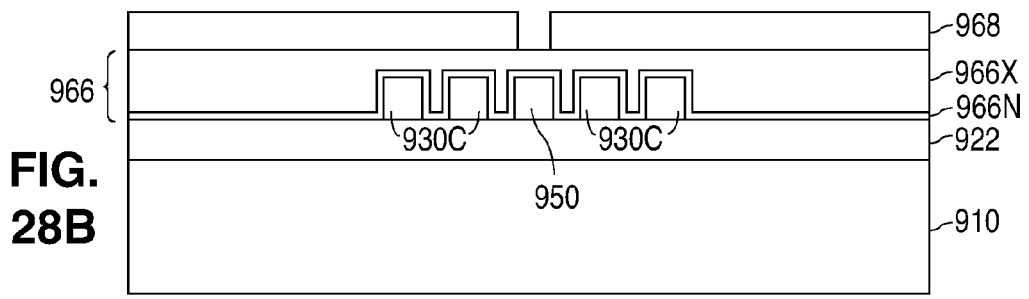
Figure 28C:
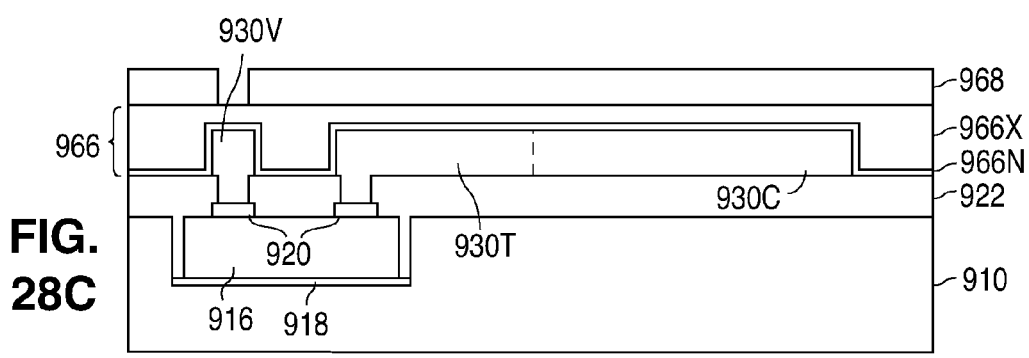

For example, as shown in FIGS. 28A-28C, in a first embodiment, non-conductive structure 966 can be formed by conventionally depositing a silicon nitride layer 966N approximately 0.6 μm thick on non-conductive structure 922, the via structures 930V, the via trace structures 930T, trace structure 930C, and magnetic core structure 950. After this, a layer of silicon dioxide 966X is conventionally formed on the top surface of silicon nitride layer 966N.

Following the formation of oxide layer 966X, oxide layer 966X is planarized in a conventional manner, such as with chemical-mechanical polishing, until oxide layer 966X has a substantially planar top surface. Once oxide layer 966X has been planarized, a hard mask 968 is formed on substantially planar top surface of oxide layer 966X.

Figure 29A:
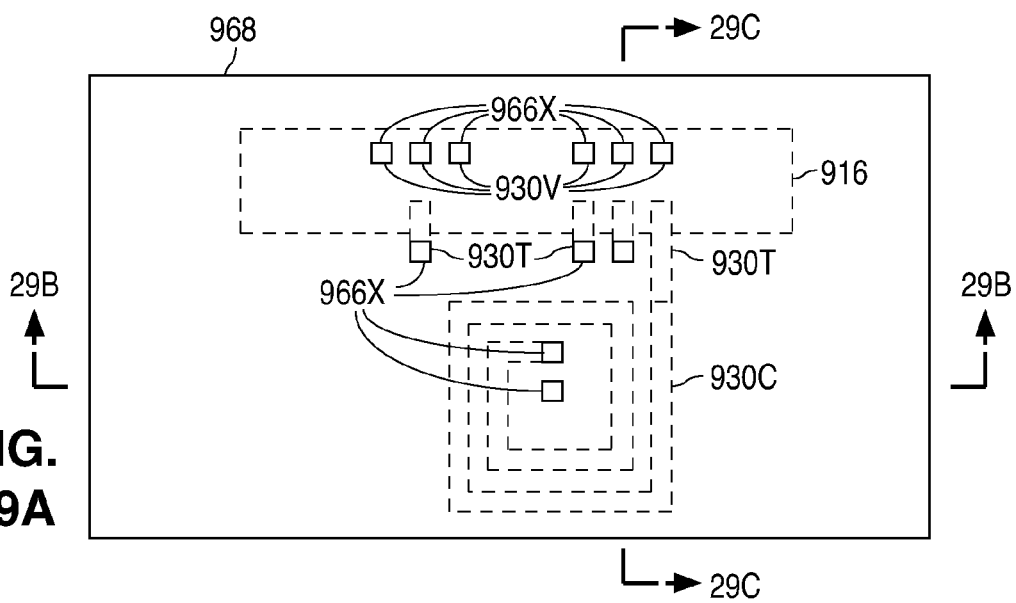
Figure 29B:
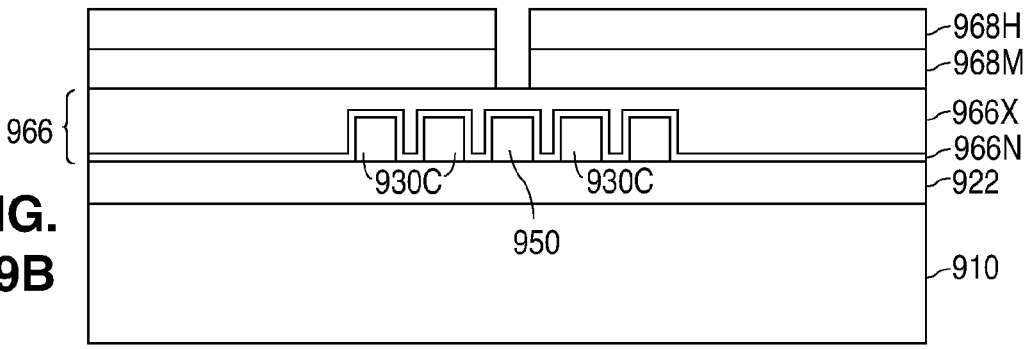
Figure 29C:
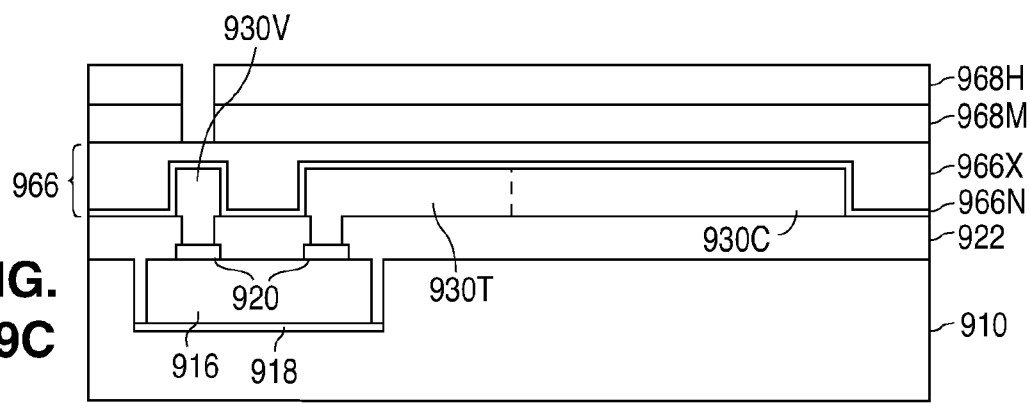

As shown in FIGS. 29A-29C, hard mask 968 can be formed by conventionally depositing a layer of masking material 968M, such as a layer of aluminum, or a layer of oxide with an overlying layer of nitride, followed by the conventional formation of a patterned photoresist layer 968H. After this, the exposed regions of masking material 968M are etched to form the openings in hard mask 968. Patterned photoresist layer 968H is then removed in a conventional manner to complete the formation of hard mask 968.

Figure 30A:
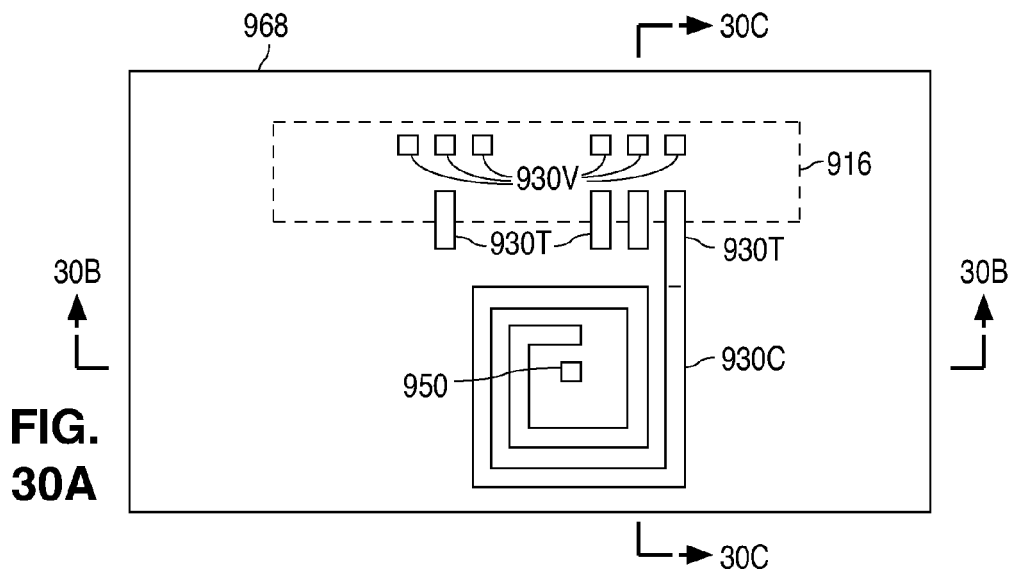
Figure 30B:
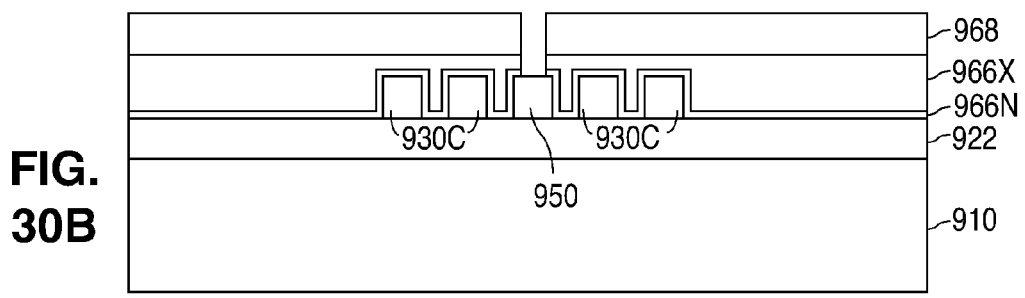
Figure 30C:
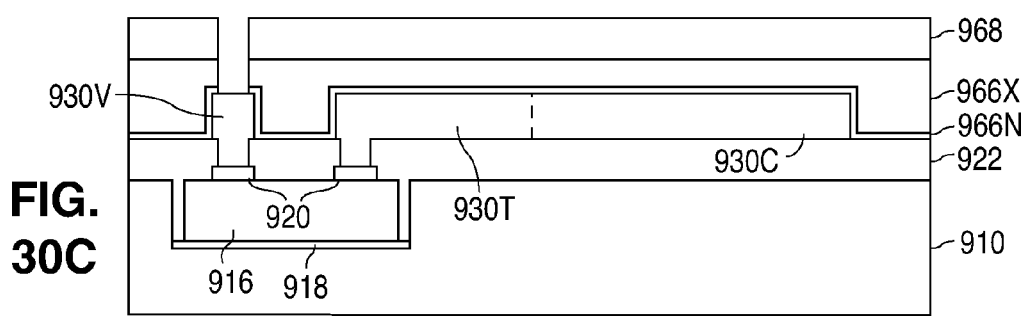

After hard mask 968 has been formed, as shown in FIGS. 30A-30C, the exposed regions of oxide layer 966X and nitride layer 966N are etched away to form the openings 966P that exposes the via structures 930V, the via trace structures 930T that are to be connected to higher metal levels, an end of trace structure 930C, and magnetic core structure 950. After the via structures 930V, the via trace structures 930T that are to be connected to higher metal levels, an end of trace structure 930C, and magnetic core structure 950 have been exposed, hard mask 968 is removed in a conventional manner to form non-conductive structure 966. Alternately, depending on the thickness of the dielectric to be etched, a thick patterned photoresist layer can be used in lieu of hard mask 968.

When the metal-1 structures 930 are formed as in the first embodiment (electroplated), nitride layer 926 and nitride layer 966N surround the copper structures and prevent copper diffusion. Alternately, when the metal-1 structures 930 are formed as in the second embodiment (metal deposition, mask, and etch), silicon nitride layers 926 and 966N can be omitted when a copper diffusion barrier is not required.

Figure 31A:
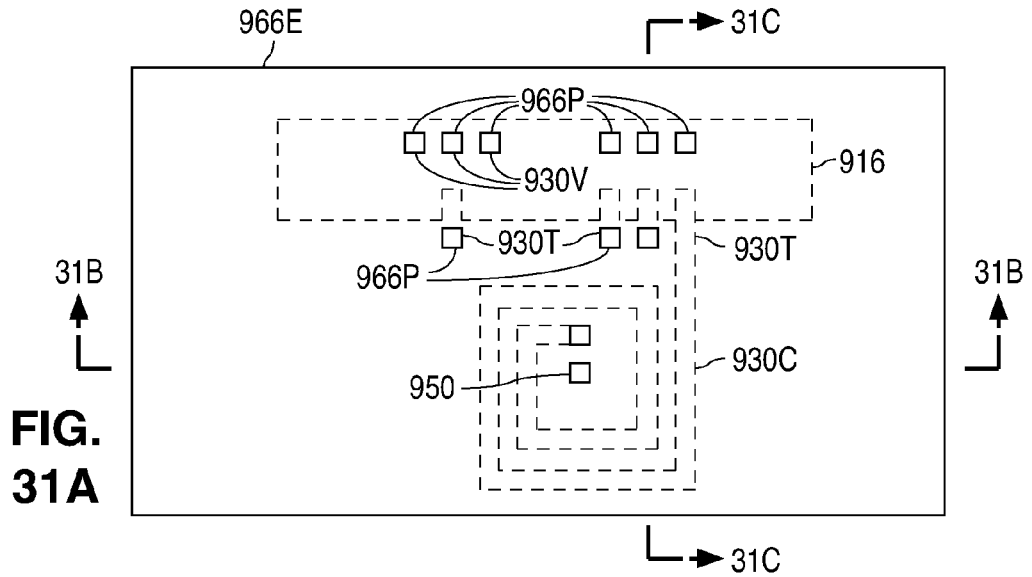
Figure 31B:
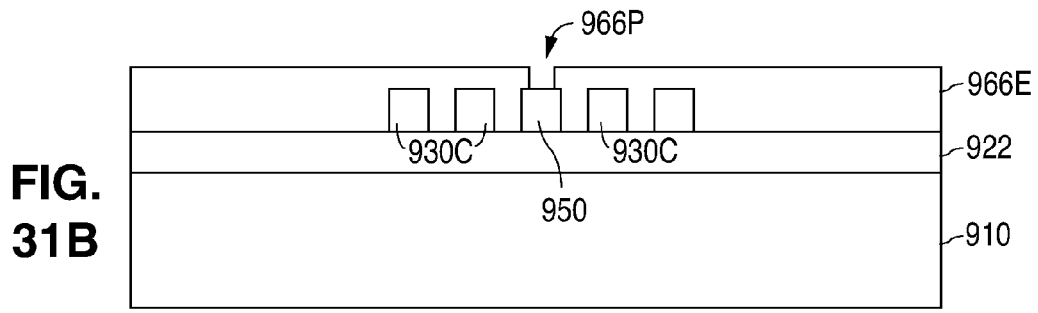
Figure 31C:
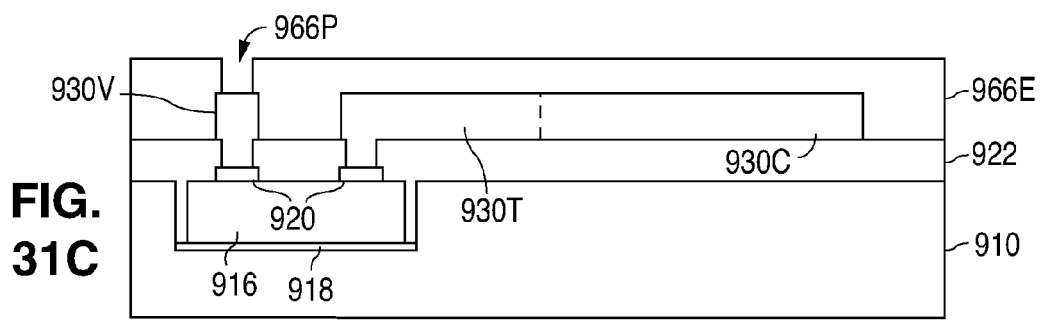

Alternately, as shown in FIGS. 31A-31C, non-conductive structure 966 can be formed by depositing a layer of photoimageable epoxy or polymer 966E on non-conductive structure 922. The photoimageable epoxy or polymer layer 966E can be implemented with, for example, SU-8, benzocyclobutene (BCB), or polybenzoxazole (PBO), which are substantially self planarizing.

Once photoimageable epoxy or polymer layer 966E has been deposited, the openings 966P are formed in photoimageable epoxy or polymer layer 966E by projecting a light through a mask to form a patterned image on layer 966E that softens the regions of layer 966E that are exposed by the light, and then removing the softened regions of layer 966E.

Figure 32A:
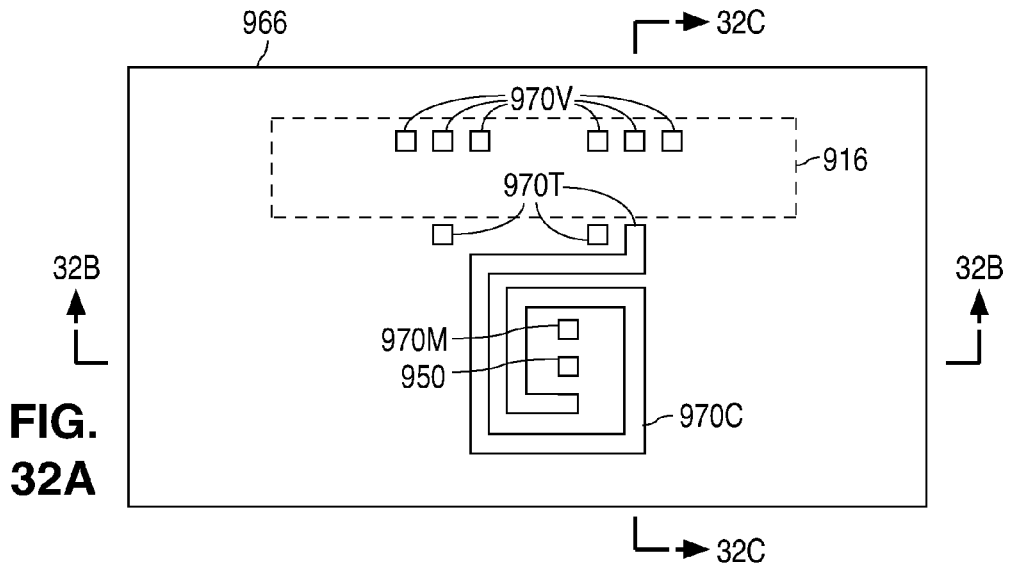
Figure 32B:
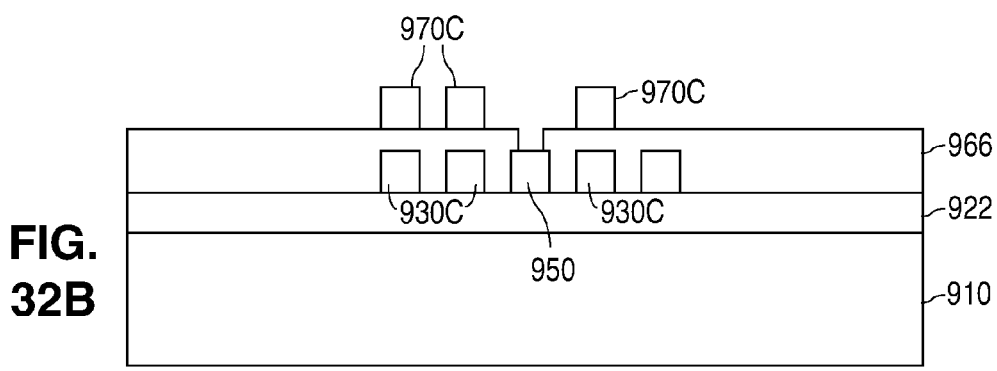
Figure 32C:
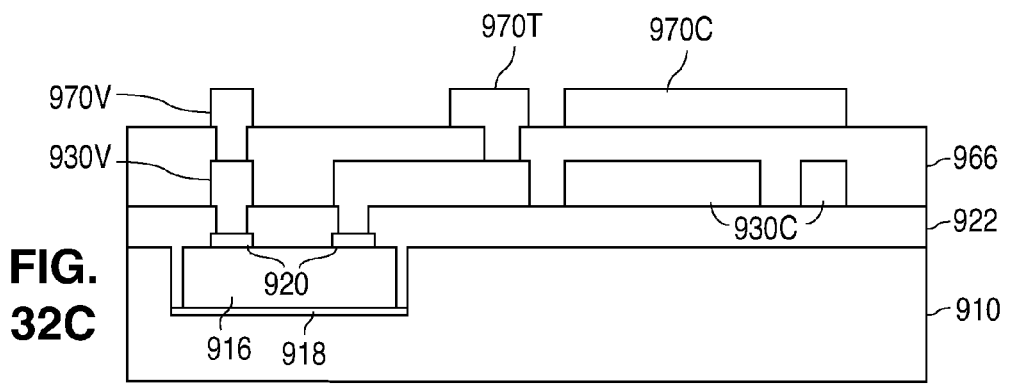

As shown in FIGS. 32A-32C, after non-conductive structure 966 has been formed, a number of metal-2 structures 970 are formed to touch non-conductive structure 966. The metal-2 structures 970 include a number of via structures 970V that touch the via structures 930V, a number of via trace structures 970T, a vertical member 970M that touches the end of trace structure 930C, and a trace structure 970C with a number of loops. The metal-2 structures can be formed in the same way that the metal-1 structures 930 are formed.

Figure 33A:
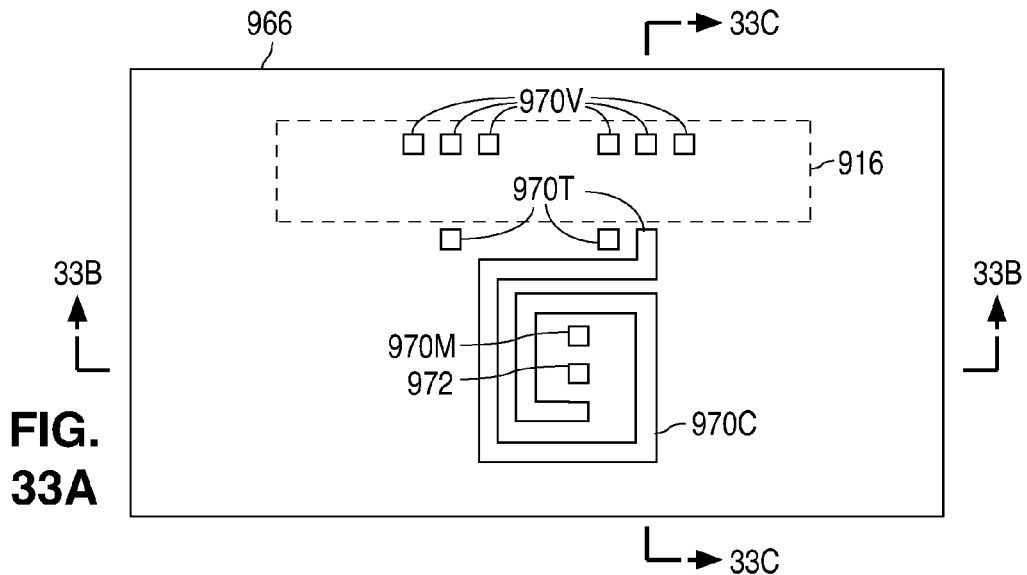
Figure 33B:
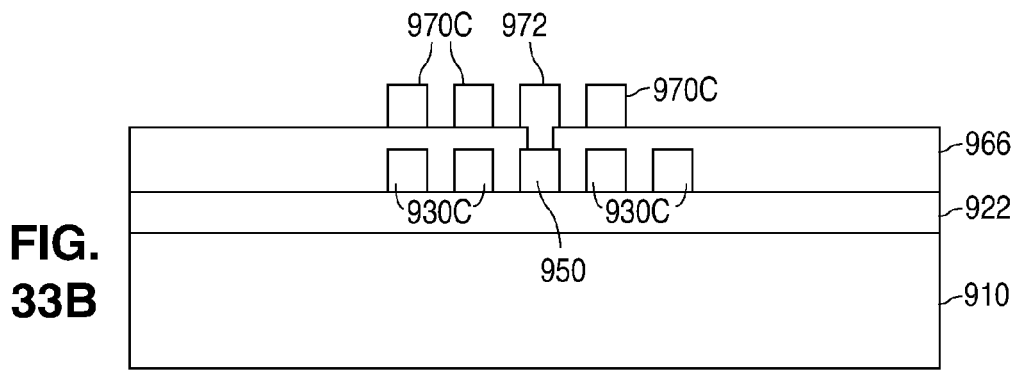
Figure 33C:
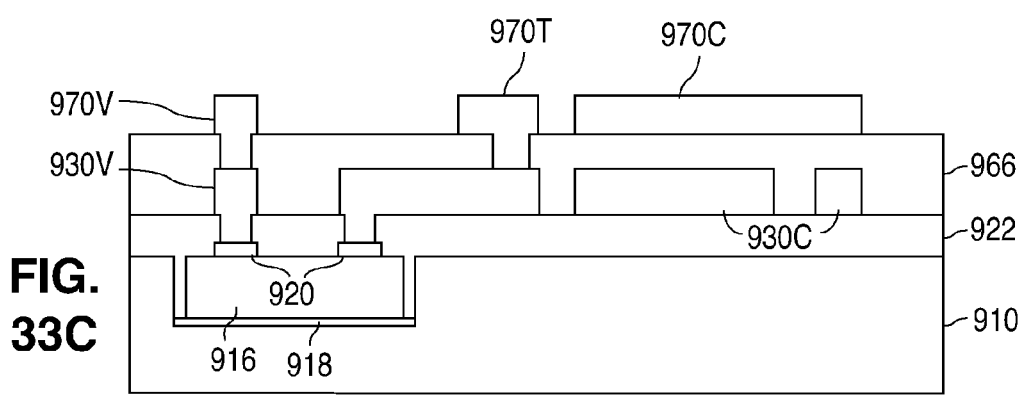

Following the formation of the metal-2 structures 970, as shown in FIGS. 33A-33C, a magnetic core structure 972 is formed on the top surface of non-conductive structure 966 to touch magnetic core structure 950. Magnetic core structure 972 can be formed in the same way that magnetic core structure 950 is formed.

Figure 34A:
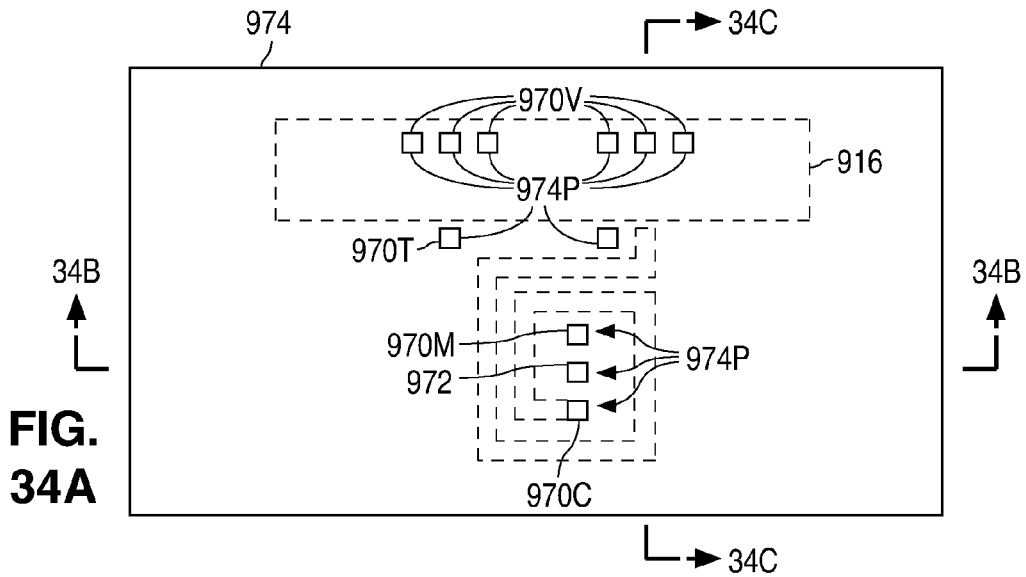
Figure 34B:
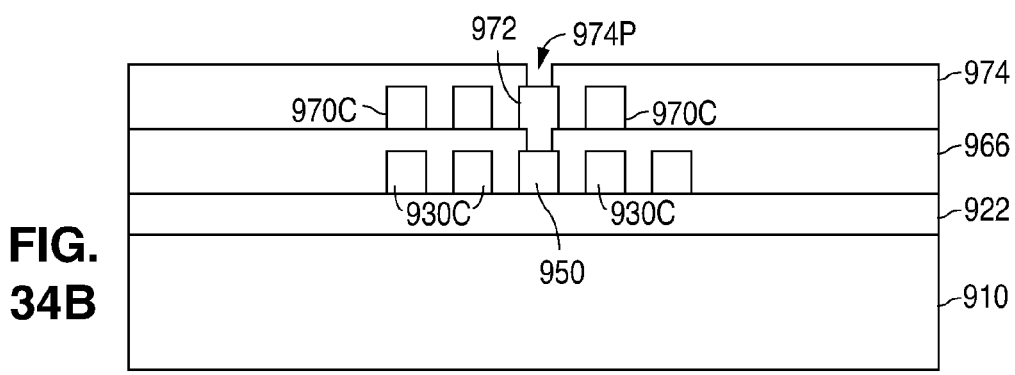
Figure 34C:
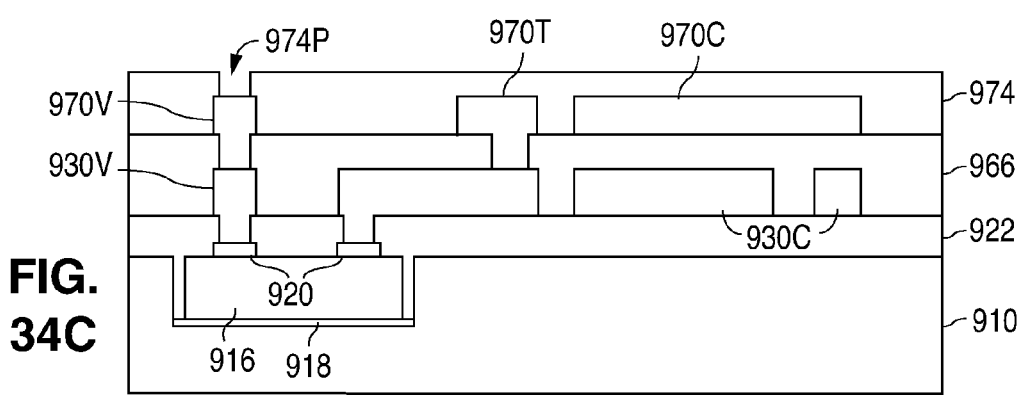

Next, as shown in FIGS. 34A-34C, a non-conductive structure 974 is formed on non-conductive structure 966, the via structures 970V, the via trace structures 970T, vertical member 970M, trace structure 970C, and magnetic core structure 972. Non-conductive structure 974 has a substantially planar top surface 974T, and a number of openings 974P that expose the via structures 970V, the via trace structures 970T that are to be connected to higher metal levels, an end of trace structure 930C, and magnetic core structure 972. Non-conductive structure 974 can be formed in the same way that non-conductive structure 966 is formed.

Figure 35A:
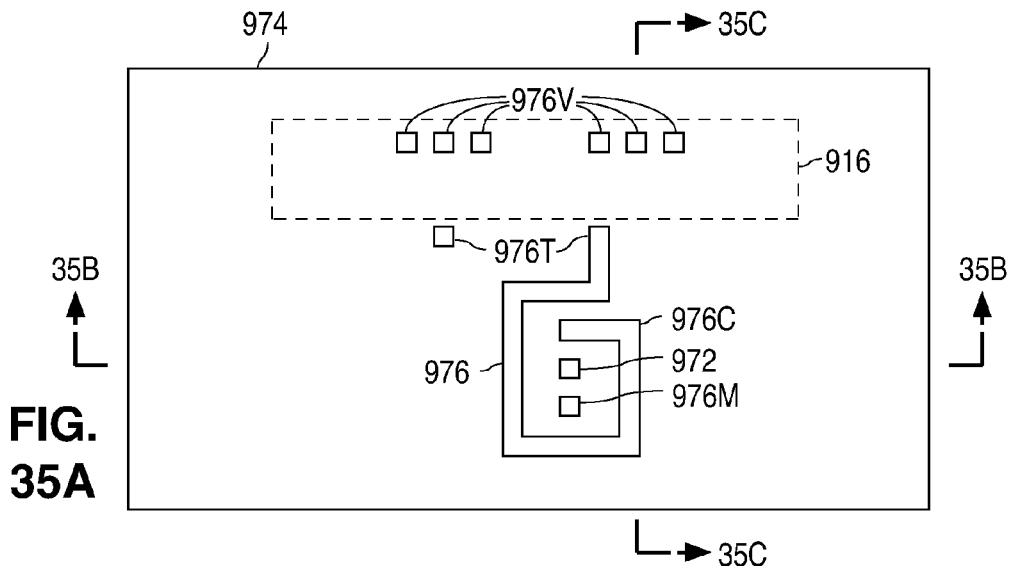
Figure 35B:
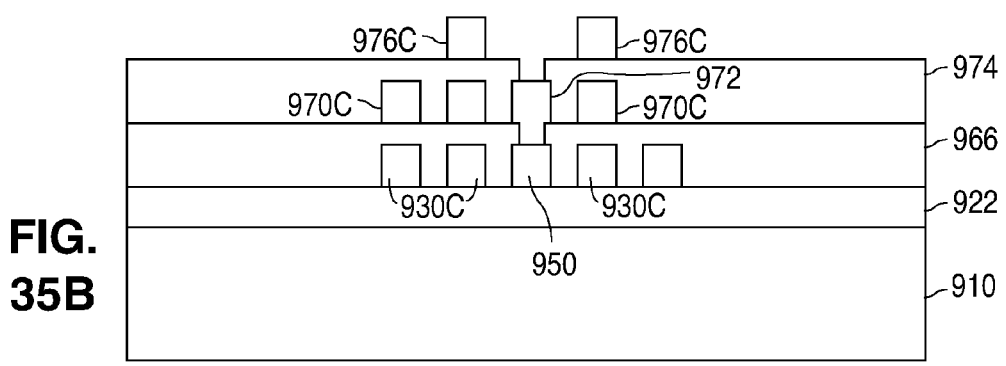
Figure 35C:
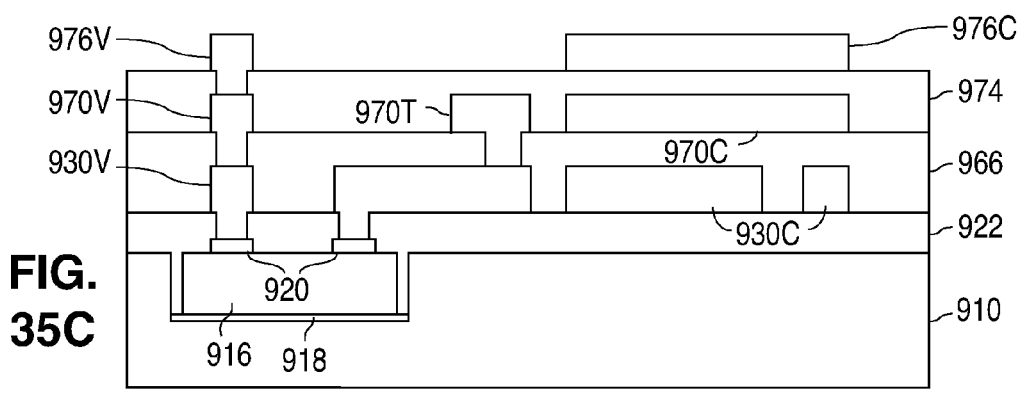

As shown in FIGS. 35A-35C, after non-conductive structure 974 has been formed, a number of metal-3 structures 976 are formed to touch non-conductive structure 974. The metal-3 structures 976 include a number of via structures 976V that touch the via structures 970V, a number of via trace structures 976T, a vertical member 976M that touches the end of trace structure 970C, and a trace structure 976C with a number of loops and an end that touches vertical member 970M. The metal-3 structures 976 can be formed in the same way that the metal-1 structures 930 are formed.

Figure 36A:
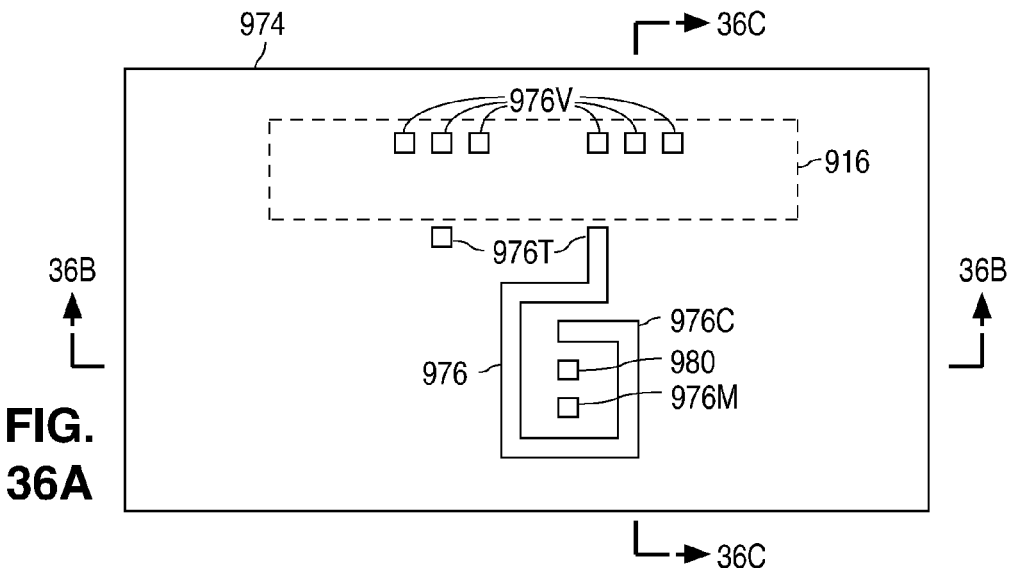
Figure 36B:
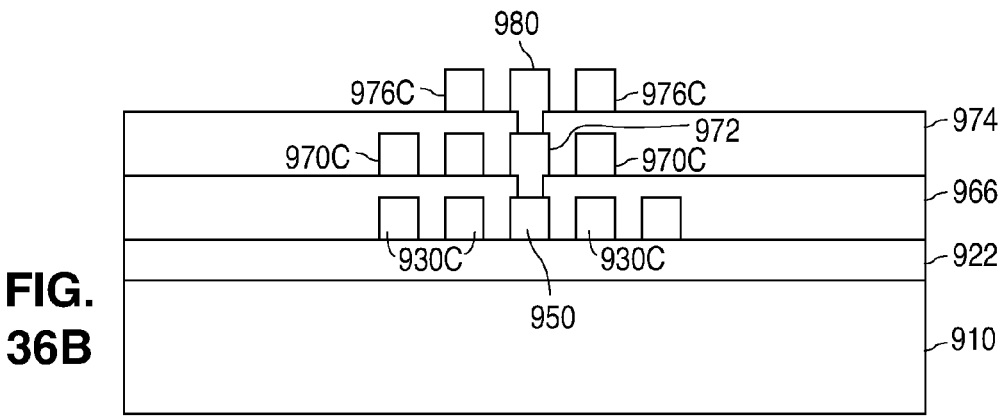
Figure 36C:
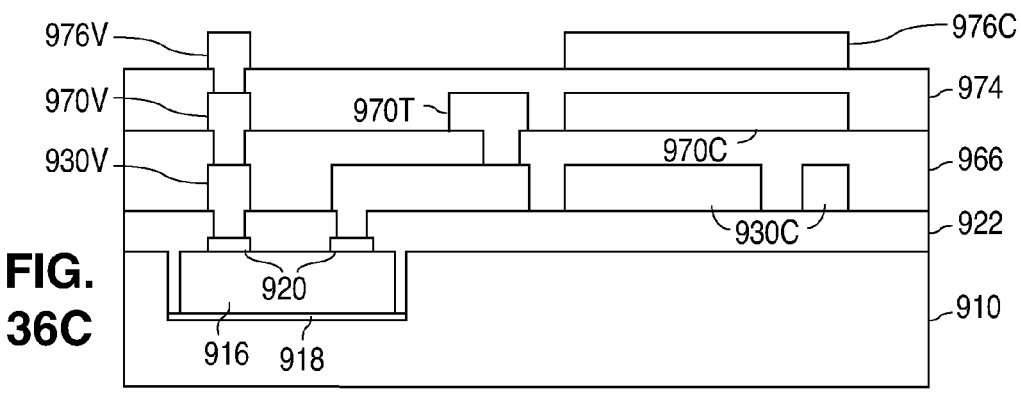

Following the formation of the metal-3 structures 976, as shown in FIGS. 36A-36C, a magnetic core structure 980 is formed on the top surface of non-conductive structure 974 to touch magnetic core structure 972. Magnetic core structure 980 can be formed in the same way that the magnetic core structure 950 is formed.

Figure 37A:
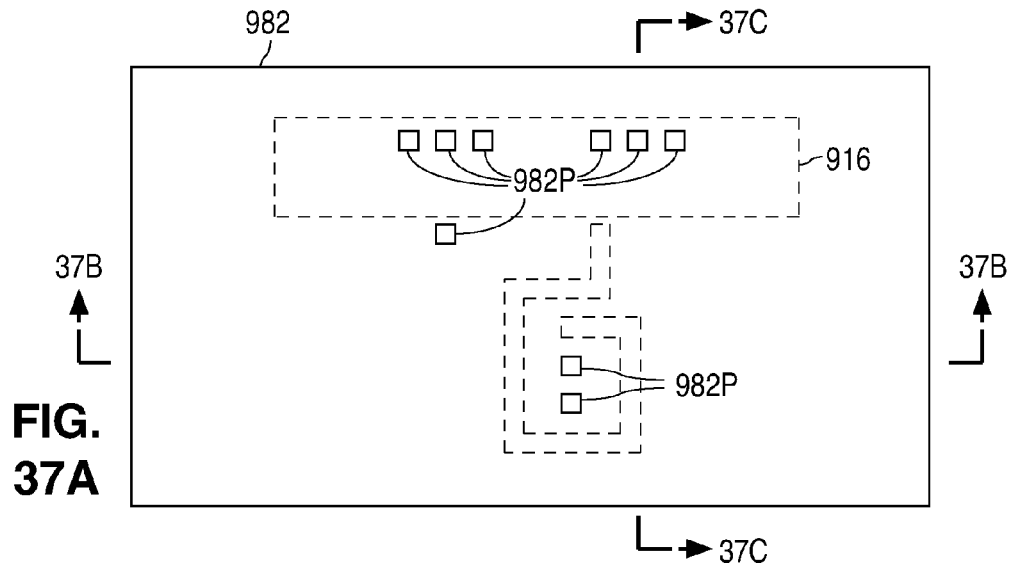
Figure 37B:
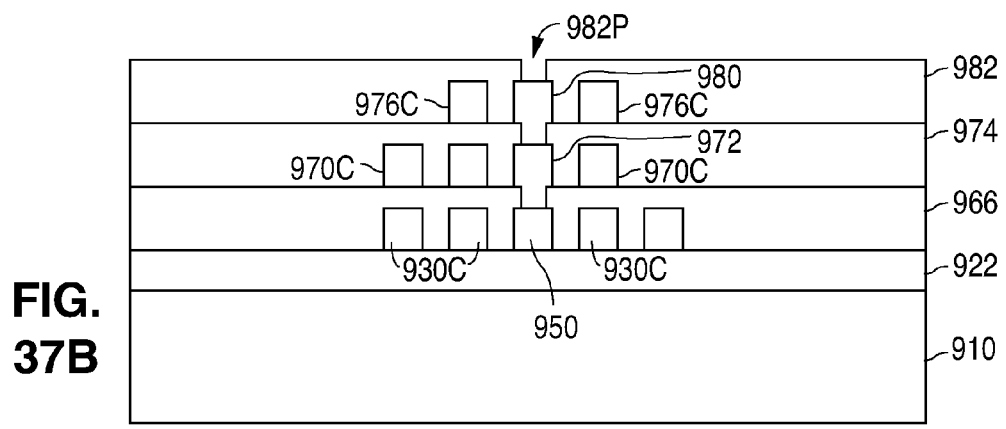
Figure 37C:
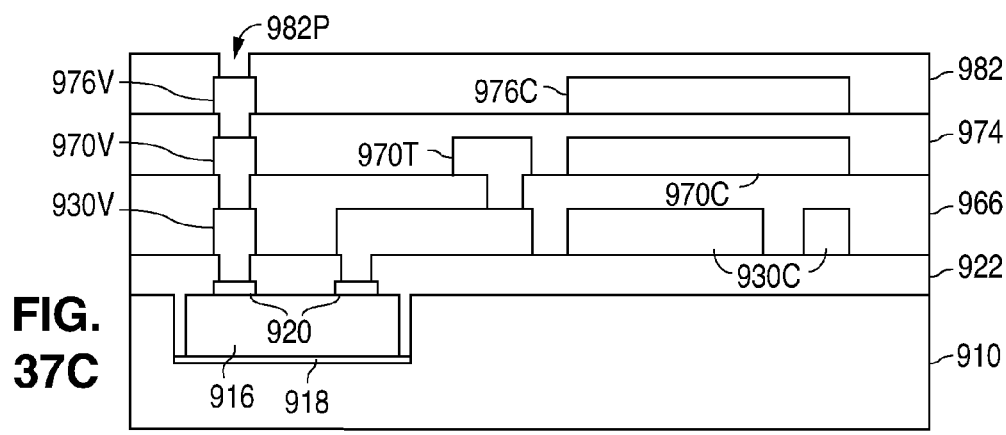

Next, as shown in FIGS. 37A-37C, a non-conductive structure 982 is formed on non-conductive structure 974, the via structures 976V, the via trace structures 976T, vertical member 976M, trace structure 976C, and magnetic core structure 980. Non-conductive structure 982 has a substantially planar top surface 982T, and a number of openings 982P that expose the via structures 976V, the via trace structures 976T that are to be connected to higher metal levels, an end of trace structure 976C, and magnetic core structure 980. Non-conductive structure 982 can be formed in the same way that non-conductive structure 966 is formed.

Figure 38A:
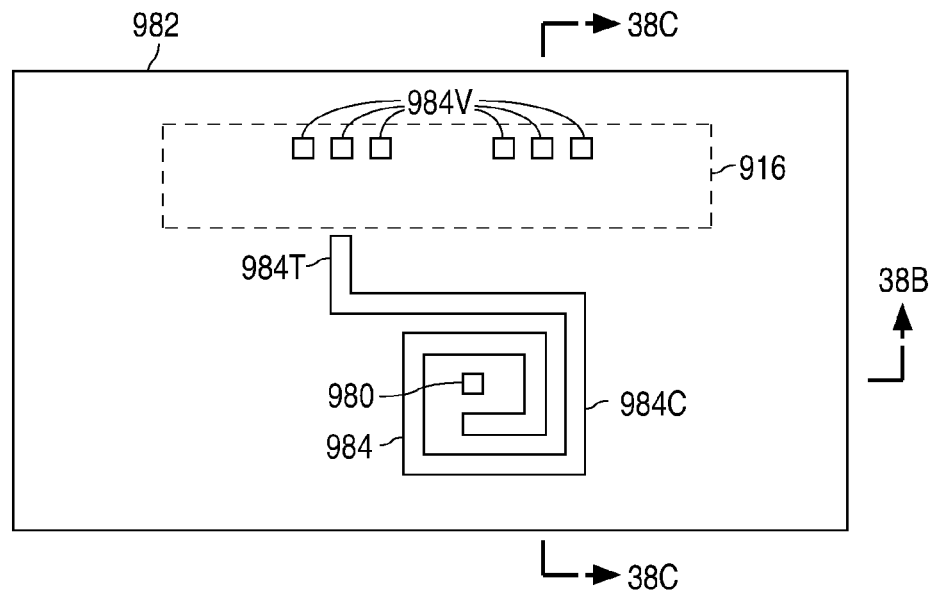
Figure 38B:
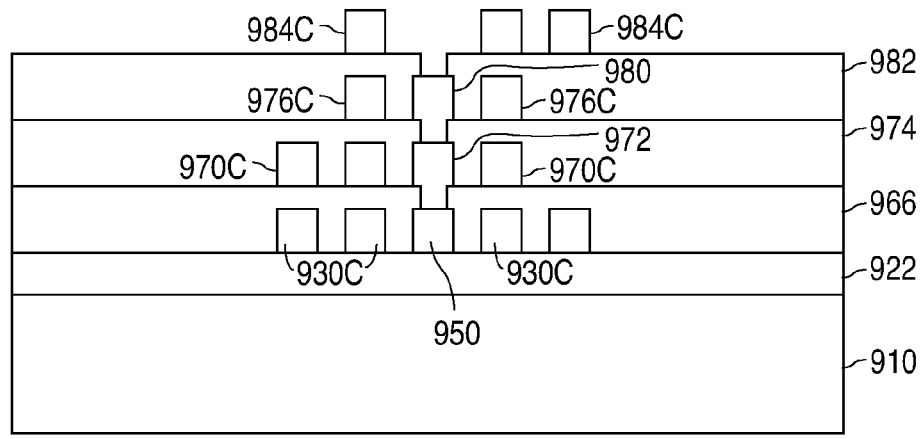
Figure 38C:
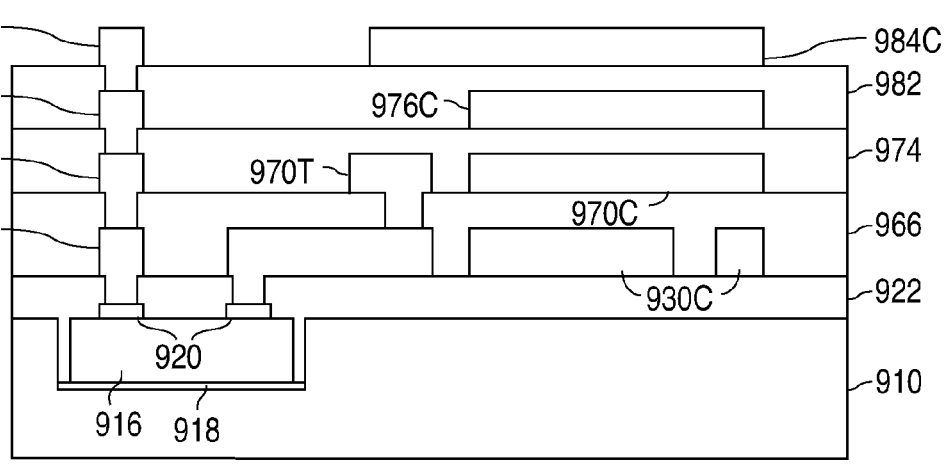

As shown in FIGS. 38A-38C, after non-conductive structure 982 has been formed, a number of metal-4 structures 984 are formed to touch non-conductive structure 982. The metal-4 structures 984 include a number of via structures 984V that touch the via structures 976V, a via trace structure 984T, and a trace structure 984C with a number of loops and an end that touches vertical member 976M. The metal-4 structures 984 can be formed in the same way that the metal-1 structures 930 are formed.

Figure 39A:
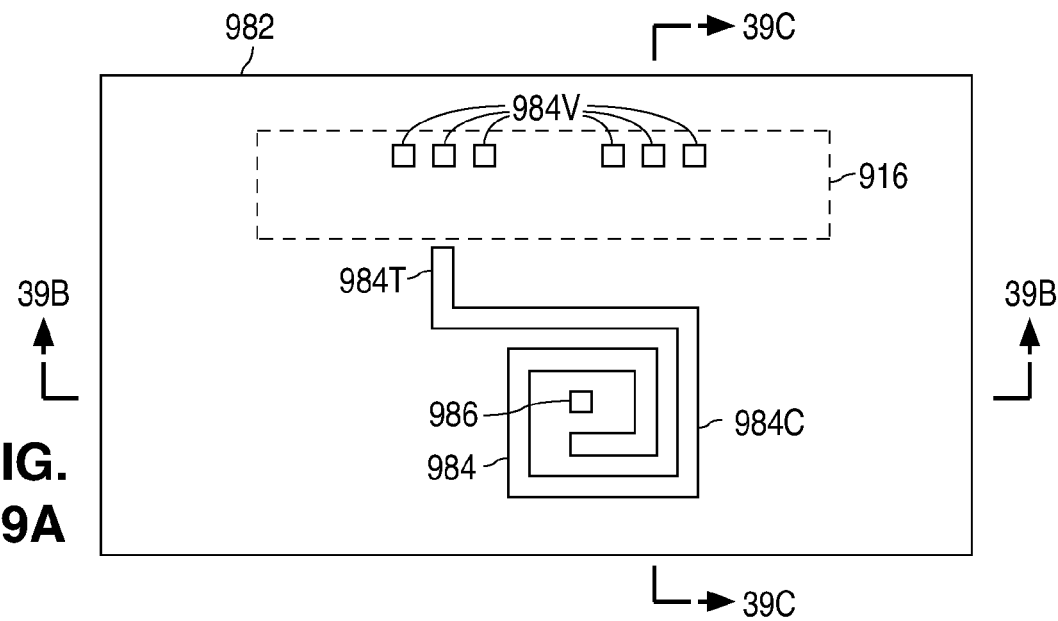
Figure 39B:
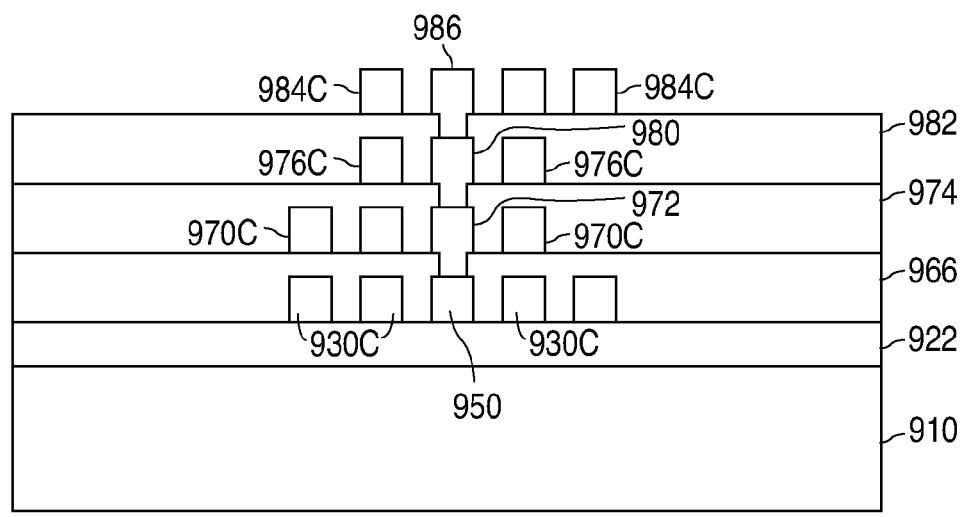
Figure 39C:
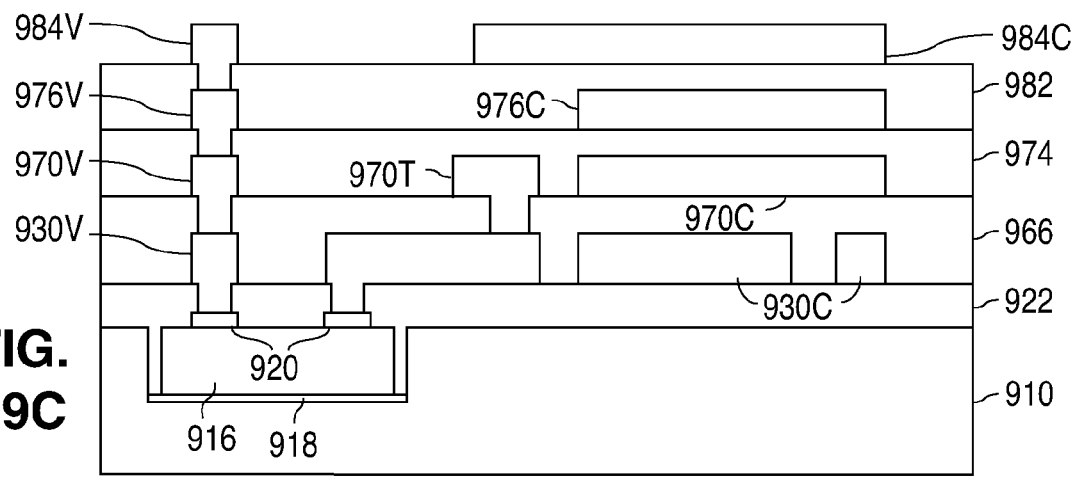

Following the formation of the metal-4 structures 984, as shown in FIGS. 39A-39C, a magnetic core structure 986 is formed on the top surface of non-conductive structure 982 to touch magnetic core structure 980. Magnetic core structure 986 can be formed in the same way that the magnetic core structure 950 is formed.

Figure 40A:
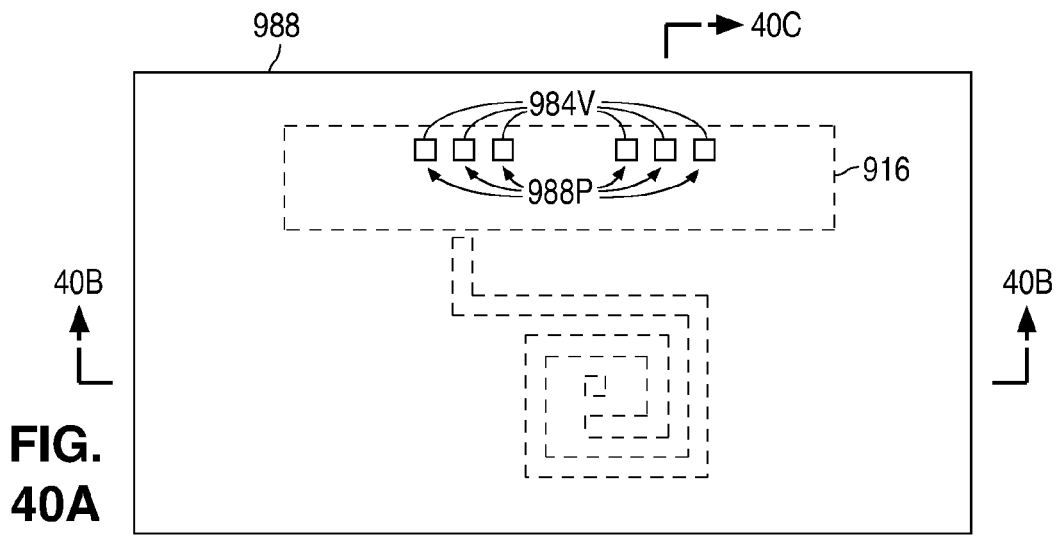
Figure 40B:
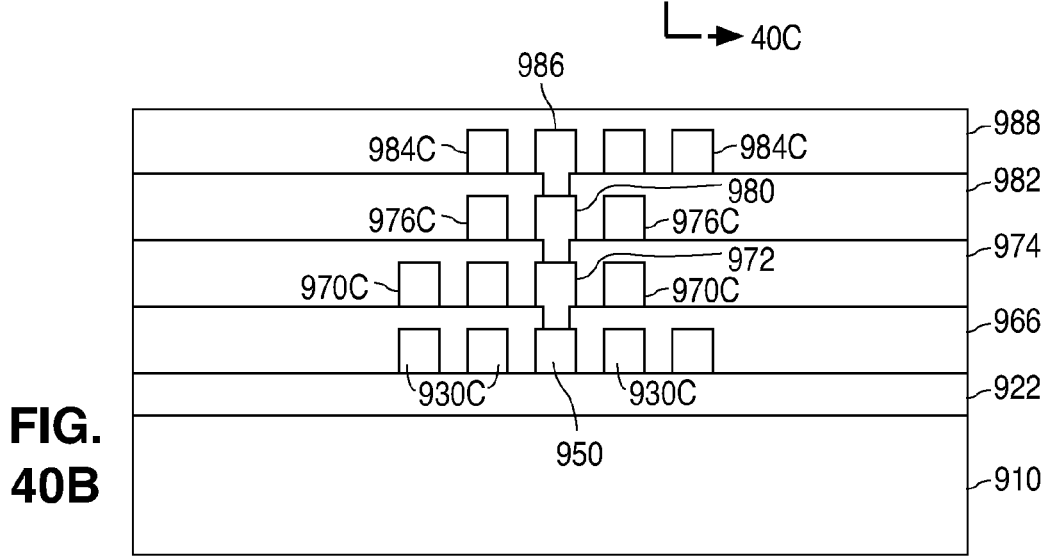
Figure 40C:
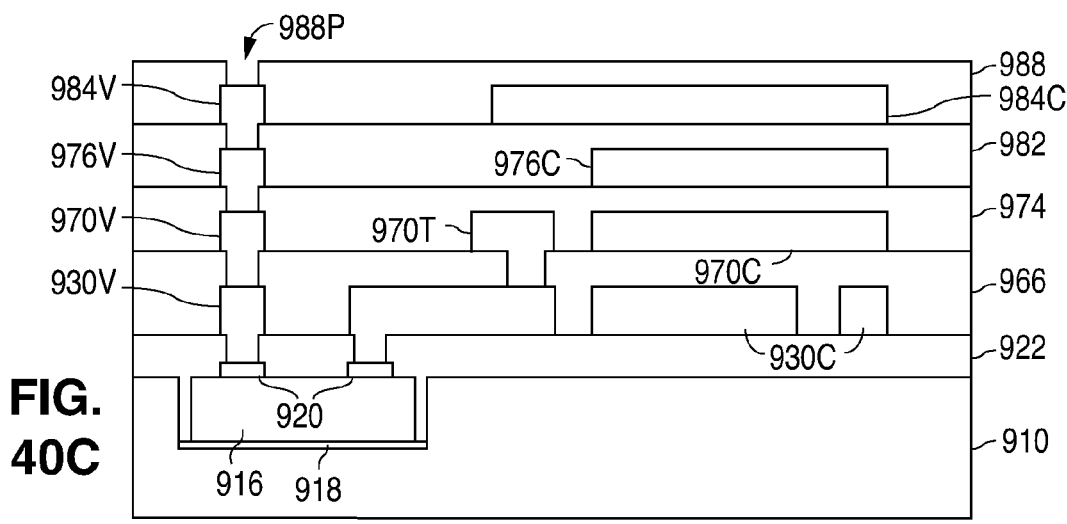

Next, as shown in FIGS. 40A-40C, a non-conductive structure 988 is formed on non-conductive structure 982, the via structures 984V, the via trace structures 984T, trace structure 984C, and magnetic core structure 986. Non-conductive structure 988 has a substantially planar top surface 988T, and a number of openings 988P that expose the via structures 988V. Non-conductive structure 988 can be formed in the same way that non-conductive structure 966 is formed.

As shown in FIGS. 41A-41C, after non-conductive structure 988 has been formed, a number of bond pad structures 990 are formed to touch the via structures 984V and non-conductive structure 988. The bond pad structures 990 can be formed by depositing a layer of metal, such as aluminum, and then masking and etching the layer of metal to leave the bond pad structures 990.

Figure 42A:
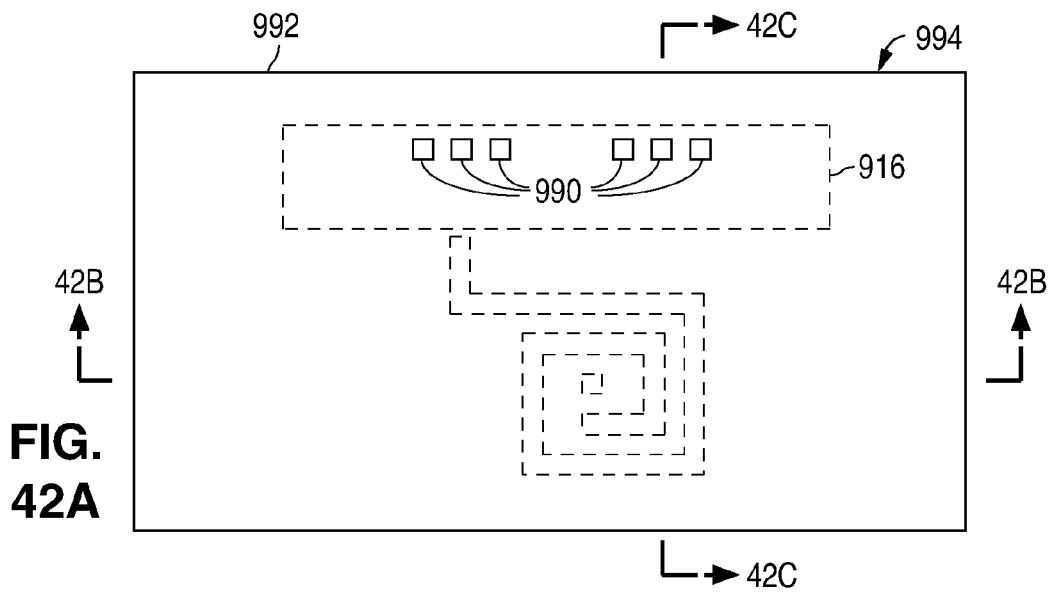
Figure 42B:
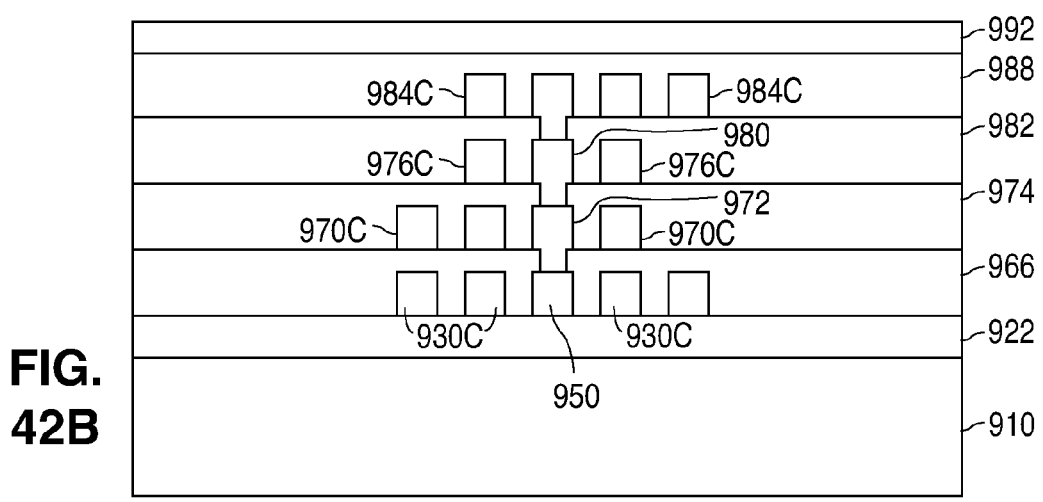
Figure 42C:
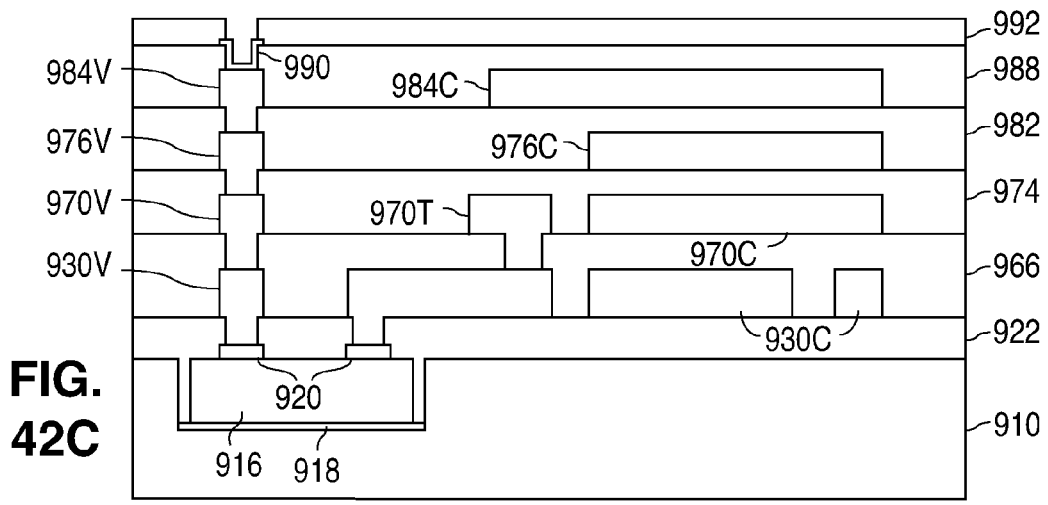

Following the formation of the bond pad structures 990, as shown in FIGS. 42A-42C, a passivation structure 992 is formed to touch non-conductive structure 988 and the bond pad structures 990, and complete the formation of a z-axis semiconductor fluxgate magnetometer 994. Passivation structure 992 has a substantially planar top surface 992T, and a number of openings 992P that expose the bond pad structures 990. Passivation structure 992 can be implemented with, for example, a layer of oxide and an overlying layer of nitride.

Figure 43E:
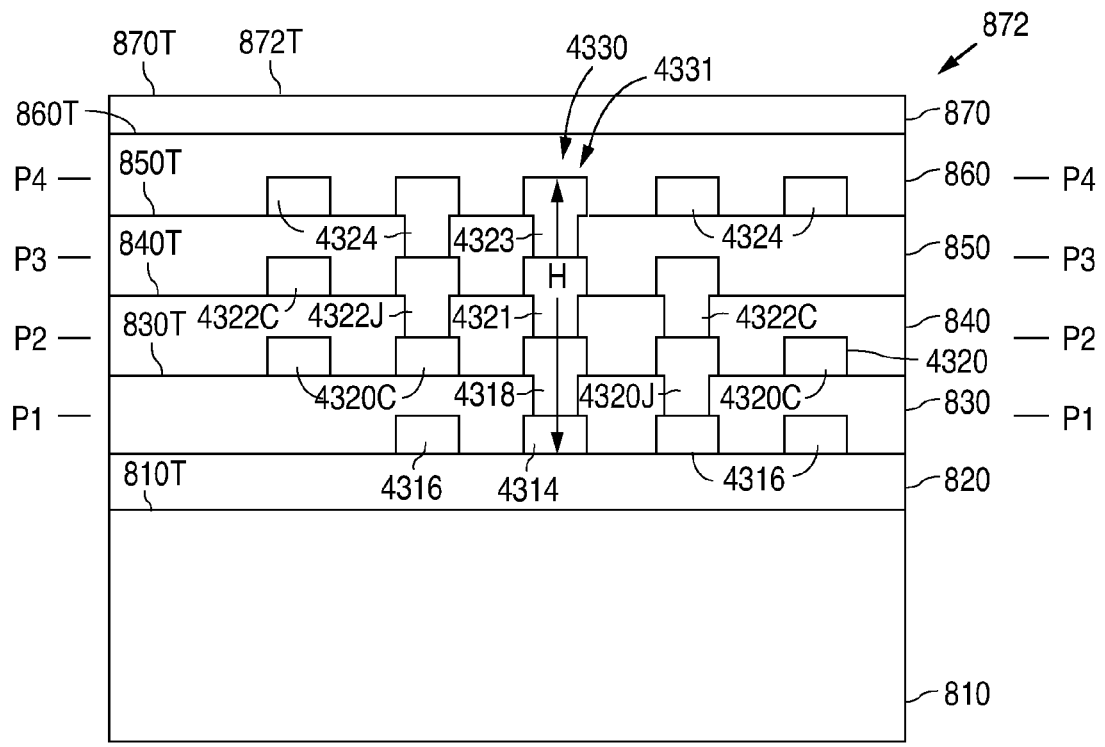
Figure 43F:
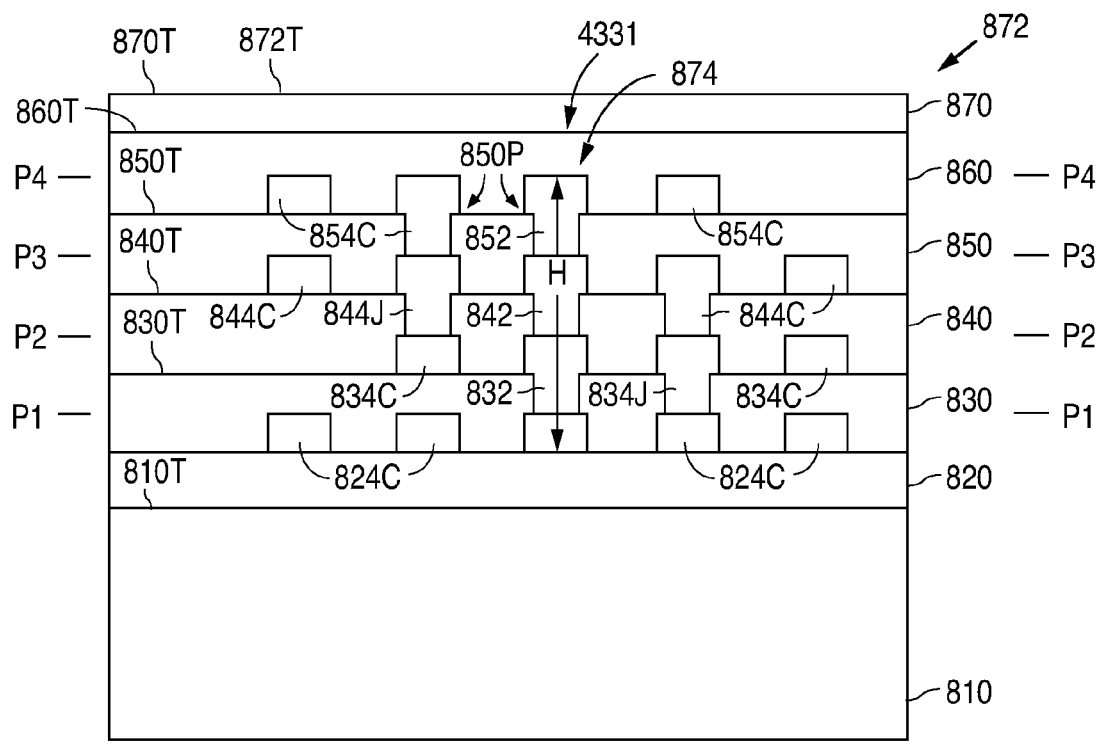

FIGS. 43A-43F show views that illustrate an example of a z-axis semiconductor fluxgate magnetometer 4300 in accordance with an alternate embodiment of the present invention. FIG. 43A shows a plan view of a fourth metal layer, FIG. 43B shows a plan view of a third metal layer, FIG. 43C shows a plan view of a second metal layer, and FIG. 43D shows a plan view of a first metal layer. FIG. 43E shows a cross-sectional view that shows a coil section of magnetometer 4300 taken along line 43E-43E of FIGS. 43A-43D, and a die section of magnetometer 4300. FIG. 43F shows a cross-sectional view that shows a coil section of magnetometer 4300 taken along line 43F-43F of FIGS. 43A-43D, and a die section of magnetometer 4300. Semiconductor fluxgate magnetometer 4300 is similar to semiconductor fluxgate magnetometer 800 and, as a result, utilizes the same reference numerals to designate the structures which are common to both magnetometers.

As shown in FIGS. 43A-43F, z-axis semiconductor fluxgate magnetometer 4300 differs from semiconductor fluxgate magnetometer 800 in that semiconductor fluxgate magnetometer 4300 includes a number of fluxgate magnetometers 4310 that are arranged in rows and columns, and a number of fluxgate magnetometers 4312 that are arranged in rows and columns so that the fluxgate magnetometers 4310 and 4312 alternate. (Only one row of fluxgate magnetometers 4310 and 4312 is shown in FIGS. 43A-43D for simplicity).

As further shown in FIGS. 43A-43F, a fluxgate magnetometer 4310 has a magnetic core structure 4314, and a metal-1 trace structure 4316 that touch the top surface of non-conductive structure 820. Metal-1 trace structure 4316 has a number of loops wound around and spaced apart from magnetic core structure 4314, a top surface that lies substantially in plane P1, and a segment that touches an adjacent fluxgate magnetometer 4312. Each fluxgate magnetometer 4312, in turn, is identical to fluxgate magnetometer 800.

As additionally shown in FIGS. 43A-43F, a fluxgate magnetometer 4310 also has a magnetic core structure 4318, and a number of metal-2 structures 4320 that touch the top surface of non-conductive structure 830. Magnetic core structure 4318 touches and lies over magnetic core structure 4314. The metal-2 structures 4320, in turn, include a vertical member 4320J that touches an end of metal-1 trace structure 4316, and a trace structure 4320C that has a number of loops wound around and spaced apart from magnetic core structure 4318. Metal-2 trace structure 4320 has a top surface that lies substantially in plane P2, and a segment that touches an adjacent fluxgate magnetometer 4312.

A fluxgate magnetometer 4310 further has a magnetic core structure 4321, and a number of metal-3 structures 4322 that touch the top surface of non-conductive structure 840. Magnetic core structure 4321 touches and lies over magnetic core structure 4318. The metal-3 structures 4322 include a vertical member 4322J that touches an end of trace structure 4320C, and a metal-3 trace structure 4322C that has a number of loops wound around and spaced apart from magnetic core structure 4321. Metal-3 trace structure 4322C has an end that touches vertical member 4320J, a top surface that lies substantially in the plane P3, and a segment that touches an adjacent fluxgate magnetometer 4312.

In addition, a fluxgate magnetometer 4310 has a magnetic core structure 4323, and a metal-4 trace structure 4324 that touch the top surface 850T of non-conductive structure 850. Magnetic core structure 4323 touches and lies over magnetic core structure 4321. Metal-4 trace structure 4324 has a number of loops wound around and spaced apart from magnetic core structure 4323, and an end that touches vertical member 4322J. Metal-4 trace structure 4324 has a top surface that lies substantially in plane P4, and a segment that touches an adjacent fluxgate magnetometer 4312.

As a result, as shown in FIGS. 43A-43F, z-axis semiconductor fluxgate magnetometer 4300 has non-conductive structure 872, which is formed from the non-conductive structures 820, 830, 840, 850, 860, and 870. In addition, the top surface 872T of non-conductive structure 872 is substantially planar.

Z-axis semiconductor fluxgate magnetometer 4300 also has a magnetic core pole structure 4330 formed from the magnetic core structures 4314, 4318, 4321, and 4323. Thus, z-axis semiconductor fluxgate magnetometer 4300 has a number of magnetic core pole structures 4331 formed from the magnetic core pole structures 874 and 4330. As shown, each magnetic core pole structure 4331 has a height H, which is the longest dimension, positioned to lie substantially perpendicular to the substantially planar top surface 872T of non-conductive structure 872.

In addition, z-axis semiconductor fluxgate magnetometer 4300 has a first wire structure 4332 formed from trace structure 824C, vertical member 8343, trace structure 844C, trace structure 4322C, vertical member 4320J, and trace structure 4316. In the present example, first wire structure 4332 is wound around four magnetic core pole structures 4331 to form a drive coil 4334.

Thus, first wire structure 4332 has a lower segment (e.g., trace structure 824C or trace structure 4316 wound around a magnetic core pole structure (e.g., magnetic core pole structure 874 or magnetic core pole structure 4331), an upper segment (e.g., trace structure 844C or trace structure 4322C) wound around the magnetic core pole structure, and a vertical segment (e.g., vertical member 8343 or 4320J) that connect the lower segment to the upper segment.

In addition, z-axis semiconductor fluxgate magnetometer 4300 has a second wire structure 4336 formed from trace structure 834C, vertical member 8443, trace structure 854C, trace structure 4324, vertical member 4322J, and trace structure 4320C. In the present example, second wire structure 4336 is wound around four magnetic core pole structures 4331 to form a sense coil 4340.

Thus, second wire structure 4336 has a lower segment (e.g., trace structure 834C or trace structure 4320C wound around a magnetic core pole structure (e.g., magnetic core pole structure 874 or magnetic core pole structure 4331), an upper segment (e.g., trace structure 854C or trace structure 4324) wound around the magnetic core pole structure, and a vertical segment (e.g., vertical member 8443 or 4322J) that connect the lower segment to the upper segment. As shown in FIGS. 43A-43F, plane P3 lies vertically between the plane P2 and plane P4, and plane P2 lies vertically between the plane P1 and plane P3.

In operation, the drive circuit of die 816 outputs an alternating current I1 to drive coil 4334, and a clock signal to the sense circuit of die 816 that is equal to second harmonic of the fundamental frequency of the alternating current that is output to drive coil 4334. The alternating current I1 in drive coil 4334 sets up an alternating magnetic induction field that induces an alternating current I2 and an alternating voltage in sense coil 4340.

The sense circuit of die 816 detects the alternating voltage in sense coil 4340, isolates the second harmonic of the alternating voltage in sense coil 4340, identifies a magnitude of the second harmonic, and generates an output voltage with a magnitude that is proportional to the magnitude of the external magnetic field.

Z-axis semiconductor fluxgate magnetometer 4300 is formed in the same manner that semiconductor fluxgate magnetometer 800 is formed, except that the method is modified to form and connect together the additional structures. For example, trace structure 4316 is formed at the same time that trace structure 824C is formed.

One of the advantages of z-axis semiconductor fluxgate magnetometer 4300 is that z-axis semiconductor fluxgate magnetometer 4300 provides substantially increased sensitivity due to the increased number of individual fluxgate magnetometers 4310 and 4312 that utilized. In an array form, the sensitivity of the individual fluxgate magnetometers 4310 and 4312 is added together.

Figure 44E:
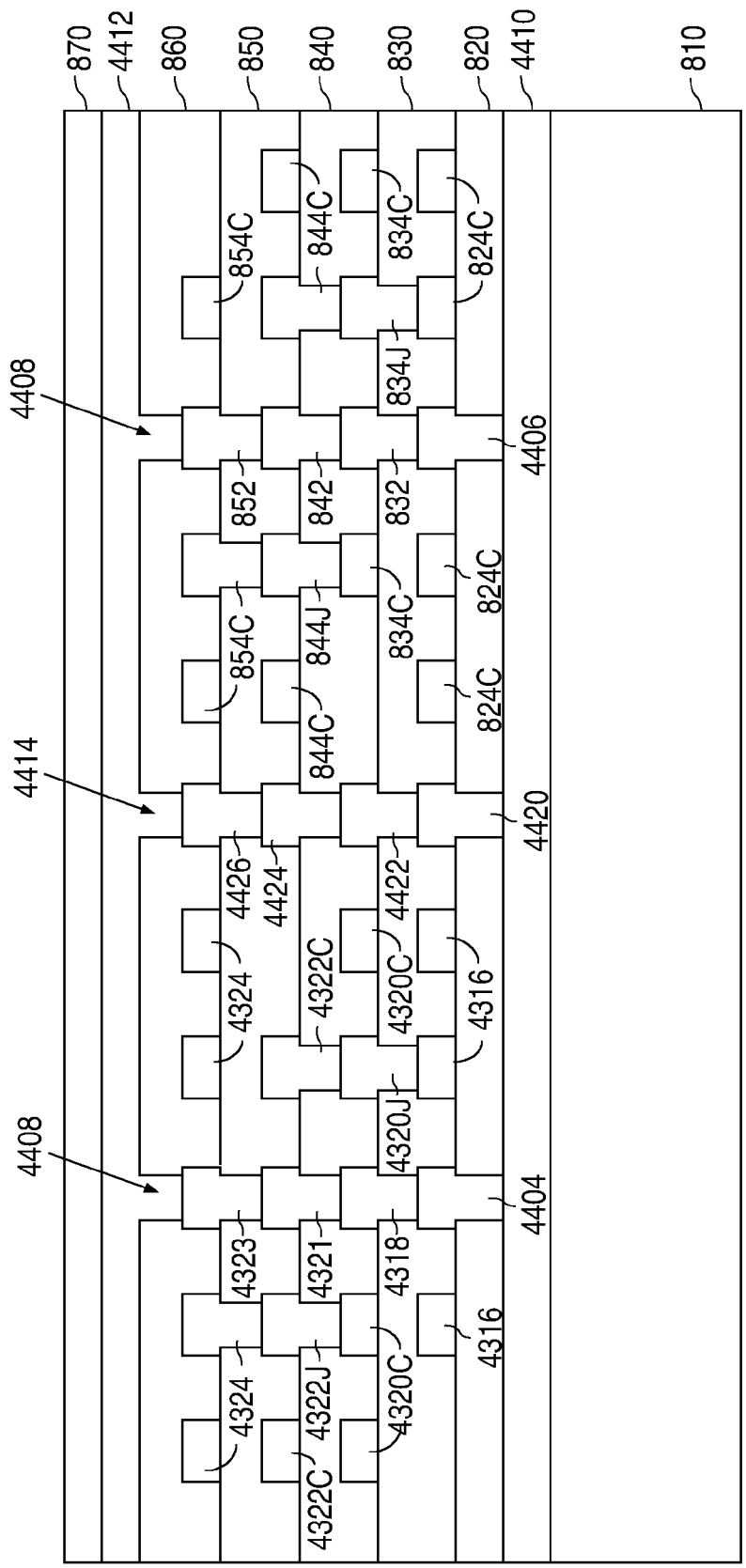

FIGS. 44A-44E show views that illustrate an example of a z-axis semiconductor fluxgate magnetometer 4400 in accordance with an alternate embodiment of the present invention. FIG. 44A shows a plan view of a fourth metal layer, FIG. 44B shows a plan view of a third metal layer, FIG. 44C shows a plan view of a second metal layer, and FIG. 44D shows a plan view of a first metal layer. FIG. 44E shows a cross-sectional view that shows a coil section of magnetometer 4400 taken along line 44E-44E of FIGS. 44A-44D, and a die section of magnetometer 4300. Semiconductor fluxgate magnetometer 4400 is similar to semiconductor fluxgate magnetometer 4300 and, as a result, utilizes the same reference numerals to designate the structures which are common to both magnetometers.

As shown in FIGS. 44A-44E, z-axis semiconductor fluxgate magnetometer 4400 differs from semiconductor fluxgate magnetometer 4300 in that semiconductor fluxgate magnetometer 4400 utilizes a magnetic core structure 4404 in lieu of magnetic core structure 4314, and a magnetic core structure 4406 in lieu of magnetic core structure 822. The magnetic core structures 4404 and 4406 differ from the magnetic core structures 4314 and 822 in that the magnetic core structures 4404 and 4406 extend through non-conductive structure 820.

As a result, fluxgate magnetometer 4400 has a number of magnetic core pole structures 4408 formed from the magnetic core structures 4404, 4318, 4321, and 4323, and the magnetic core structures 4406, 832, 842, and 852. In addition, the magnetic core structures 4404 and 4406 can be formed in the same manner as the magnetic core structures 832, 842, and 852.

Z-axis semiconductor fluxgate magnetometer 4400 also differs in that z-axis semiconductor fluxgate magnetometer 4400 includes a lower magnetic core structure 4410 that touches the magnetic core pole structures 4408 and lies below and spaced apart from the metal-1 trace structures 824C and 4316. In addition, lower magnetic core structure 4410 has a substantially planar top surface that touches non-conductive structure 820.

Z-axis semiconductor fluxgate magnetometer 4400 also differs from semiconductor fluxgate magnetometer 4300 in that semiconductor fluxgate magnetometer 4400 includes an upper magnetic core structure 4412 that touches the magnetic core pole structures 4408 and lies above and spaced apart from the metal-4 trace structures 854C and 4324. Further, upper magnetic core structure 4412 has a substantially planar top surface that touches non-conductive passivation structure 870.

In addition, z-axis semiconductor fluxgate magnetometer 4400 differs from semiconductor fluxgate magnetometer 4300 in that semiconductor fluxgate magnetometer 4400 includes a vertical magnetic core structure 4414 that lies horizontally between adjacent pairs of magnetic core pole structures 4331 and touches lower magnetic structure 4410 and upper magnetic core structure 4412.

Vertical magnetic core structure 4414 has a magnetic core structure 4420 that is formed at the same time as magnetic core structures 4404 and 4406, a magnetic core structure 4422 that is formed at the same time as magnetic core structures 832 and 4318, a magnetic core structure 4424 that is formed at the same time as magnetic core structures 842 and 4321, and a magnetic core structure 4426 that is formed at the same time as magnetic core structures 852 and 4323, Z-axis semiconductor fluxgate magnetometer 4400 operates in the same manner as semiconductor fluxgate magnetometer 4300, except that lower magnetic core structure 4410, upper magnetic core structure 4412, and vertical magnetic core structure 4414 allow the flux to pass completely through a magnetic core material, thereby further increasing the sensitivity.

Z-axis semiconductor fluxgate magnetometer 4400 is formed in the same manner as z-axis semiconductor fluxgate magnetometer 4300, except that lower magnetic core structure 4410 is formed on semiconductor structure 810 before non-conductive structure 820 is formed, and upper magnetic core structure 4412 is formed on non-conductive structure 860 before non-conductive passivation structure 870 is formed. In addition, lower magnetic core structure 4410 and upper magnetic core structure 4412 can be formed in the same manner as magnetic core structure 822 (e.g., electroplate, mask and etch; deposition, mask and etch, or mold and electroplate). Further, magnetic core structures 4420, 4422, 4424, and 4426 are formed as indicated.

Figure 45E:
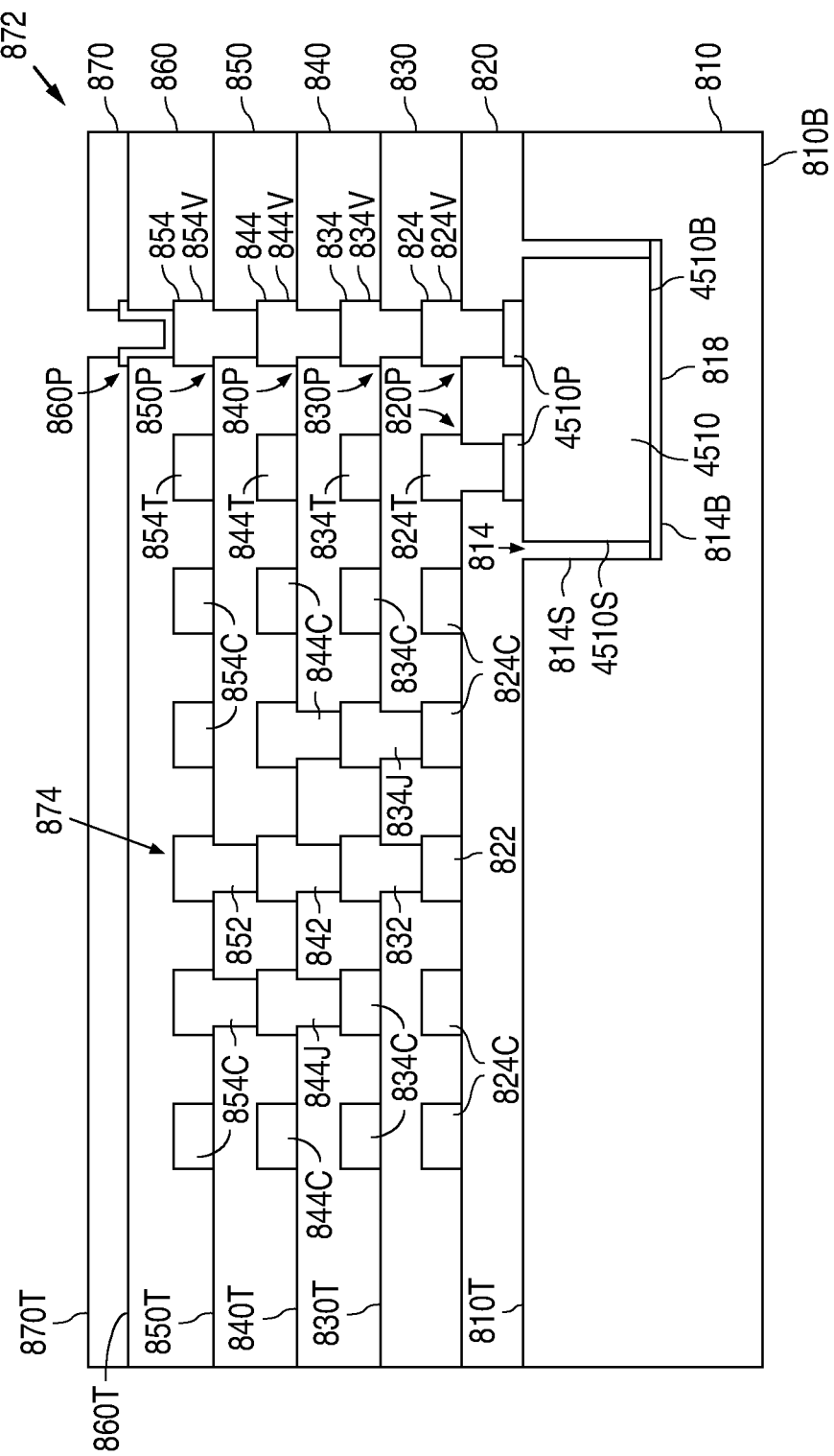

FIGS. 45A-45E show views that illustrate an example of a z-axis semiconductor fluxgate magnetometer 4500 in accordance with an alternate embodiment of the present invention. FIG. 45A shows a plan view of a fourth metal layer, FIG. 45B shows a plan view of a third metal layer, FIG. 45C shows a plan view of a second metal layer, and FIG. 45D shows a plan view of a first metal layer. FIG. 45E shows a cross-sectional view that shows a coil section of magnetometer 4500 taken along line 45E-45E of FIGS. 45A-45D, and a die section of magnetometer 4500. Semiconductor fluxgate magnetometer 4500 is similar to semiconductor fluxgate magnetometer 4300 and, as a result, utilizes the same reference numerals to designate the structures which are common to both magnetometers.

As shown in FIGS. 45A-45E, z-axis semiconductor fluxgate magnetometer 4500 differs from semiconductor fluxgate magnetometer 4300 in that semiconductor fluxgate magnetometer 4500 utilizes a die 4510 in lieu of die 816. Die 4510 has a side wall surface 4510S, a bottom surface 4510B that touches adhesive 818, and a number of conductive pads 4510P that provide external electrical connection points for die 4510. Die 4510 differs from die 816 in that die 4510 utilizes simplified drive and sense circuits to support a differential coil arrangement in lieu of the drive and sense circuits utilized in die 816.

As additionally shown in FIGS. 45A-45C, z-axis semiconductor fluxgate magnetometer 4500 also differs from z-axis semiconductor fluxgate magnetometer 4300 in that z-axis semiconductor fluxgate magnetometer 4500 utilizes a first wire structure 4512 in lieu of first wire structure 4332.

First wire structure 4512, which forms a drive coil 4514, is identical to first wire structure 4332 except that first wire structure 4512 has loops that are wound around magnetic core pole structures in a first direction (e.g., clockwise) and loops that are wound around magnetic core pole structures in a second direction (e.g., counter clockwise). Second wire structure 4336, in turn, has loops that are all wound around the magnetic core pole structures in the first direction (e.g., clockwise).

First wire structure 4512 has an identical number of loops in the first direction and the second direction, with a number of connecting segments 4512S which are laid out to minimize any contribution to the magnetic field. FIGS. 45A-45D illustrate a single example of the layout of first wire structure 4512.

First wire structure 4512 can alternately be laid out in other ways where the number of loops in the clockwise and counter clock wise direction are equal, and the effects of the connecting segments 4512S are minimized. For example, having an array of magnetic core pole structures, first wire structure 4512 can be laid out such that all the magnetic core pole structures in a first row, a first block, or a first pattern of magnetic core pole structures are wrapped in the first direction, and all the magnetic core pole structures in a second row, a second equivalent block, or a second equivalent pattern of magnetic core pole structures are wrapped in the second direction.

In operation, the drive circuit of die 4510 outputs an alternating current to drive coil 4514, which generates equal and opposing alternating magnetic induction fields. Thus, when no external magnetic field is present, no voltage is induced in sense coil 4340 because no alternating magnetic induction field is present.

When an external magnetic field is present, the presence of the external magnetic field induces an alternating voltage in sense coil 4340. The sense circuit in die 4510 detects the alternating voltage in sense coil 4340 and generates in response a sensed output voltage, which has an amplitude that is proportional to the magnitude of the external magnetic field.

The sense circuit in die 4510 does not detect or utilize the second harmonic of the fundamental frequency of the alternating current that is output to drive coil 4514. Z-axis semiconductor fluxgate magnetometer 4500 is formed in the same manner that z-axis semiconductor fluxgate magnetometer 4300 is formed.

It should be understood that the above descriptions are examples of the present invention, and that various alternatives of the invention described herein may be employed in practicing the invention. For example, the magnetic core structures 4404, 4406, 4408, 4410, 4412, and 4414 can also be used with magnetometer 4500. Thus, it is intended that the following claims define the scope of the invention and that structures and methods within the scope of these claims and their equivalents be covered thereby.

What is claimed is:

1. A z-axis semiconductor fluxgate magnetometer comprising:
    a Semiconductor structure, having a bottom surface, a top surface and a cavity extending from the semiconductor top surface down into the semiconductor structure, wherein the cavity has a side wall surface and a bottom surface that lies above and vertically spaced apart from the bottom surface of the semiconductor structure;
    a die, having a side wall surface, a bottom surface, a top surface, the top surface having a plurality of conductive pads that provide external connection points for the die;
    wherein the bottom of the die is adhesively attached to the bottom of the cavity;
    wherein the die is configured to include drive and sense circuits;
    a first non-conductive structure, that touches the die and the semiconductor structure and fills the remainder of the cavity, and includes a plurality of openings to exposes the conductive pads of the die, wherein the first non-conductive structure has top surface that is substantially planar;
    a magnetic core pole structure that touches the first non-conductive structure, wherein the magnetic core pole structure has a longest dimension that lies substantially perpendicular to the substantially planar top surface of the first non-conductive structure;
    a first trace structure that touches the first non-conductive structure, the first trace structure being conductive, having a top surface that lies substantially in a first plane, being spaced apart from the magnetic core pole structure, and having a loop wrapped around the magnetic core pole structure;
    a second non-conductive structure, that touches the first non-conductive structure and the first trace structure, and includes a plurality of openings to exposes the conductive pads of the die, wherein the second non-conductive structure has top surface that is substantially planar;
    a second trace structure that touches the second non-conductive structure, the second trace structure being conductive, having a top surface that lies substantially in a second plane, being spaced apart from the magnetic core pole structure, having a loop wrapped around the magnetic core structure, and being electrically isolated from the first trace structure, the second plane lying above the first plane;
        a third non-conductive structure, that touches the second non-conductive structure and the second trace structure, and includes a plurality of openings to exposes the conductive pads of the die, wherein the third non-conductive structure has top surface that is substantially planar;
    a third trace structure that touches the third non-conductive structure, the third trace structure being conductive, having a top surface that lies substantially in a third plane, being spaced apart from the magnetic core pole structure, and being electrically isolated from the second trace structure;
    a fourth non-conductive structure, that touches the third non-conductive structure and the third trace structure, and includes a plurality of openings to exposes the conductive pads of the die, wherein the fourth non-conductive structure has top surface that is substantially planar; and
    a fourth trace structure that touches the fourth non-conductive structure, the fourth trace structure being conductive, having a top surface that lies substantially in a fourth plane, being spaced apart from the magnetic core pole structure, and being electrically isolated from the third trace structure;
    a fifth non-conductive structure, that touches the fourth non-conductive structure and the fourth trace structure, and includes a plurality of openings to exposes the conductive pads of the die, wherein the fifth non-conductive structure has top surface that is substantially planar;
    a plurality bond pad structures that touch the fifth non-conductive structure and extend through the fifth non-conductive structure to electrically couple to the die;
    a non-conductive passivation structure that touches the fifth non-conductive structure and the bond pad structures, wherein the non-conductive passivation structure has a substantially planar surface.

2. The z-axis semiconductor fluxgate magnetometer of claim 1 wherein the second trace structure has a half loop or more wrapped around the magnetic core structure.

3. The z-axis semiconductor fluxgate magnetometer of claim 1 and further comprising a first vertical member that touches the first non-conductive structure, the vertical member touching an end of the first trace structure and an end of the third trace structure to electrically couple the first trace structure to the third trace structure.

4. The z-axis semiconductor fluxgate magnetometer of claim 1 wherein the first, second, third and fourth trace structures are composed of copper.

5. The z-axis semiconductor fluxgate magnetometer of claim 1 wherein the magnetic core pole structure is composed of a high permeability and low resistance material such as an alloy of nickel and iron such as permalloy.

6. The z-axis semiconductor fluxgate magnetometer of claim 1 wherein the fourth trace structure has a half loop or more wrapped around the magnetic core structure.

7. The z-axis semiconductor fluxgate magnetometer of claim 1 and further comprising:
    a second vertical member that touches the third non-conductive structure, the second vertical member touching an end of the second trace structure and an end of the fourth trace structure to electrically couple the second trace structure to the fourth trace structure.

8. The z-axis semiconductor fluxgate magnetometer of claim 1, wherein the first, second, third, fourth and fifth non-conductive structures are composed of a photoimageable epoxy or polymer such as SU-8 benzocyclobutene (BCB), or Polybenzoxazole.

9. The z-axis semiconductor fluxgate magnetometer of claim 1 wherein an end of the first trace structure, an end of the third trace structure, an end of the second trace structure, and an end of the fourth trace structure are electrically coupled to the die.

* * * * *